United States Patent
Chen et al.

(10) Patent No.: US 12,249,621 B2
(45) Date of Patent: Mar. 11, 2025

(54) SEMICONDUCTOR STRUCTURE WITH DIELECTRIC FIN FEATURE

(71) Applicant: Taiwan Semiconductor Manufacturing Company, Ltd., Hsinchu (TW)

(72) Inventors: Guan-Lin Chen, Baoshan Township, Hsinchu County (TW); Jung-Chien Cheng, Tainan (TW); Kuo-Cheng Chiang, Zhubei (TW); Shi-Ning Ju, Hsinchu (TW); Chih-Hao Wang, Baoshan Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 474 days.

(21) Appl. No.: 17/678,875

(22) Filed: Feb. 23, 2022

(65) Prior Publication Data

US 2023/0141523 A1     May 11, 2023

Related U.S. Application Data

(60) Provisional application No. 63/276,819, filed on Nov. 8, 2021.

(51) Int. Cl.
*H01L 29/06* (2006.01)
*H01L 21/8234* (2006.01)
(Continued)

(52) U.S. Cl.
CPC .. *H01L 29/0665* (2013.01); *H01L 21/823412* (2013.01); *H01L 21/823481* (2013.01);
(Continued)

(58) Field of Classification Search
CPC ......... H01L 29/0665; H01L 21/823412; H01L 21/823481; H01L 29/0649; H01L 29/42392; H01L 29/78696
See application file for complete search history.

(56) References Cited

U.S. PATENT DOCUMENTS 9,209,247 B2   12/2015   Colinge et al.
9,236,267 B2   1/2016   De et al.
(Continued)

FOREIGN PATENT DOCUMENTS

TW    202119626 A    5/2021

*Primary Examiner* — Syed I Gheyas
(74) *Attorney, Agent, or Firm* — Birch, Stewart, Kolasch & Birch, LLP

(57) ABSTRACT

Semiconductor structures and methods for manufacturing the same are provided. The semiconductor structure includes a substrate and first channel structures and second channel structures formed over the substrate. The semiconductor structure also includes a dielectric fin structure formed between the first channel structures and the second channel structures. In addition, the dielectric fin structure includes a core portion and first connecting portions connected to the core portion. The semiconductor structure also includes a gate structure including a first portion. In addition, the first portion of the gate structure is formed around the first channel structures and covers the first connecting portions of the dielectric fin structure.

20 Claims, 65 Drawing Sheets

(51) Int. Cl.
*H01L 29/423* (2006.01)
*H01L 29/786* (2006.01)

(52) U.S. Cl.
CPC .... *H01L 29/0649* (2013.01); *H01L 29/42392* (2013.01); *H01L 29/78696* (2013.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2020/0343377 A1* | 10/2020 | Chiang ........... H01L 21/823814 |
| 2021/0343600 A1* | 11/2021 | Chen ................. H01L 29/78696 |

* cited by examiner

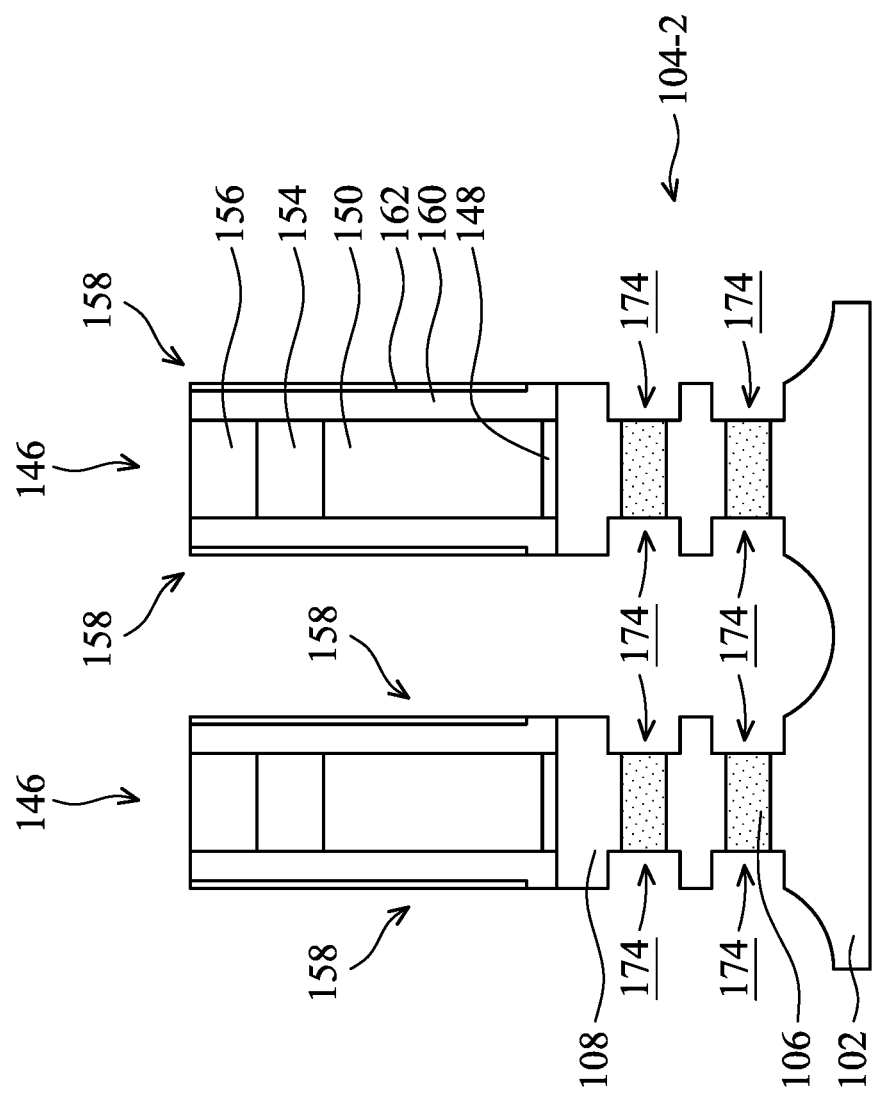

SEMICONDUCTOR STRUCTURE WITH DIELECTRIC FIN FEATURE

PRIORITY CLAIM AND CROSS-REFERENCE

This Application claims the benefit of U.S. Provisional Application No. 63/276,819, filed on Nov. 8, 2021, the entirety of which is incorporated by reference herein.

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIG. 2J-3 illustrates a diagrammatic perspective view of the intermediate stage of manufacturing the semiconductor structure at the stage of forming the semiconductor structure shown in FIG. 2J in accordance with some embodiments.

FIGS. 2W-1 and 2W-2 illustrate two other cross-sectional views of the intermediate stages of manufacturing the semiconductor structure at the stage of forming the semiconductor structure shown in FIG. 2W in accordance with some embodiments.

FIG. 2W-3 illustrates a diagrammatic perspective view of the semiconductor structure in accordance with some embodiments.

FIG. 2W-4 illustrates a top view of the semiconductor structure in accordance with some embodiments.

FIG. 2W-5 illustrates an enlarged cross-sectional view of the semiconductor structure of block BK shown in FIG. 2W in accordance with some embodiments.

DETAILED DESCRIPTION

Figure 1A:
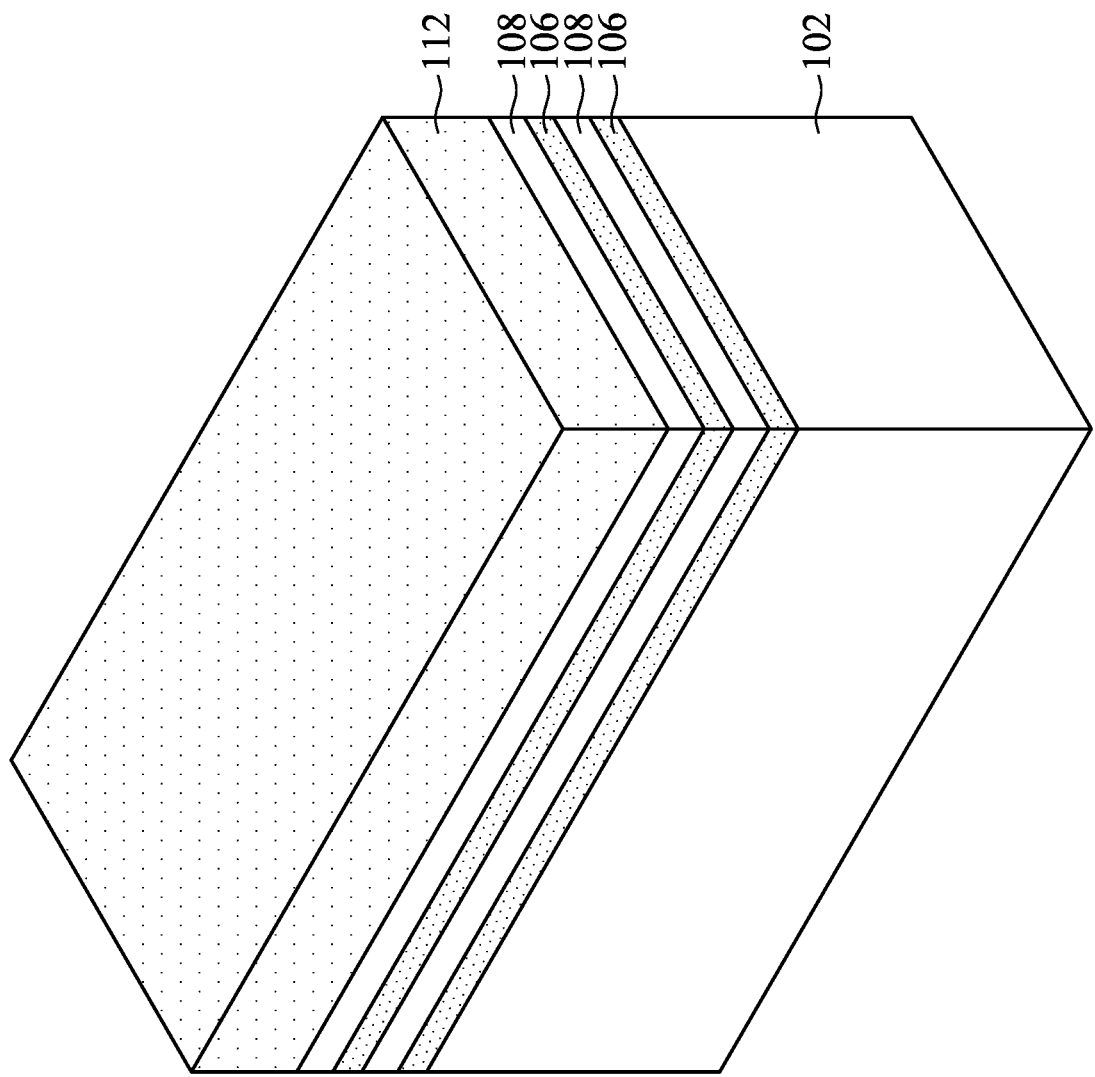
FIGS. 1A to 1C illustrate diagrammatic perspective views of intermediate stages of manufacturing a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The nanostructure transistors (e.g. nanosheet transistors, nanowire transistors, multi-bridge channel transistors, nanoribbon FET, and gate all around (GAA) transistors) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructures.

Embodiments of semiconductor structures and methods for forming the same are provided. The semiconductor structures may include channel structures, such as nanostructures, formed over a substrate and a gate structure formed around the channel structures. A dielectric fin structure may be interposed in the gate structure to separate the gate structure into two portions. In addition, the dielectric fin structure may include a core portion and connecting portions, and the connecting portions may be connected to both the core portion and the channel structures. The space between the core portion and the channel structures may be relatively small, and the size of the resulting device may be reduced.

Figure 1B:
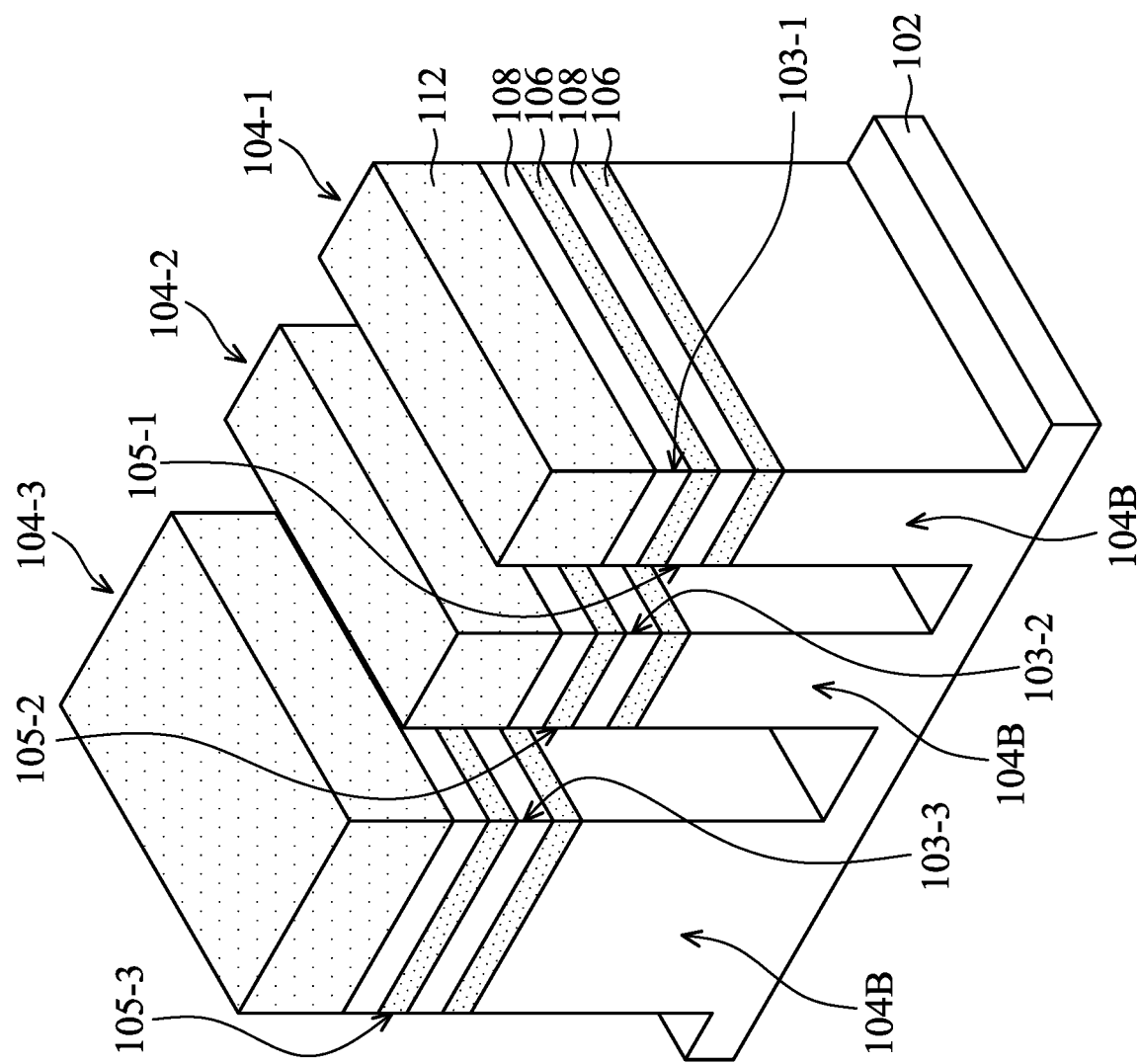
Figure 1C:
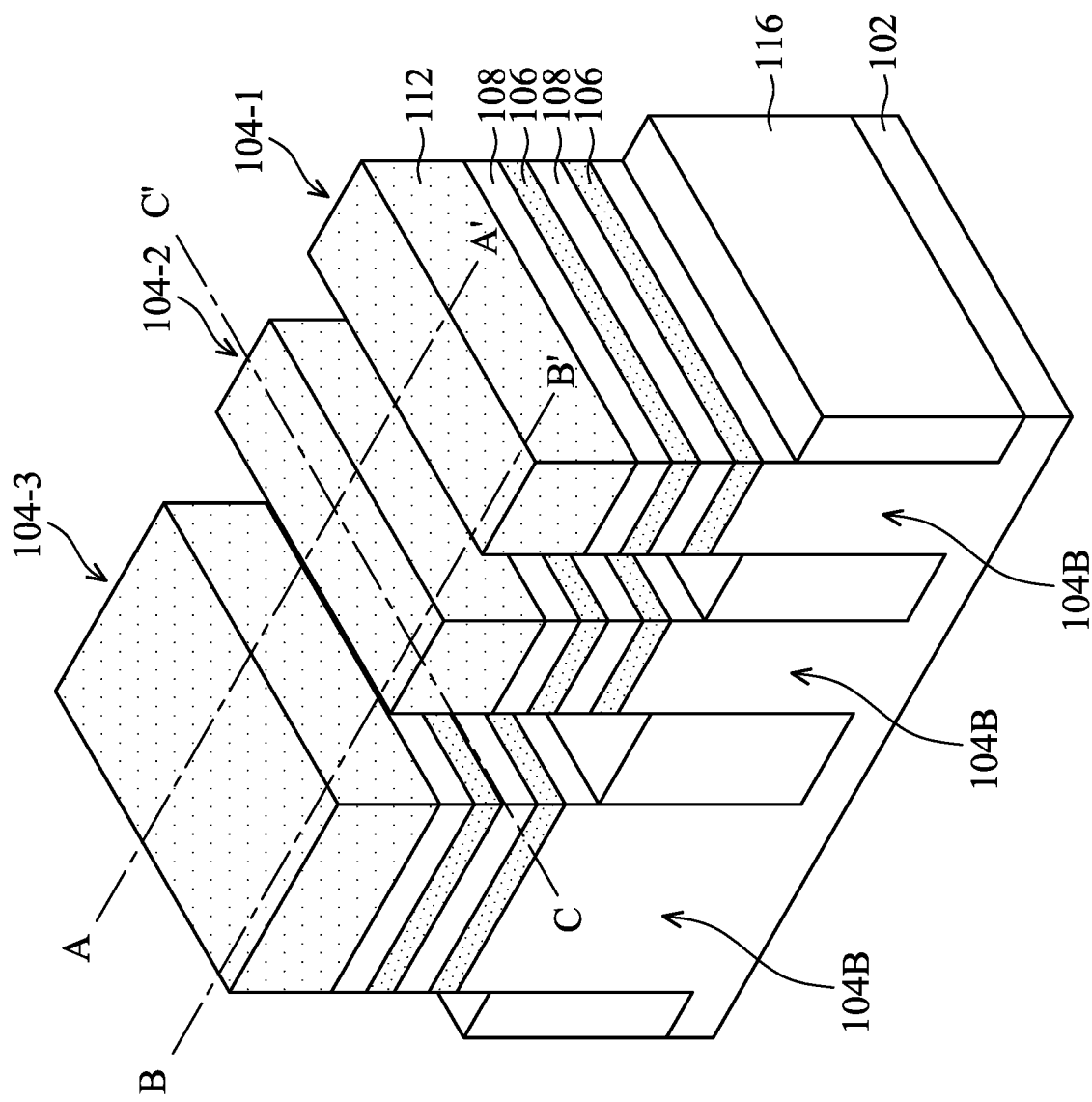
Figure 2A:
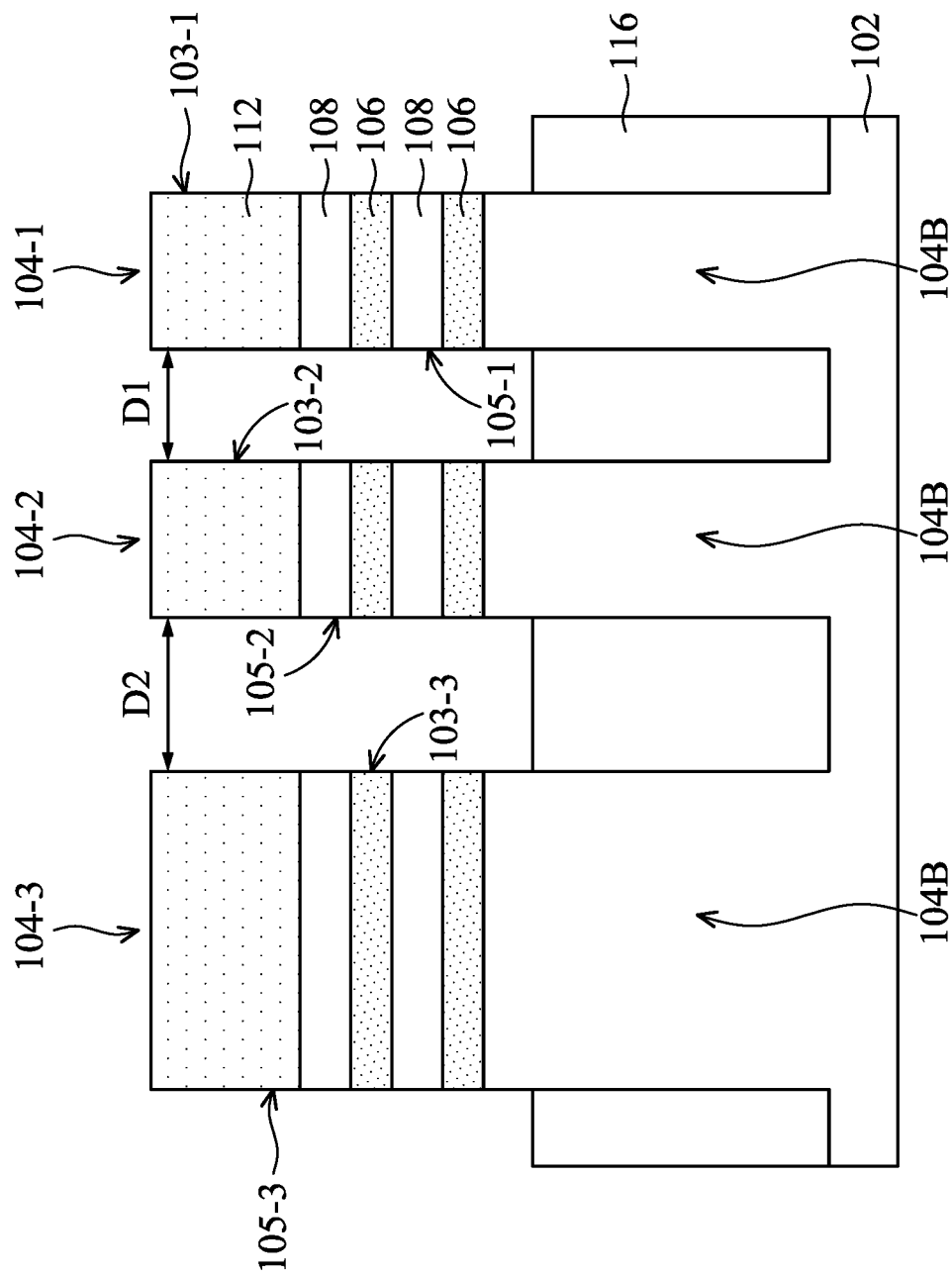
FIGS. 2A to 2W illustrate cross-sectional views of intermediate stages of manufacturing the semiconductor structure shown along line A-A' of FIG. 1C after the processes shown in FIGS. 1A to 1C are performed in accordance with some embodiments.

FIGS. 1A to 1C illustrate diagrammatic perspective views of intermediate stages of manufacturing a semiconductor structure 100 in accordance with some embodiments. FIGS. 2A to 2W illustrate cross-sectional views of intermediate stages of manufacturing the semiconductor structure 100 shown along line A-A' of FIG. 1C after the processes shown in FIGS. 1A to 1C are performed in accordance with some embodiments.

The semiconductor structure 100 may include multi-gate devices and may be included in a microprocessor, a memory, or other IC devices. For example, the semiconductor structure 100 may be a portion of an IC chip that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other applicable components, or combinations thereof.

First, a semiconductor stack including first semiconductor material layers 106 and second semiconductor material layers 108 are formed over a substrate 102, as shown in FIG. 1A in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked over the substrate 102, and a semiconductor cap layer 112 is formed over the topmost second semiconductor material layers 108. In some embodiment, the first semiconductor material layers 106 and the second semiconductor material layers 108 are made of different semiconductor materials. In some embodiment, the first semiconductor material layers 106 and the semiconductor cap layer 112 are made of the same semiconductor material. In some embodiments, the first semiconductor material layers 106 and the semiconductor cap layer 112 are made of SiGe, and the second semiconductor material layers 108 are made of silicon. It should be noted that although two first semiconductor material layers 106 and two second semiconductor material layers 108 are shown in FIG. 1A, the semiconductor stack may include more first semiconductor material layers 106 and second semiconductor material layers 108 alternately stacked. For example, the semiconductor stack may include two to five of the first semiconductor material layers 106 and two to five of the second semiconductor material layers 108. In some embodiments, the semiconductor cap layer 112 is thicker than both the first semiconductor material layers 106 and the second semiconductor material layers 108.

The first semiconductor material layers 106, the second semiconductor material layers 108, and the semiconductor cap layer 112 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

After the first semiconductor material layers 106, the second semiconductor material layers 108, and the semiconductor cap layer 112 are formed as the semiconductor stack over the substrate 102, the semiconductor stack is patterned to form fin structures 104-1, 104-2, and 104-3, as shown in FIG. 1B in accordance with some embodiments. In some embodiments, the fin structures 104-1, 104-2, and 104-3 include base fin structures 104B and the semiconductor stacks, including the first semiconductor material layers 106, the second semiconductor material layers 108, and the semiconductor cap layer 112, formed over the base fin structures 104B. In some embodiments, the fin structure 104-3 is wider than the fin structures 104-1 and 104-2. The fin structures 104-1, 104-2, and 104-3 may include first sidewalls 103-1, 103-2, and 103-3 and second sidewalls 105-1, 105-2, and 105-3 respectively. The second sidewall 105-1 of the fin structure 104-1 and the first sidewall 103-2 of the fin structure 104-2 are facing each other, and the second sidewall 105-2 of the fin structure 104-2 and the first sidewall 103-3 of the fin structure 104-3 are facing each other in accordance with some embodiments.

In some embodiments, the distance D1 between the fin structures 104-1 and 104-2 (e.g. the distance between the second sidewall 105-1 of the fin structure 104-1 and the first sidewall 103-2 of the fin structure 104-2) is greater than about 15 nm. The distance D1 should be wide enough to form the isolation structure therebetween in subsequent processes. In some embodiments, the distance D2 between the fin structures 104-2 and 104-3 (e.g. the distance between the second sidewall 105-2 of the fin structure 104-2 and the first sidewall 103-3 of the fin structure 104-3) is greater than about 25 nm. The distance D2 should be wide enough so there would be enough space to form the material layers of the gate structure (e.g. work function metal layers) afterwards. In some embodiments, the distance D1 between the fin structures 104-1 and 104-2 is smaller than the distance D2 between the fin structures 104-2 and 104-3. In some embodiments, the difference between the distance D1 and the distance D2 is greater than 10 nm, so that the material layers formed in the spaces may be patterned due to the loading effect between the spaces and the gate structure formed around these regions may have different structures (will be described in more details afterwards.)

The patterning process may include forming mask structures over the semiconductor material stack, and etching the semiconductor material stack and the underlying substrate 102 through the mask structure. In some embodiments, the mask structures are a multilayer structure including a pad oxide layer and a nitride layer formed over the pad oxide layer. The pad oxide layer may be made of silicon oxide, which may be formed by thermal oxidation or CVD, and the nitride layer may be made of silicon nitride, which may be formed by CVD, such as LPCVD or plasma-enhanced CVD (PECVD).

After the fin structures 104-1, 104-2, and 104-3 are formed, an isolation structure 116 is formed around the fin structures 104-1, 104-2, and 104-3, as shown in FIGS. 1C and 2A in accordance with some embodiments. The isolation structure 116 is configured to electrically isolate active regions (e.g. the fin structures 104-1, 104-2, and 104-3) of the semiconductor structure and is also referred to as shallow trench isolation (STI) feature in accordance with some embodiments.

More specifically, an insulating layer may be formed around and covering the fin structures 104-1, 104-2, and 104-3, and the insulating layer may be recessed to form the isolation structure 116 with the fin structures 104-1, 104-2, and 104-3 protruding from the isolation structure 116. In some embodiments, the insulating layer is made of silicon oxide, silicon nitride, silicon oxynitride (SiON), another suitable insulating material, or a combination thereof. In addition, liner layers (not shown) may be formed before forming the insulating layer, and the liner layers may also be recessed with the insulating layer to form the isolation structure 116. In some embodiments, the liner layers include multiple dielectric material layers.

After the isolation structure 116 is formed, dielectric fin structures may be formed adjacent to the fin structures 104-1, 104-2, and 104-3. The dielectric fin structures may include a first dielectric fin structure and second dielectric fin structures.

Figure 2B:
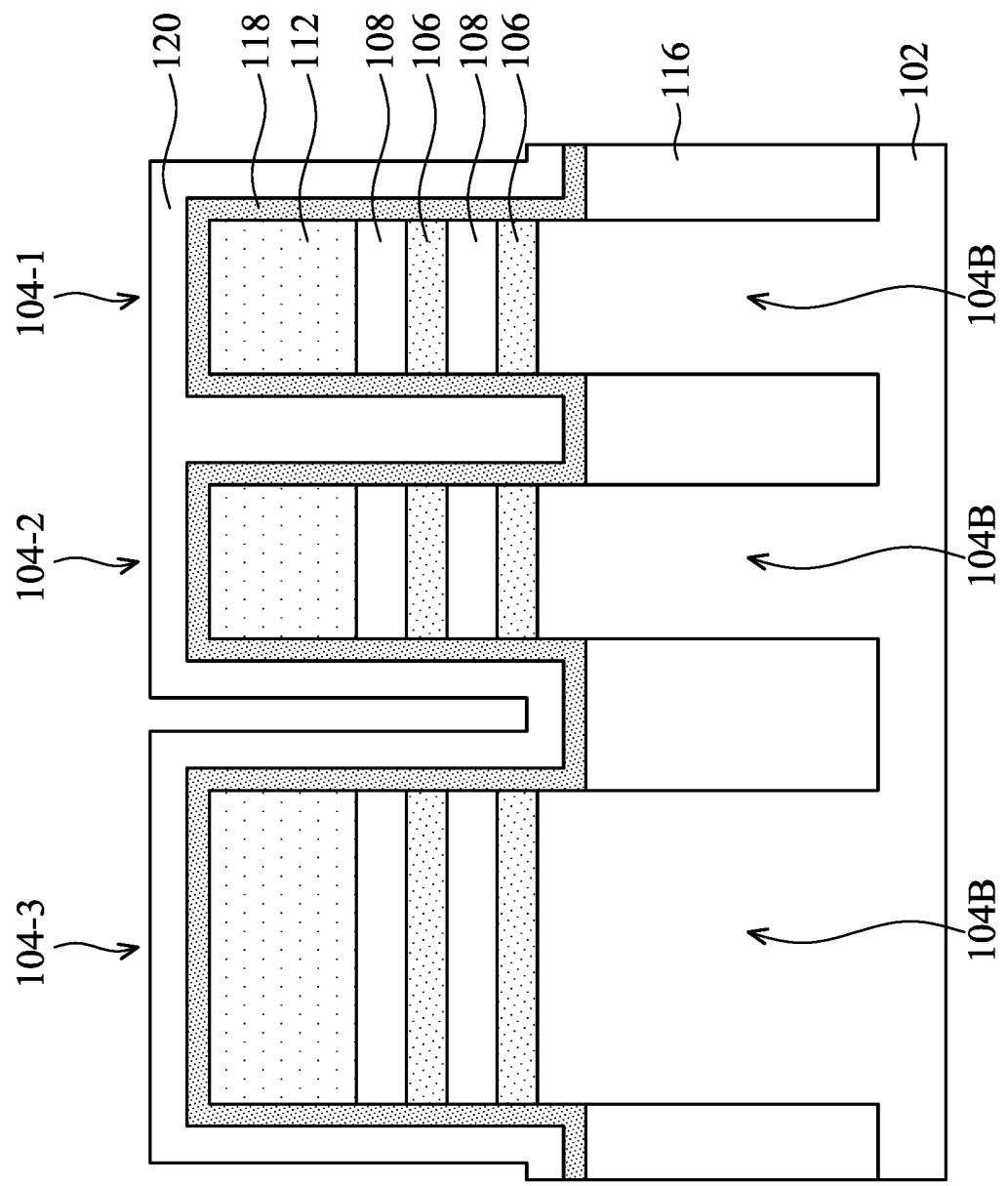
FIGS. 2J-1 to 2O-1 and FIGS. 2J-2 to 2O-2 illustrate two other cross-sectional views of the intermediate stages of manufacturing the semiconductor structure at the stage of forming the semiconductor structure shown in FIGS. 2J to 2O in accordance with some embodiments.

More specifically, a first dielectric shell layer 118 is conformally formed to cover the fin structures 104-1, 104-2, and 104-3 and the isolation structure 116, and a first core portion 120 is formed over the first dielectric shell layer 118, as shown in FIG. 2B in accordance with some embodiments. The first dielectric shell layer 118 is configured to form an extending portion of the dielectric fin structure with the gate structure formed thereon. The connecting portions may help to improve the control of the gate structure and also to reduce the size of the gate structure. In some embodiments, the first dielectric shell layer 118 covers the sidewalls and the top surfaces of the fin structures 104-1, 104-2, and 104-3 and the top surface of the isolation structure 116.

In some embodiments, the first dielectric shell layer 118 is made of a low k dielectric materials such as SiN, SiOC, SiOCN, SiCN, or the like. In some embodiments, the first dielectric shell layer 118 has a thickness in a range from about 2 nm to about 5 nm. Since the first dielectric shell layer 118 may be made of a low k dielectric material, it should not be too thick or the gate control of the resulting device may be undermined. On the other hand, the first dielectric shell layer 118 should still be thick enough or it may be completely removed during the trimming process performed afterwards.

In some embodiments, the first core portion 120 is made of a low k dielectric material different from that the first dielectric shell layer 118 is made of. In some embodiments, the first core portion 120 is made of $SiO_2$. In some embodiments, the first core portion 120 and the isolation structure 116 are made of the same material. In some embodiments, the space between the fin structures 104-1 and 104-2 is completely filled with the first dielectric shell layer 118 and the first core portion 120, while the space between the fin structures 104-2 and 104-3 is not completely filled with the first dielectric shell layer 118 and the first core portion 120. The first dielectric shell layer 118 and the first core portion 120 may be deposited using CVD, PVD, ALD, HDPCVD, MOCVD, RPCVD, PECVD, LPCVD, ALCVD, APCVD, other applicable methods, or combinations thereof.

Figure 2C:
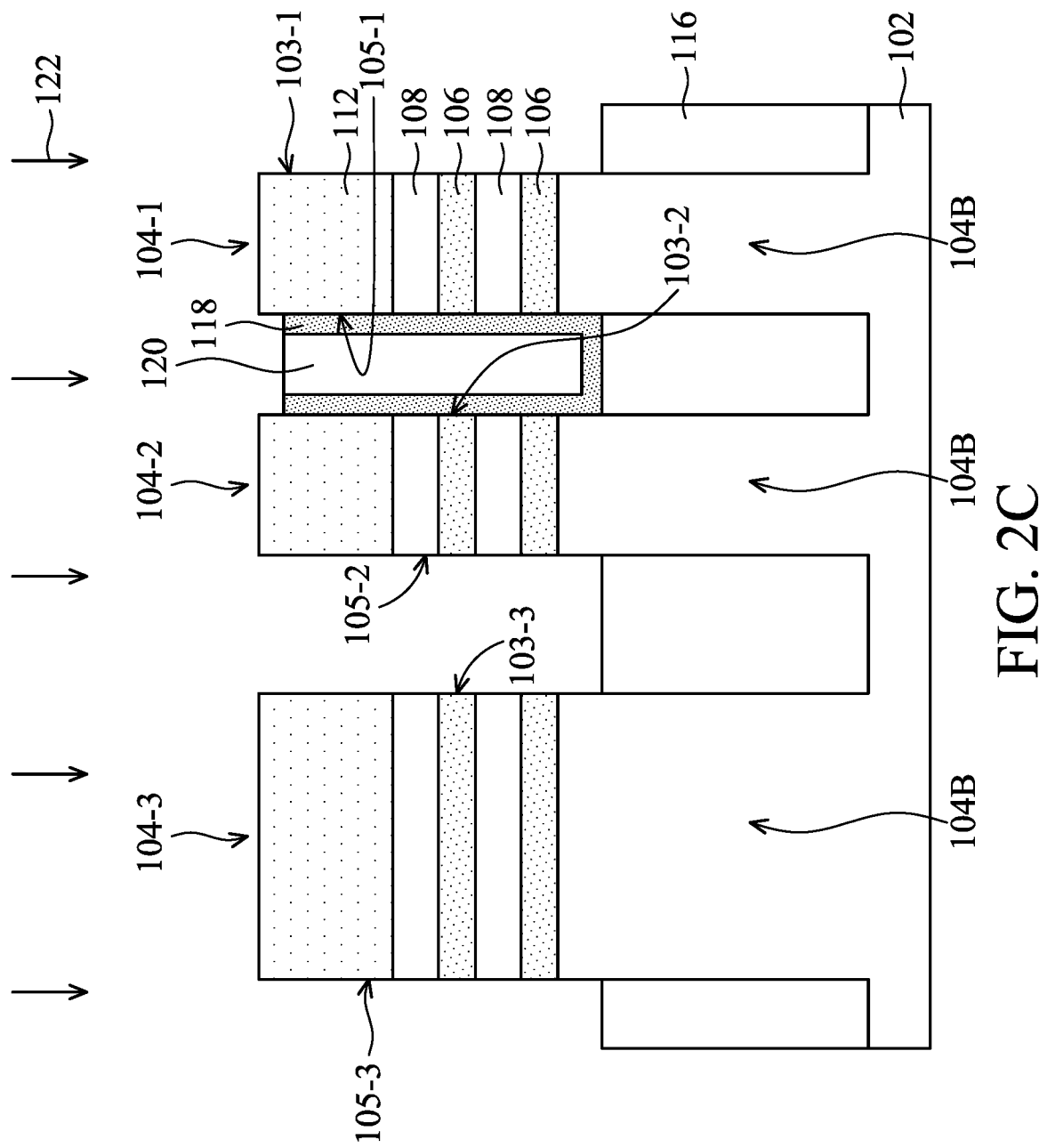

Next, an etching process 122 is performed, as shown in FIG. 2C in accordance with some embodiments. In some embodiments, the etching process 122 is performed without using a mask structure. During the etching process 122, the first core portion 120 and the first dielectric shell layer 118 formed between the wider space (e.g. the space between the fin structures 104-2 and 104-3) are etched faster while the first core portion 120 and the first dielectric shell layer 118 formed between the narrower space (e.g. the space between the fin structures 104-1 and 104-2) are etched slower in accordance with some embodiments. After the etching process 122 is performed, the first core portion 120 and the first dielectric shell layer 118 formed between the wider space (e.g. the space between the fin structures 104-2 and 104-3) are completely removed, while the first core portion 120 and the first dielectric shell layer 118 formed between the narrower space (e.g. the space between the fin structures 104-1 and 104-2) are only partially removed in accordance with some embodiments. The remaining first core portion 120 and the first dielectric shell layer 118 then form the bottom portion of the first dielectric fin structure in accordance with some embodiments. In addition, the first core portion 120 and the first dielectric shell layer 118 in the narrower regions are also etched during the etching process 122, and the top surface of the remaining first core portion 120 and the remaining first dielectric shell layer 118 are lower than the top surfaces of the fin structures 104-1, 104-2, and 104-3 after the etching process 122 is performed.

Figure 2D:
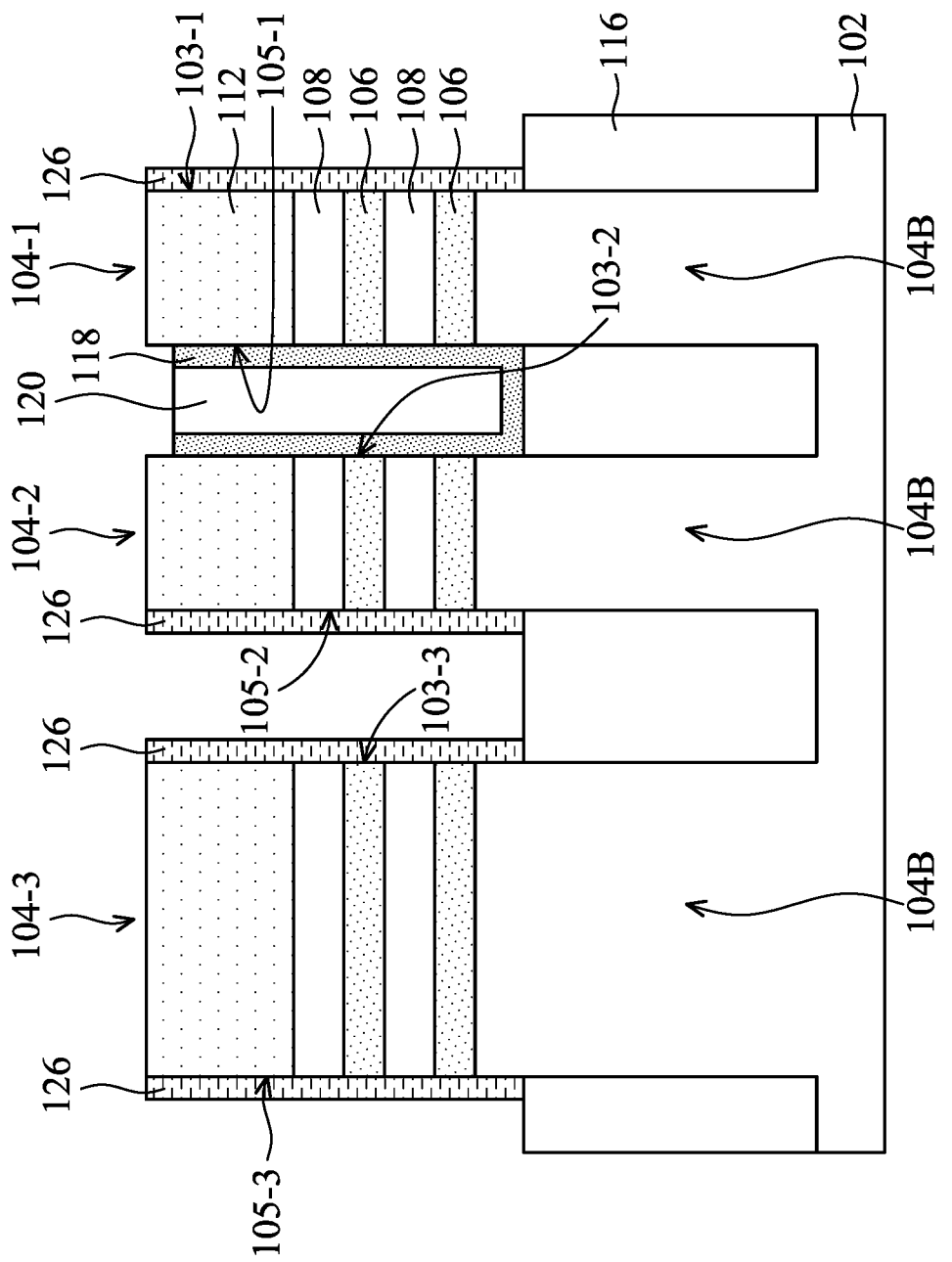

Afterwards, cladding layers 126 are formed on the sidewalls of the fin structures 104-1, 104-2, and 104-3, as shown in FIG. 2D in accordance with some embodiments. The cladding layers 126 are formed over the sidewalls of the fin structures 104-1, 104-2, and 104-3 not covered by the remaining first dielectric shell layer 118 in accordance with some embodiments. More specifically, the first sidewall of the fin structure 104-1, the second sidewall 105-2 of the fin structure 104-2, and the first sidewall 103-3 and the second sidewall 105-3 of the fin structure 104-3 are covered by the cladding layers 126 in accordance with some embodiments.

The thicknesses of the cladding layers may determine the size of the dielectric fin structure formed afterwards. In some embodiments, the cladding layers 126 have the thickness in a range from about 4 nm to about 10 nm. If the cladding layers 126 are not thick enough, there may not have enough spaces for removing the first semiconductor material layers 106 and for forming the gate structure in subsequent manufacturing processes. On the other hand, if the cladding layers 126 are too thick, the capacitance of the resulting device may be increased and the device size may also need to be increased.

In some embodiments, the cladding layers 126 are made of semiconductor materials. In some embodiments, the cladding layers 126 and the first semiconductor material layers 106 are made of the same material. In some embodiments, the cladding layers 126 are made of silicon germanium (SiGe). In some embodiments, the Ge concentration in the cladding layers 126 are in a range from about 15% to about 35%. The Ge concentration in the cladding layers 126 may determine the etching rate of the cladding layers 126 in the etching process performed afterwards. For example, when the Ge concentration is relatively high, the cladding layers 126 may have a relatively high etching rate. In addition, the Ge concentration may be adjusted according to the thicknesses of the cladding layers 126 to achieve the designed etching rate in subsequent etching process.

The cladding layer 126 may be formed by performing an epitaxy process, such as VPE and/or UHV CVD, molecular beam epitaxy, other applicable epitaxial growth processes, or combinations thereof. In some embodiments, the cladding layers 126 are also formed on the top surface of the fin structures 104-1, 104-2, and 104-3 but are partially removed by performing an etching process, such as a plasma dry etching process.

Figure 2E:
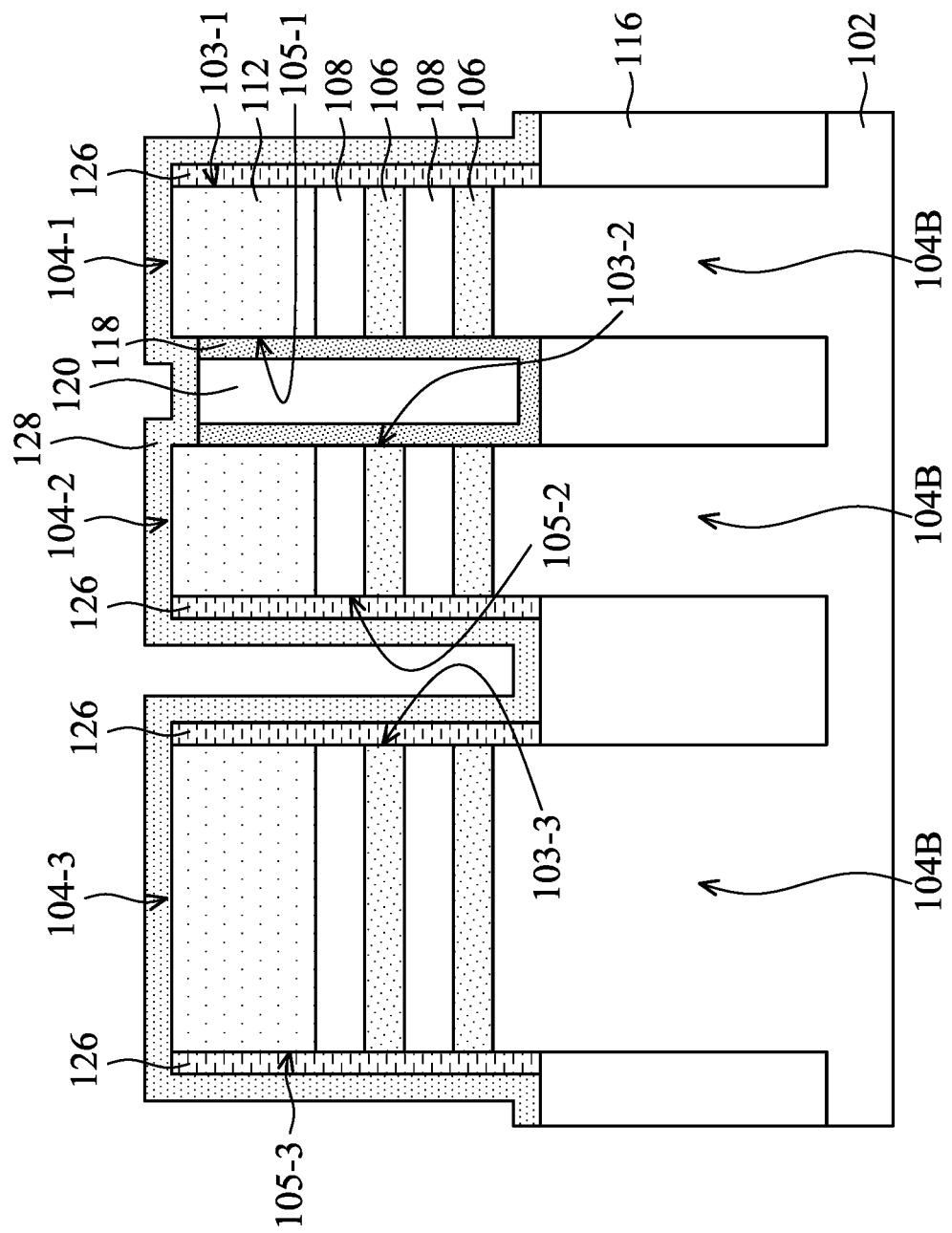

After the cladding layers 126 are formed, the second dielectric fin structures may be formed between the cladding layers 126. More specifically, a second dielectric shell layer 128 is formed to cover the cladding layers 126, the fin structures 104-1, 104-2, and 104-3, the first dielectric shell layer 118, and the first core portion 120, as shown in FIG. 2E in accordance with some embodiments. The second dielectric shell layer 128 may be used to protect the cladding layers 126 is subsequent process. Therefore, the second dielectric shell layer 128 should not be too thin. In some embodiments, the second dielectric shell layer 128 has a thickness in a range from about 3 nm to about 6 nm. On the other hand, the second dielectric shell layer 128 should not be too thick or the distance between the neighboring fin structures (e.g. the fin pitch) may need to be increased and the device size may also need to be increased.

In some embodiments, the second dielectric shell layer 128 is thicker than the first dielectric shell layer 118. In some other embodiments, the second dielectric shell layer 128 is thinner than, or has substantially the same width with, the first dielectric shell layer 118. In some embodiments, the first dielectric shell layer 118 and the second dielectric shell layer 128 are made of different low k dielectric materials, so that they can have etching selectivity in subsequent etching processes. In some embodiments, the second dielectric shell layer 128 is made of SiN, SiOC, SiOCN, SiCN, or the like. In some embodiments, the first dielectric shell layer 118 is made of SiN and the second dielectric shell layer 128 is made of SiOCN. The second dielectric shell layer 128 may be deposited using CVD, PVD, ALD, HDPCVD, MOCVD, RPCVD, PECVD, LPCVD, ALCVD, APCVD, other applicable methods, or combinations thereof.

Figure 2F:
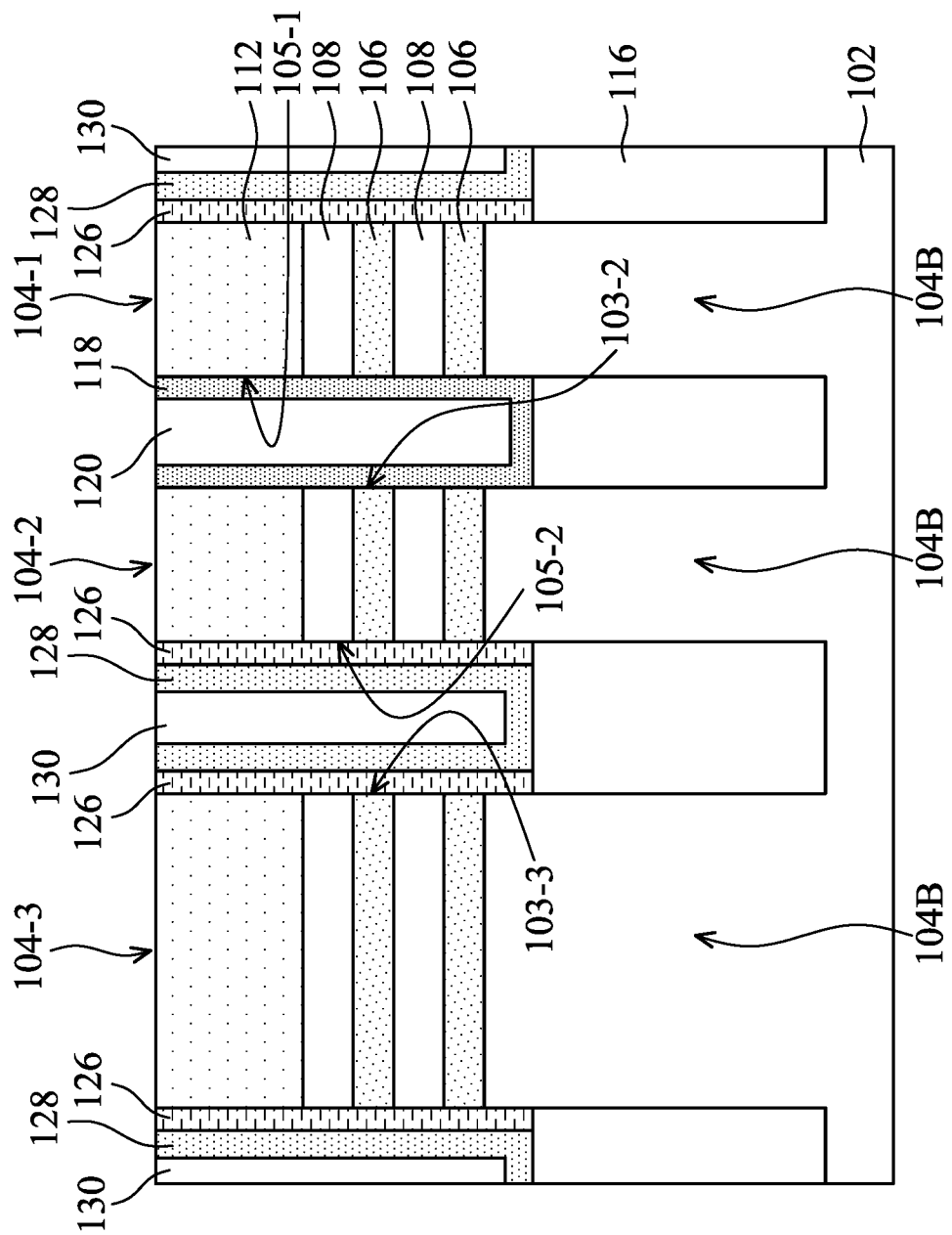

After the second dielectric shell layer 128 is formed, second core portions 130 are formed over the second dielectric shell layer 128 and a polishing process is performed, as shown in FIG. 2F in accordance with some embodiments. In some embodiments, the second core portions 130 are made of a low k dielectric material different from that the second dielectric shell layer 128 is made of. In some embodiments, the second core portions 130 are made of $SiO_2$. In some embodiments, the second core portions 130, the first core portion 120, and the isolation structure 116 are made of the same material. The second core portions 130 may be deposited using CVD, PVD, ALD, HDPCVD, MOCVD, RPCVD, PECVD, LPCVD, ALCVD, APCVD, other applicable methods, or combinations thereof.

After the second core portions 130 are formed, a polishing process, such as a CMP process, is performed in accordance with some embodiments. In some embodiments, the portions of the second dielectric shell layer 128 and the second core portions 130 formed over the fin structures 104-1, 104-2, and 104-3, the cladding layers 126, the first dielectric shell layer 118, and the first core portion 120 are removed. In some embodiments, the semiconductor cap layers 112 over the fin structures 104-1, 104-2, and 104-3, and the cladding layers 126, and the first dielectric fin structure 124 are also partially removed during the polishing process.

Figure 2G:
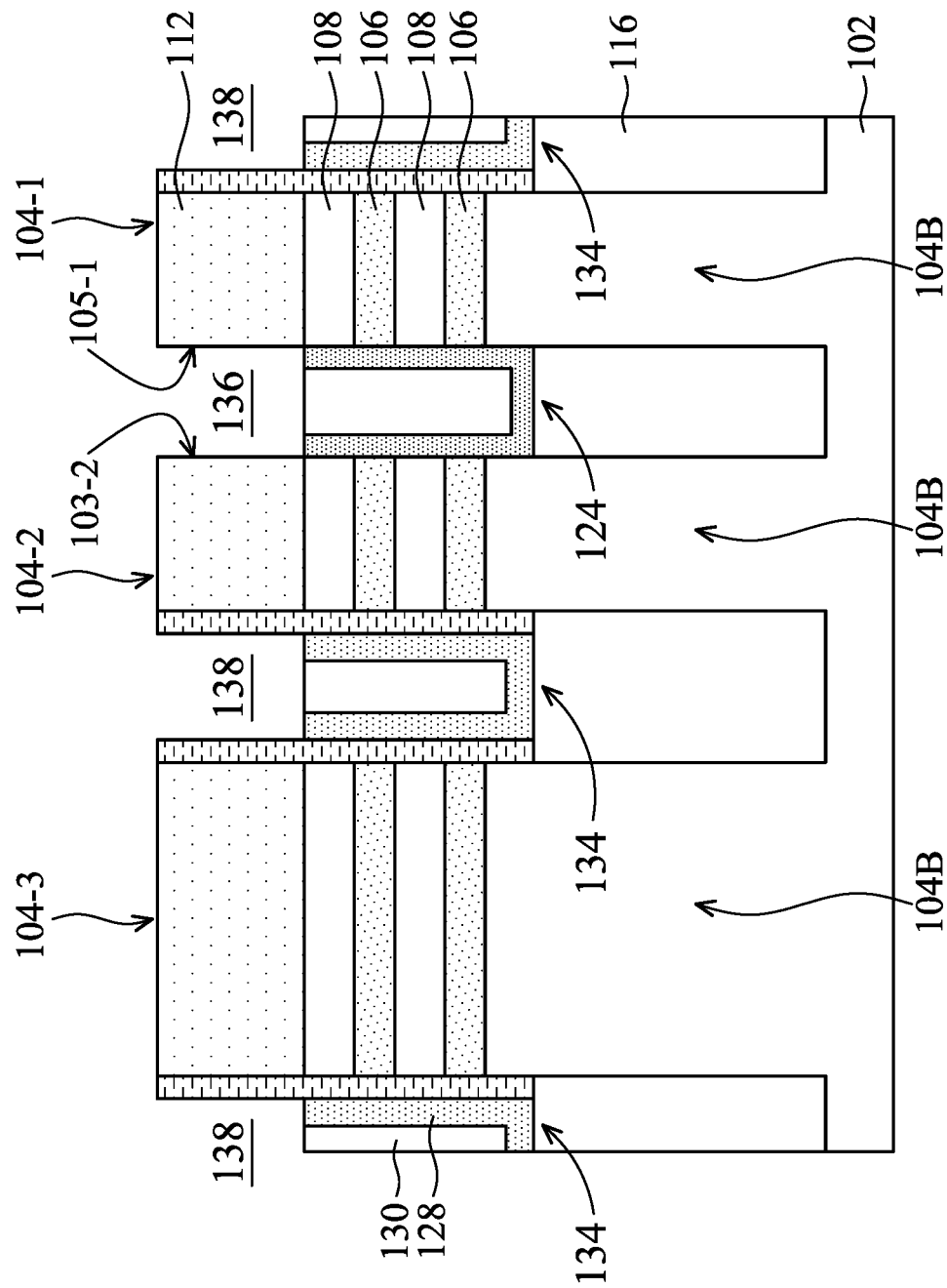

Next, the first dielectric shell layer 118, the first core portion 120, the second dielectric shell layer 128, and the second core portion 130 are recessed to form recesses 136 and 138, as shown in FIG. 2G in accordance with some embodiments. More specifically, the recess 136 is formed over the first dielectric shell layer 118 and the first core portion 120, and the second sidewall 105-1 of the fin structure 104-1 and the first sidewall 103-2 of the fin structure 104-2 are partially exposed by the recess 136 in accordance with some embodiments. In addition, the recesses 138 are formed over the second dielectric shell layers 128 and the second core portions 130, and the sidewalls of the cladding layers 126 are partially exposed by the recesses 138 in accordance with some embodiments.

In some embodiments, the first core portion 120 and the second core portion 130 have substantially the same width, so the recesses 136 and 138 have substantially the same depth. In some embodiments, the top surfaces of the first dielectric shell layer 118, the first core portion 120, the second dielectric shell layer 128, and the second core portion 130 after being recessed are substantially level with the top surface of the topmost second semiconductor material layer 108.

In some embodiments, the first dielectric shell layer 118, the first core portion 120, the second dielectric shell layer 128, and the second core portion 130 are recessed by performing an etching process. In some embodiments, the etching process is an isotropic etching such as dry chemical etching, remote plasma etching, wet chemical etching, other applicable technique, and/or a combination thereof.

Figure 2H:
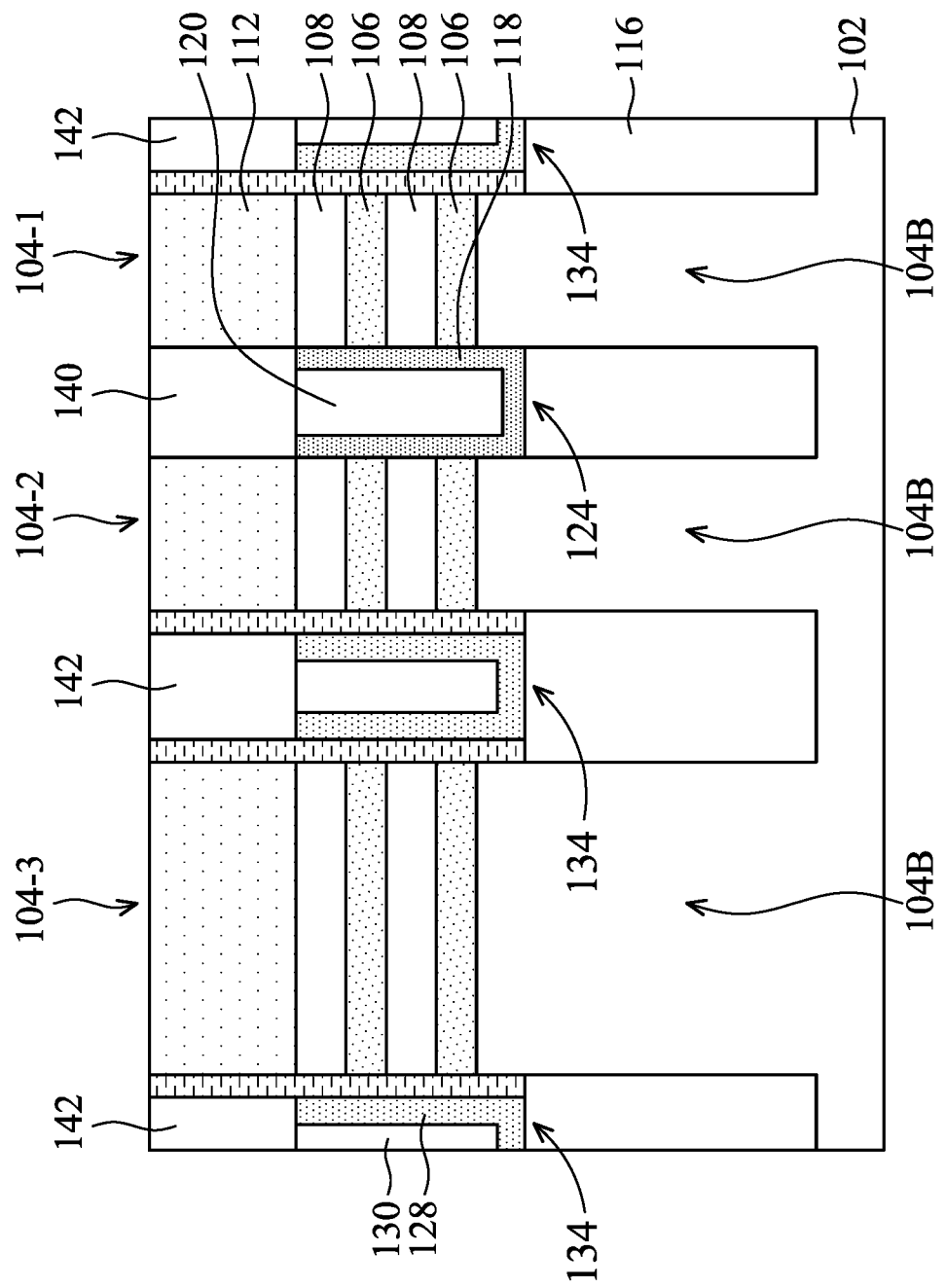

Afterwards, a first dielectric cap layer 140 and second dielectric cap layers 142 are formed in the recesses 136 and 138 respectively, as shown in FIG. 2H in accordance with some embodiments. More specifically, a first dielectric fin structure 124 is formed between the fin structures 104-1 and 104-2 and includes the first dielectric shell layer 118, the first core portion 120, and the first dielectric cap layer 140 in accordance with some embodiments. In addition, second dielectric fin structures 134 are formed between the fin structures 104-2 and 104-3 and also adjacent to the fin structures 104-1 and 104-3 and include the second dielectric shell layers 128, the second core portions 130, and the second dielectric cap layers 142 in accordance with some embodiments.

In some embodiments, the first dielectric cap layers 140 and the second dielectric cap layers 142 are made of the same material. In some embodiments, the first dielectric cap layers 140 and the second dielectric cap layers 142 are made of a high k dielectric material, such as having a dielectric constant greater than 7. In some embodiments, the first dielectric cap layers 140 and the second dielectric cap layers 142 are made of $HfO_2$, $ZrO_2$, $HfAlO_x$, $HfSiO_x$, $Al_2O_3$, or the like. In some embodiments, the material for forming the first dielectric cap layers 140 and the second dielectric cap layers 142 has a higher dielectric constant than the material for forming the first dielectric shell layer 118, the first core portion 120, the second dielectric shell layer 128, and the second core portions 130.

The dielectric material for forming the first dielectric cap layers 140 and the second dielectric cap layers 142 may be formed in the recesses 136 and 138 and over the fin structures 104-1, 104-2, and 104-3 and the cladding layers 126 by performing ALD, CVD, PVD, other suitable process, or combinations thereof. After the dielectric material is formed, a CMP process may be performed until the semiconductor cap layers 112 are exposed in accordance with some embodiments. In some embodiments, the semiconductor cap layers 112 are also slightly removed during the CMP process.

Figure 2I:
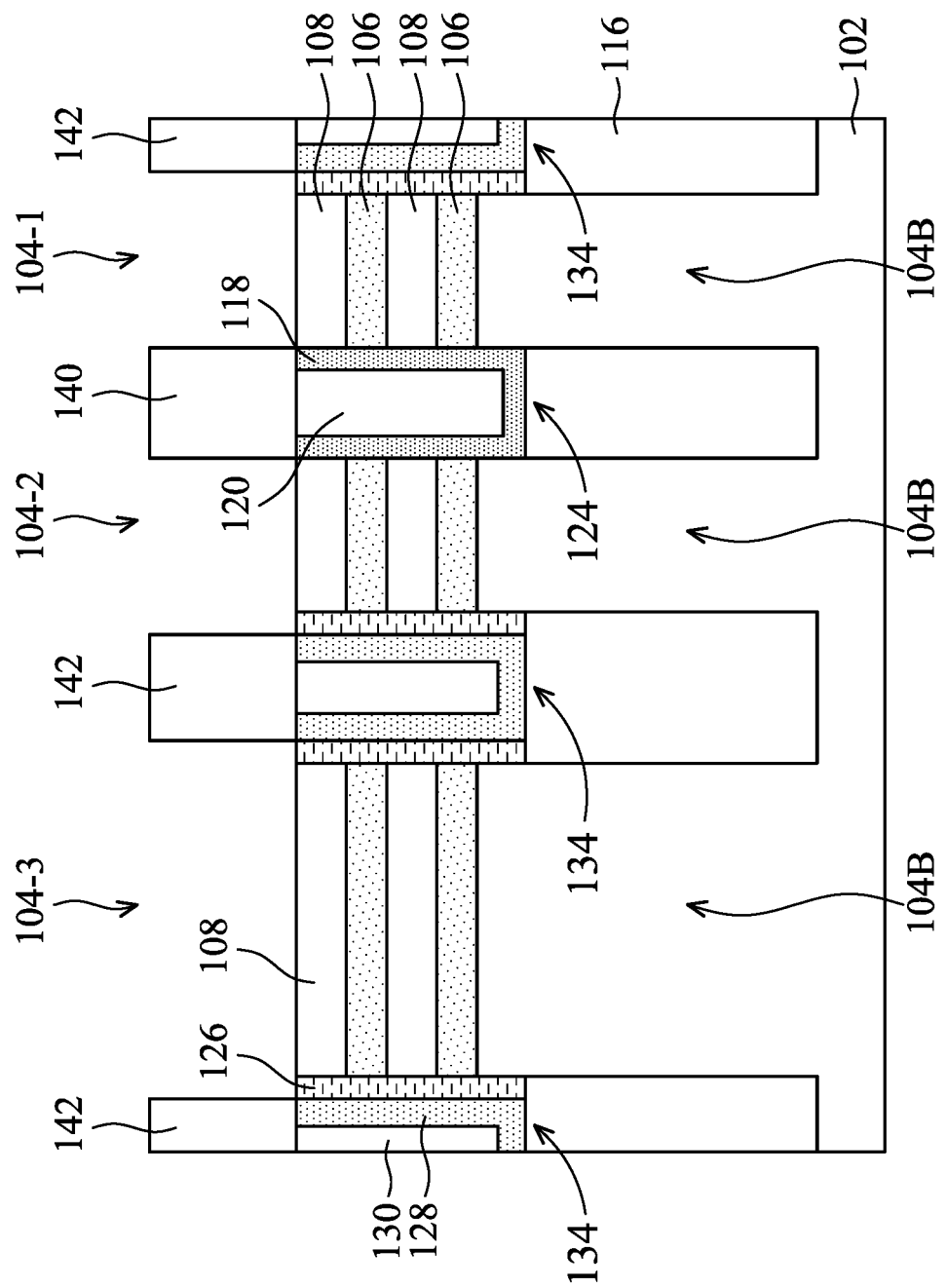

After the CMP process is performed, the semiconductor cap layers 112 over the fin structures 104-1, 104-2, and 104-3 and the top portions of the cladding layers 126 are removed to expose the top surfaces of the topmost second semiconductor material layers 108, as shown in FIG. 2I in accordance with some embodiments. In some embodiments, the top surfaces of the cladding layers 126 are substantially level with the top surfaces of the topmost second semiconductor material layers 108.

The semiconductor cap layers 112 and the cladding layers 126 may be recessed by performing one or more etching processes that have higher etching rate to the semiconductor cap layers 112 and the cladding layers 126 than the first dielectric cap layer 140 and the second dielectric cap layers 142. Therefore, the first dielectric cap layer 140 and the second dielectric cap layers 142 are only slightly etched during the etching processes in accordance with some embodiments. The selective etching processes can be dry etching, wet drying, reactive ion etching, or other applicable etching methods.

Figure 2J:
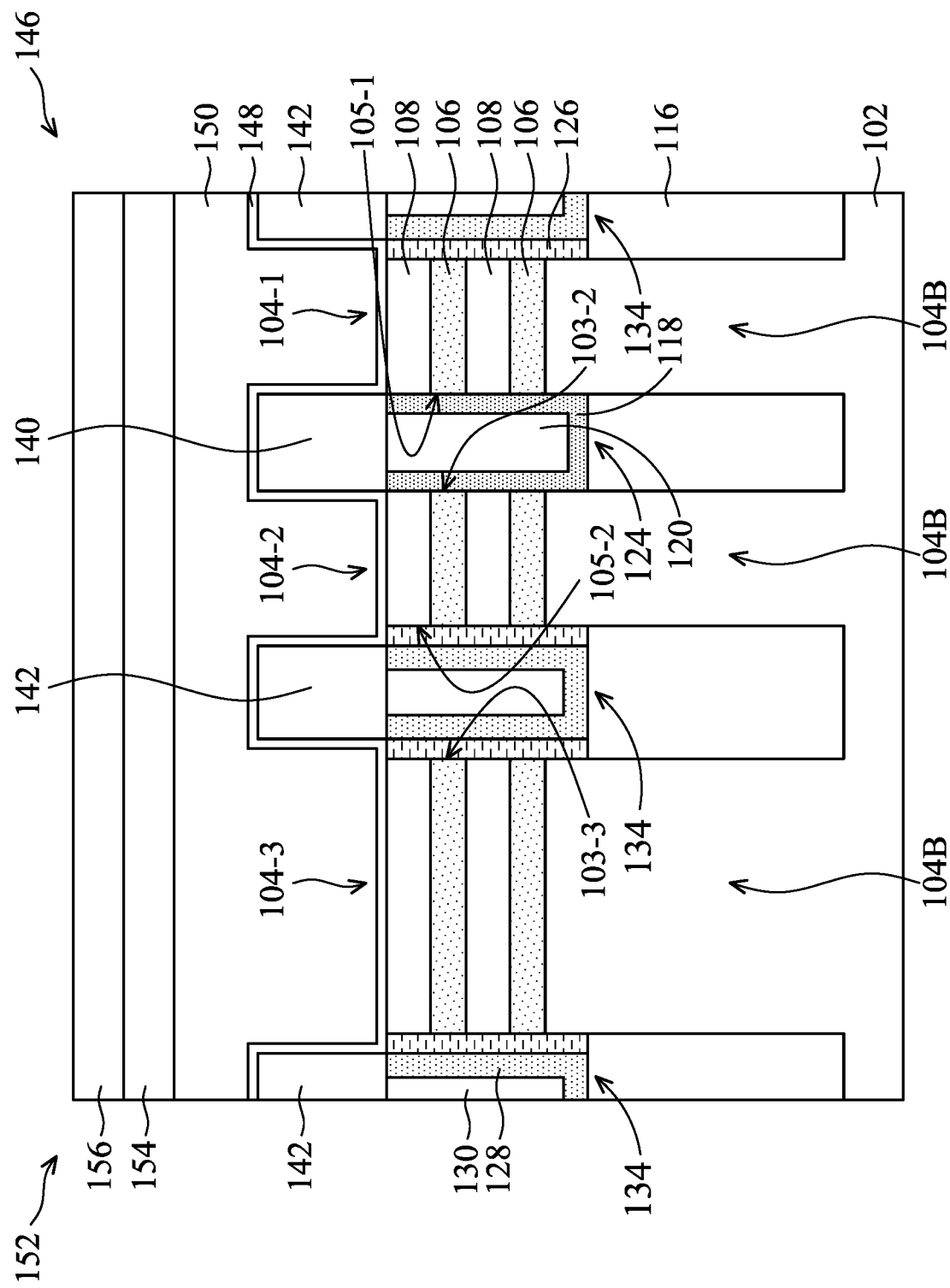
Figures 1, 2J:
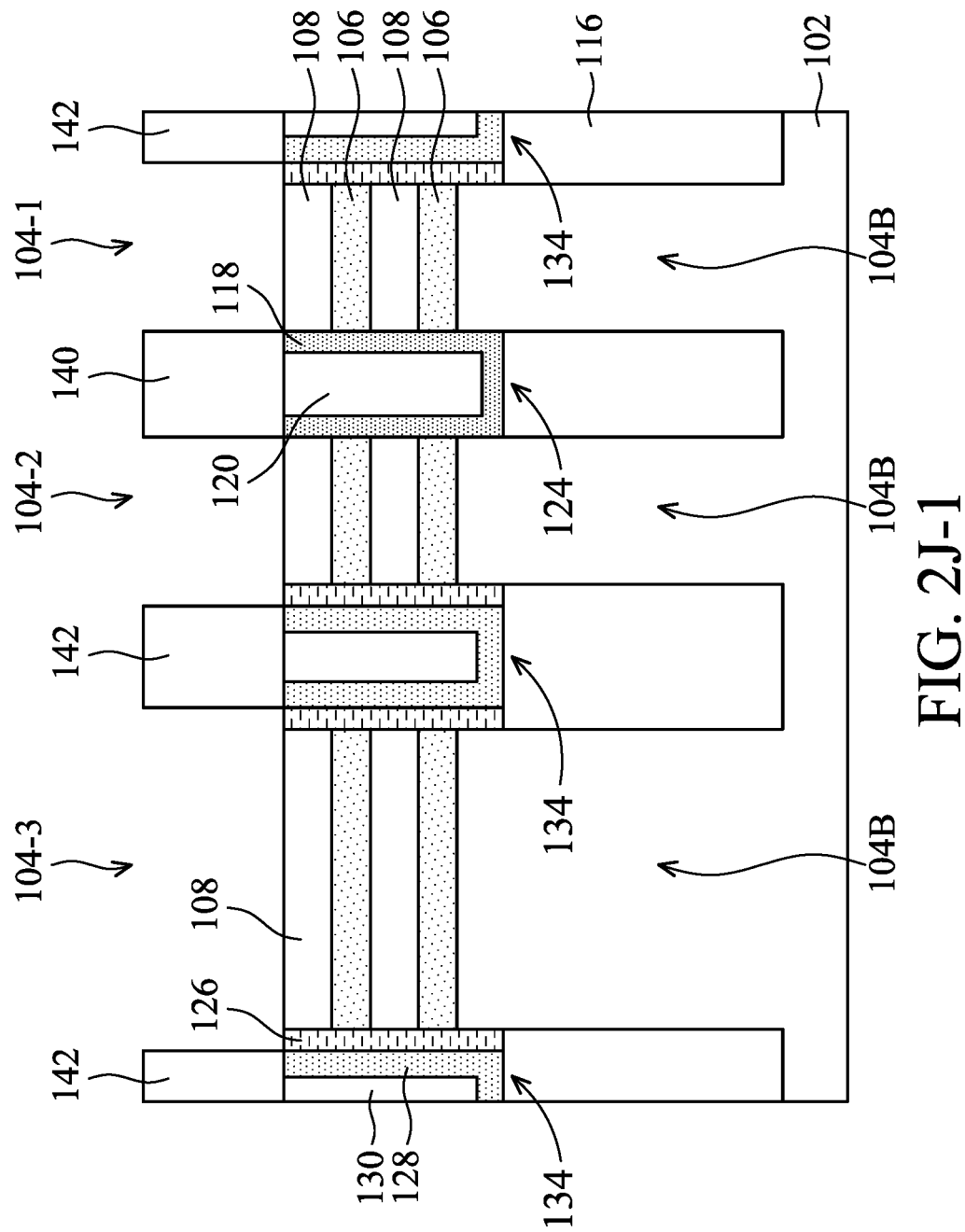
Figures 2, 2J:
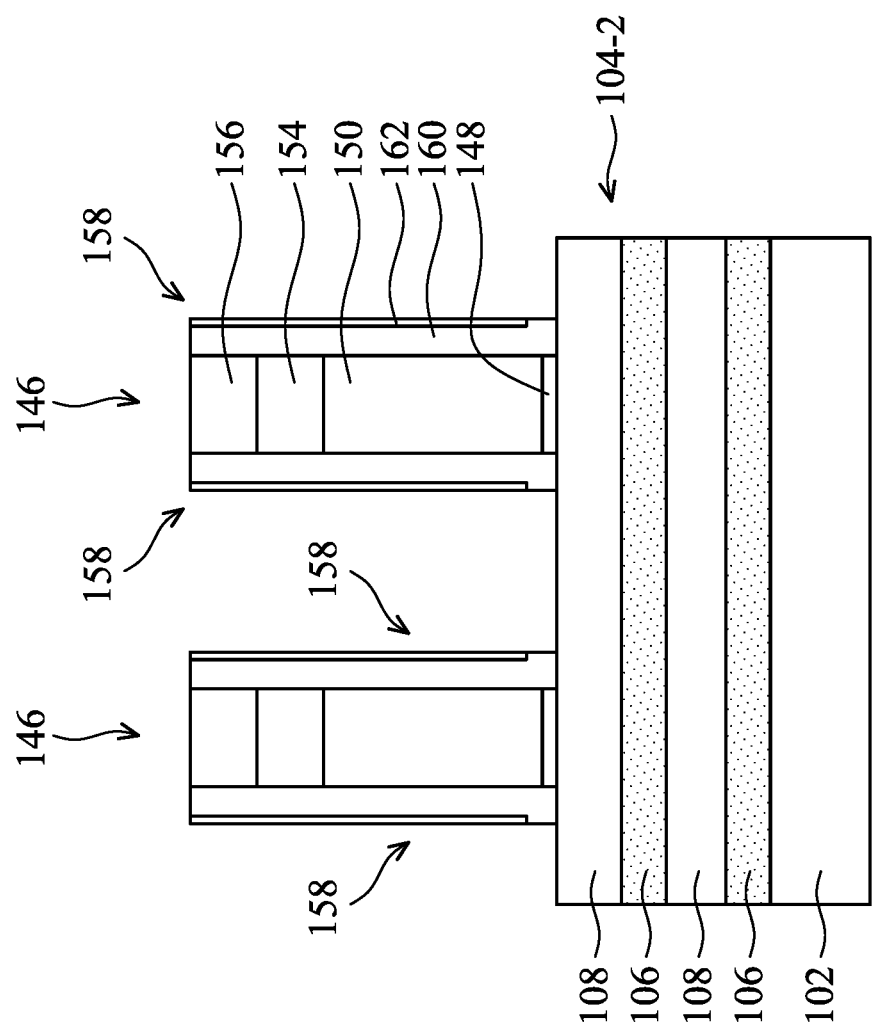
Figures 2, 2J, 3:
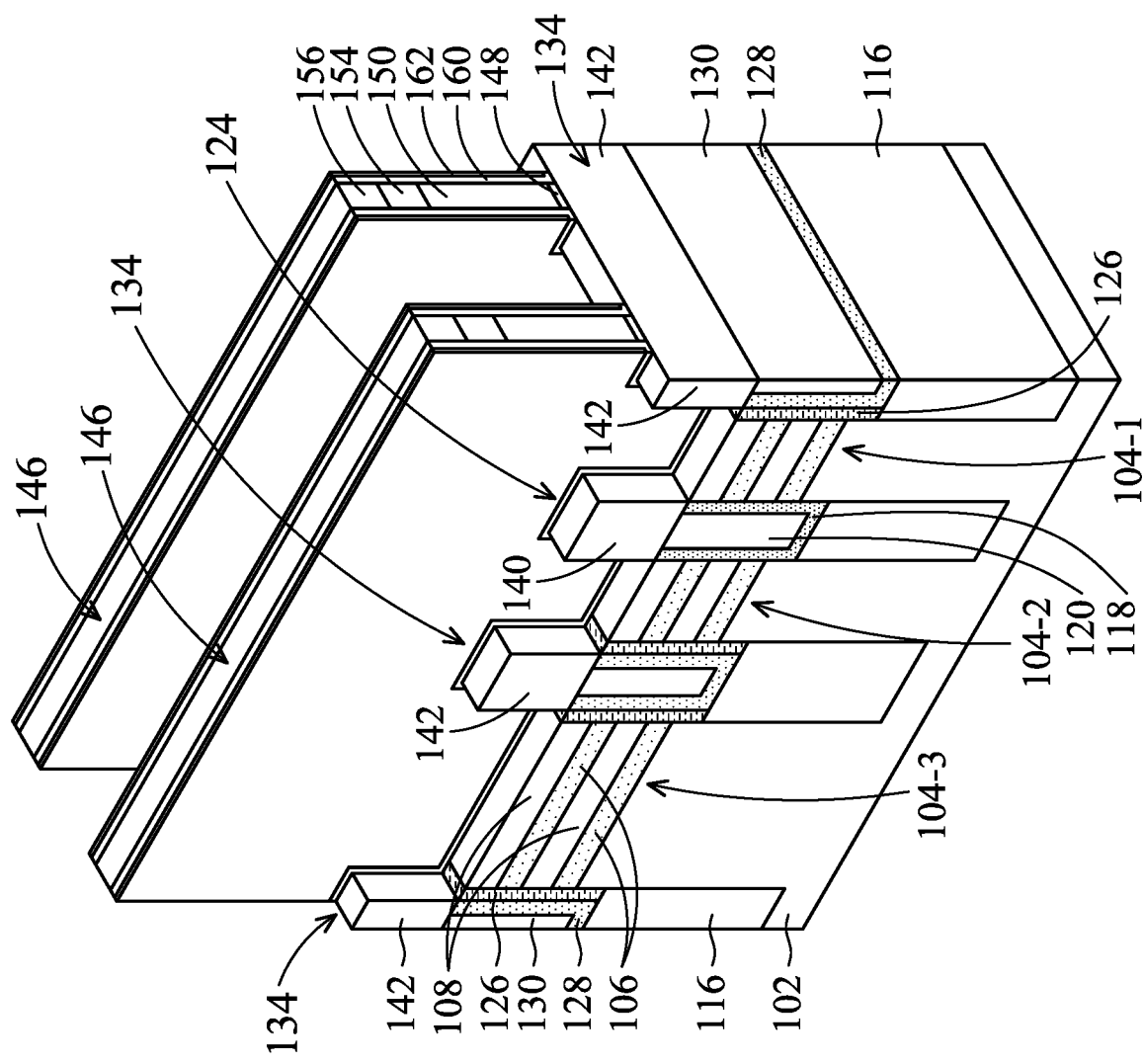
Figure 2K:
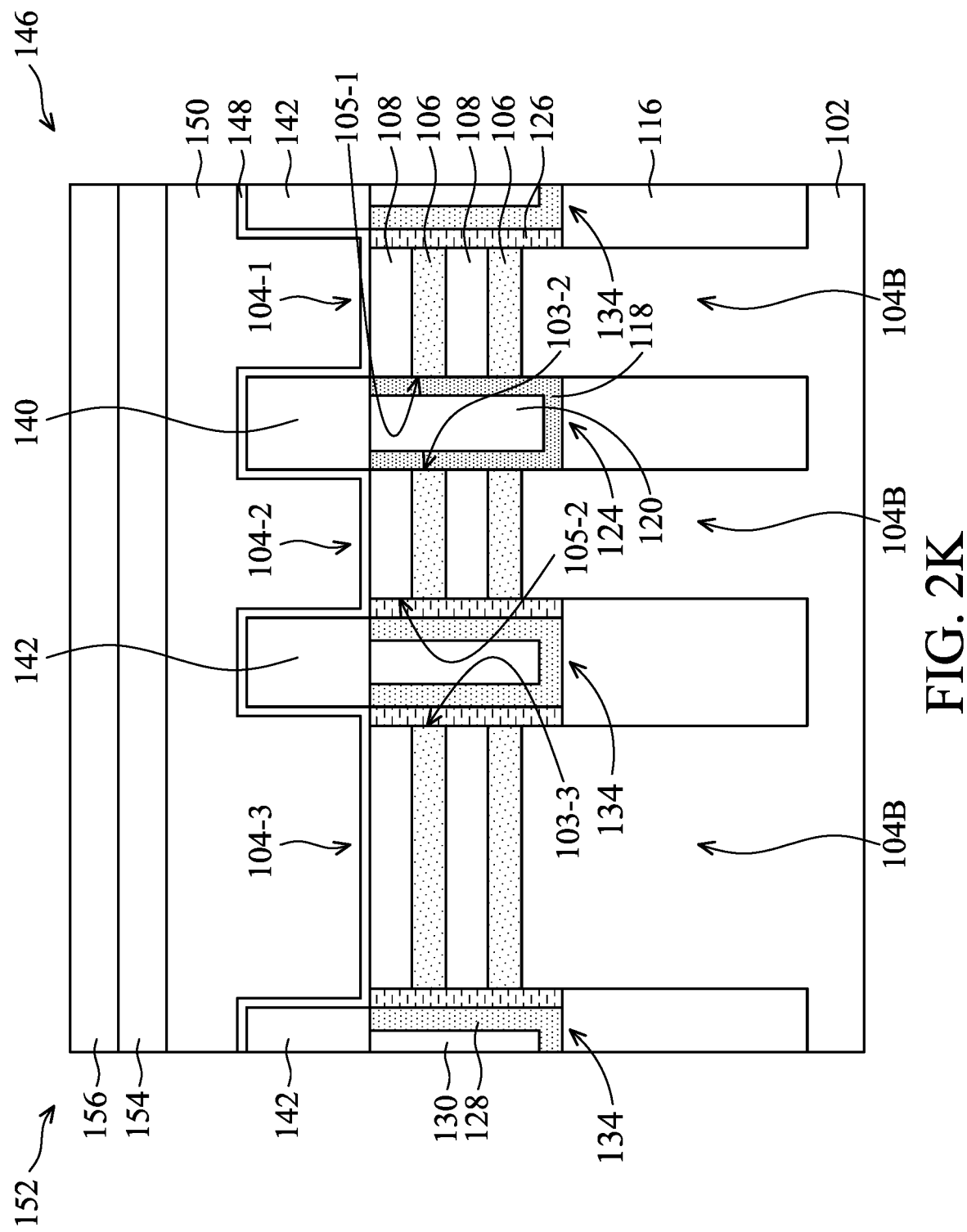
Figures 1, 2K:
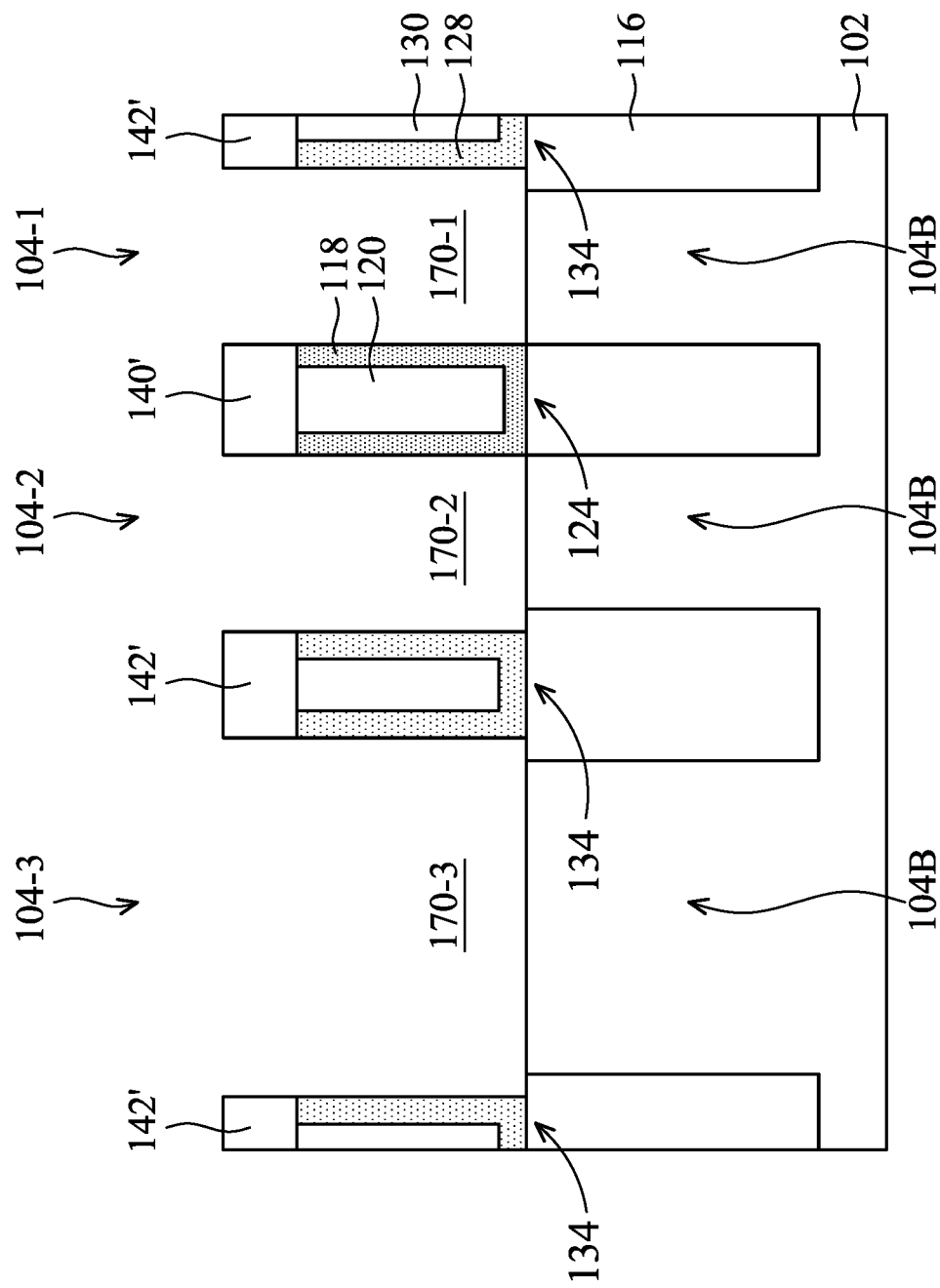
Figures 2, 2K:
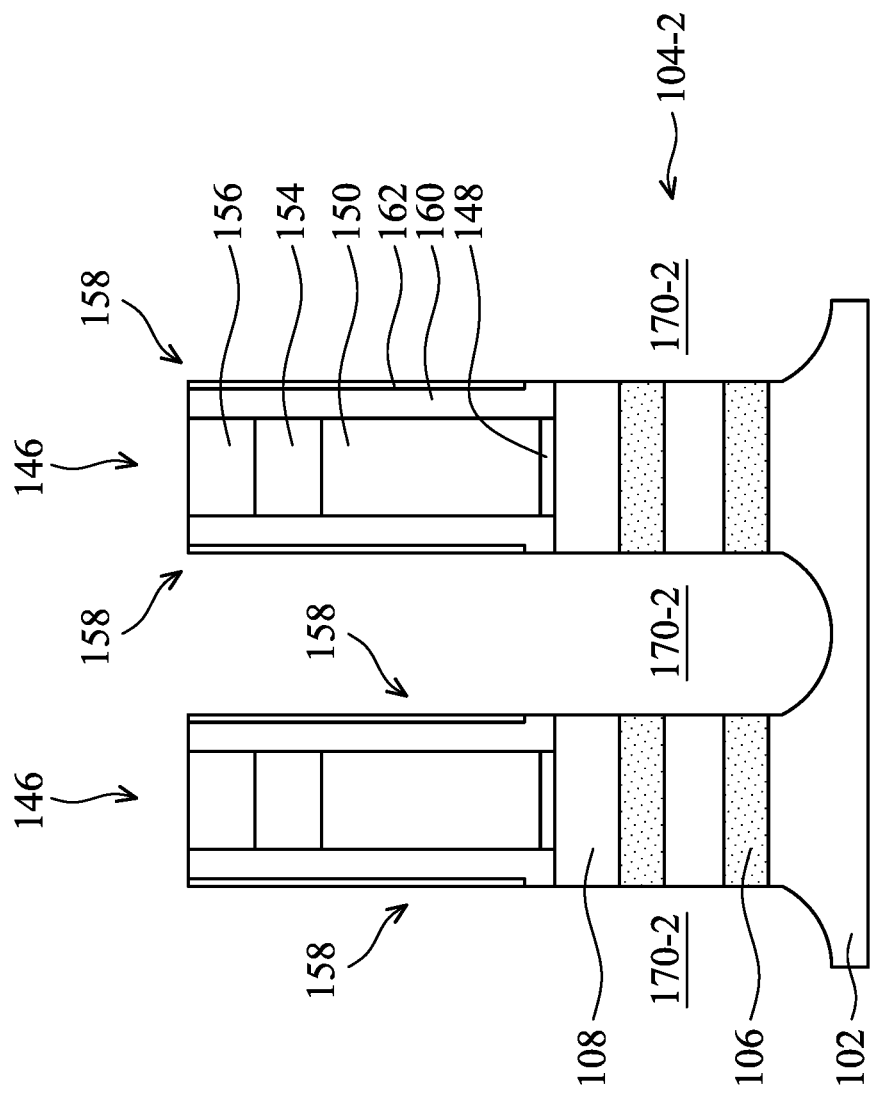

Afterwards, dummy gate structures may be formed across the fin structures 104-1, 104-2, and 104-3, the first dielectric fin structure 124, and the second dielectric fin structures 134. FIGS. 2J-1 to 2O-1 and 2J-2 to 2O-2 illustrate two other cross-sectional views of the intermediate stages of manufacturing the semiconductor structure 100 at the stage of forming the semiconductor structure 100 shown in FIGS. 2J to 2O in accordance with some embodiments. More specifically, FIGS. 2J-1 to 2O-1 illustrate the cross-sectional views shown along line B-B' in FIG. 1C, and FIGS. 2J-2 to 2O-2 illustrate the cross-sectional views shown along line C-C' in FIG. 1C in accordance with some embodiments. In addition, FIG. 2J-3 illustrates a diagrammatic perspective view of the intermediate stage of manufacturing the semiconductor structure 100 at the stage of forming the semiconductor structure 100 shown in FIG. 2J in accordance with some embodiments.

Dummy gate structures 146 are formed across the fin structure 104-1, 104-2, and 104-3, the first dielectric fin structure 124, and the second dielectric fin structures 134, as shown in FIGS. 2J, 2J-1, 2J-2, and 2J-3 in accordance with some embodiments. The dummy gate structures 146 may be used to define the channel regions of the resulting semiconductor structure 100.

In some embodiments, the dummy gate structure 146 includes a dummy gate dielectric layer 148 and a dummy gate electrode layer 150. In some embodiments, the dummy gate dielectric layer 148 is made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layer 148 is formed using thermal oxidation, CVD, ALD, physical vapor deposition (PVD), another suitable method, or a combination thereof.

In some embodiments, the dummy gate electrode layer 150 is made of conductive material includes polycrystalline-silicon (poly-Si), poly-crystalline silicon-germanium (poly-SiGe), or a combination thereof. In some embodiments, the dummy gate electrode layer 150 is formed using CVD, PVD, or a combination thereof.

In some embodiments, hard mask layers 152 are formed over the dummy gate structures 146. In some embodiments, the hard mask layers 152 include multiple layers, such as an oxide layer 154 and a nitride layer 156. In some embodiments, the oxide layer 154 is silicon oxide, and the nitride layer 156 is silicon nitride.

The formation of the dummy gate structures 146 may include conformally forming a dielectric material as the dummy gate dielectric layers 148. Afterwards, a conductive material may be formed over the dielectric material as the dummy gate electrode layers 150, and the hard mask layer 152 may be formed over the conductive material. Next, the dielectric material and the conductive material may be patterned through the hard mask layer 152 to form the dummy gate structures 146.

After the dummy gate structures 146 are formed, gate spacers 158 are formed along and covering the sidewalls of the dummy gate structures 146, as shown in FIG. 2J-2 in accordance with some embodiments. In some embodiments, the gate spacers 158 also cover some portions of the top surfaces of the first dielectric fin structure 124 and the second dielectric fin structures 134, as shown in FIG. 2J-3.

The gate spacers 158 may be configured to separate source/drain structures (formed afterwards) from the dummy gate structures 146. In some embodiments, the gate spacers 158 are made of a first spacer layer 160 and a second spacer layer 162. In some embodiments, the first spacer layer 160 and the second spacer layer 162 are made of different dielectric materials. The dielectric materials may include silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. In some embodiments, the first spacer layer 160 has an L shape structure in the cross-sectional view and the second spacer layer 162 is formed over the lateral portion of the L shape structure of the first spacer layer 160. In some embodiments, the first spacer layer 160 is thicker than the second spacer layer 162.

After the dummy gate structures 146 are formed, source/drain structures may be formed in the fin structure 104-1, 104-2, and 104-3. First, source/drain recesses 170-1, 170-2, and 170-3 are formed adjacent to the first dielectric fin structure 124 and the second dielectric fin structures 134, as shown in FIGS. 2K, 2K-1, and 2K-2 in accordance with some embodiments. More specifically, the fin structures 104-1, 104-2, and 104-3 and the cladding layers 126 not covered by the dummy gate structures 146 and the gate spacers 158 are recessed to form the source/drain recesses 170-1, 170-2, and 170-3 in accordance with some embodiments. Since the cladding layers 126 are sandwiched between the second dielectric fin structures 134 and the fin structures 104-1, 104-2, and104-3, the sidewalls of the second dielectric fin structures 134 are not aligned with the sidewalls of the fin structures 104-1, 104-2, and 104-3 in accordance with some embodiments. Therefore, the sidewalls of the source/drain recess 170-3, one of the sidewall of the source/drain recess 170-2, and one of the sidewall of the source/drain recess 170-1 (i.e. at the second dielectric fin structures 134) are not aligned with the sidewalls of the fin structures 104-1, 104-2, and 104-3, as shown in FIG. 2K-1 in accordance with some embodiments. On the other hand, since the first dielectric fin structure 124 is in contact with the second sidewall 105-1 of the fin structure 104-1 and the first sidewall 103-2 of the fin structure 104-2, one sidewall of the source/drain recess 170-1 and one sidewall of the source/drain recess 170-2 (i.e. at the first dielectric fin structure 124) are aligned with one sidewall of the fin structure 104-1 and one sidewall of the fin structure 104-2, as shown in FIG. 2K-1 in accordance with some embodiments.

In some embodiments, when the source/drain recesses 170-1, 170-2, and 170-3 are formed, the first dielectric cap layer 140 and the second dielectric cap layers 142 at the source/drain regions are also recessed to have recessed first dielectric cap layer 140' and recessed second dielectric cap layers 142', as shown in FIG. 2K-1. The remaining portions of the recessed first dielectric cap layer 140' and recessed second dielectric cap layers 142' may be used as protection layers of the bottom portions of the first dielectric fin structure 124 and the second dielectric fin structures 134 during subsequent etching processes (e.g. the etching processes for forming inner spacers or the cleaning processes after forming source/drain structures).

In some embodiments, the fin structures 104-1, 104-2, and 104-3 and the cladding layers 126 are recessed by performing an etching process. The etching process may be an anisotropic etching process, such as dry plasma etching. In addition, the dummy gate structure 146 and the gate spacers 158 may be used as etching masks during the etching process.

Figure 2L:
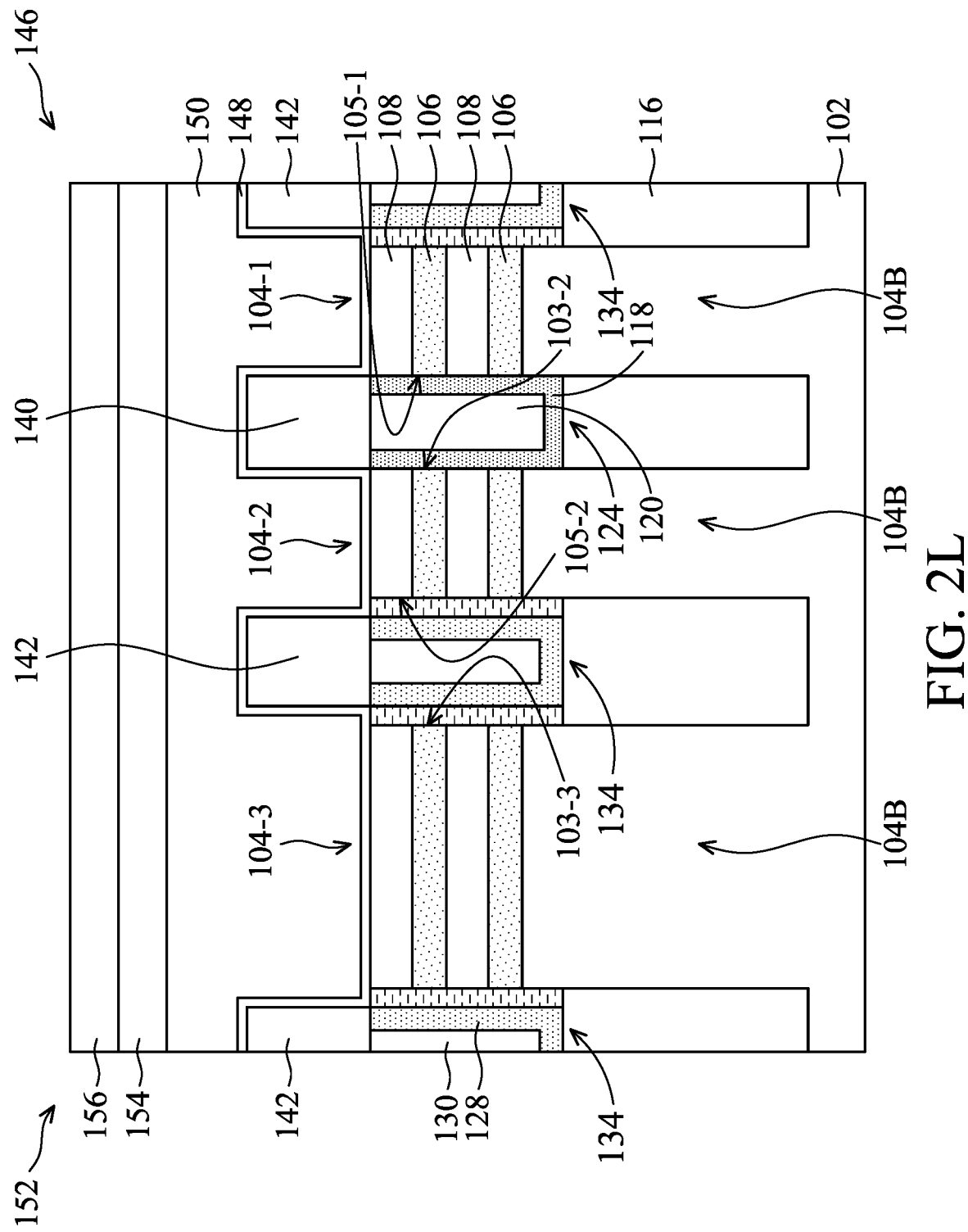
Figures 1, 2L:
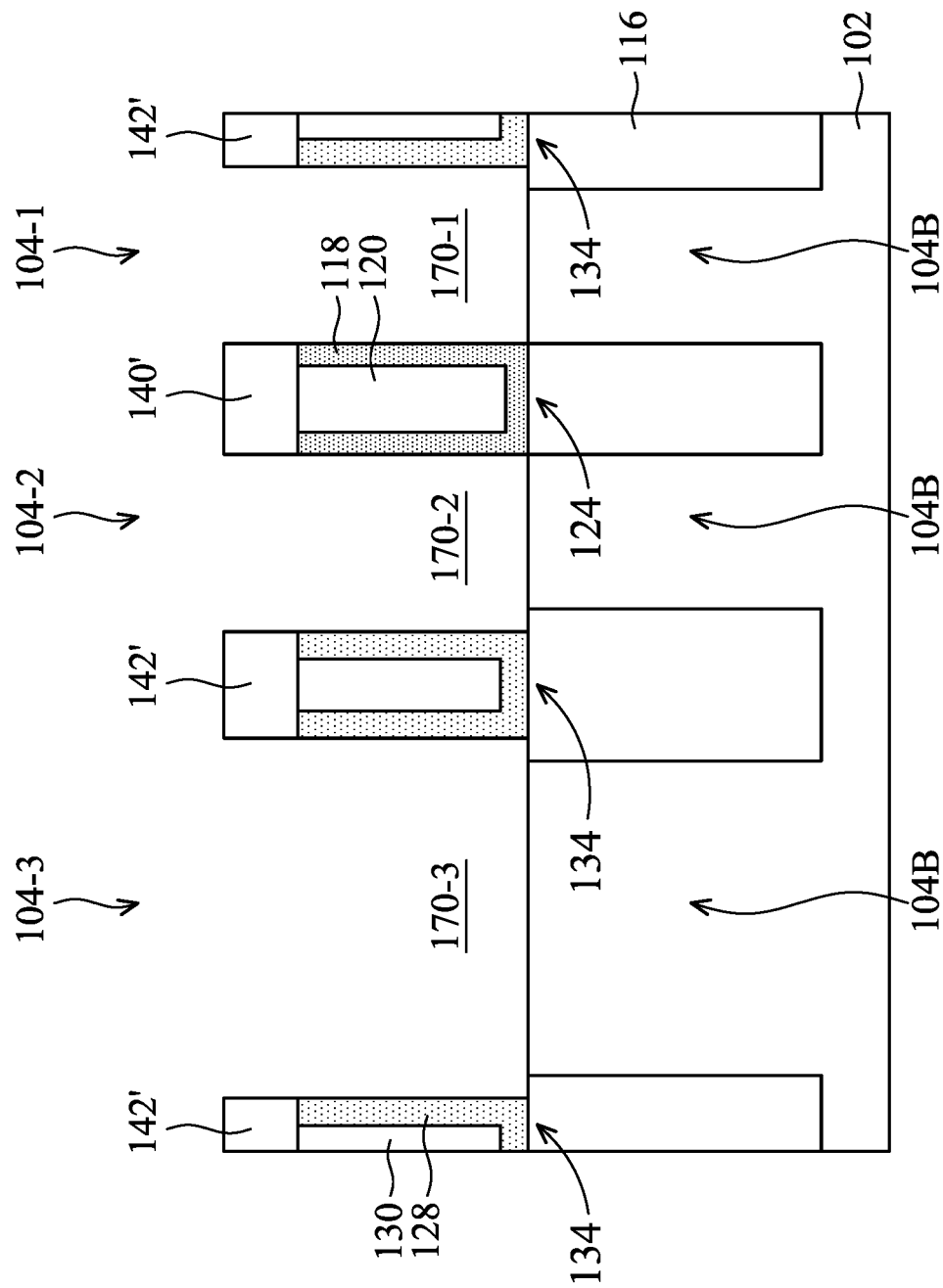

After the source/drain recesses 170-1, 170-2, and 170-3 are formed, the first semiconductor material layers 106 and the cladding layers 126 exposed by the source/drain recesses 170-1, 170-2, and 170-3 are laterally recessed to form notches 174, as shown in FIGS. 2L, 2L-1, and 2L-2 in accordance with some embodiments.

In some embodiments, an etching process is performed to laterally recess the first semiconductor material layers 106 of the fin structure 104-1, 104-2, and 104-3 and the cladding layers 126 from the source/drain recesses 170-1, 170-2, and 170-3. In some embodiments, during the etching process, the first semiconductor material layers 106 and the cladding layers 126 have a greater etching rate (or etching amount) than the second semiconductor material layers 108, thereby forming notches 174 between the adjacent second semiconductor material layers 108 and around the second semiconductor material layers 108. In some embodiments, the second semiconductor material layers 108 are also slightly etched during the etching process, so that the notches 174 extend into the second semiconductor material layers 108 and the portions of the second semiconductor material layers 108 become thinner than other portions, as shown in FIG. 2L-2 in accordance with some embodiments. In some embodiments, the etching process is an isotropic etching such as dry chemical etching, remote plasma etching, wet chemical etching, another suitable technique, and/or a combination thereof.

Figure 2M:
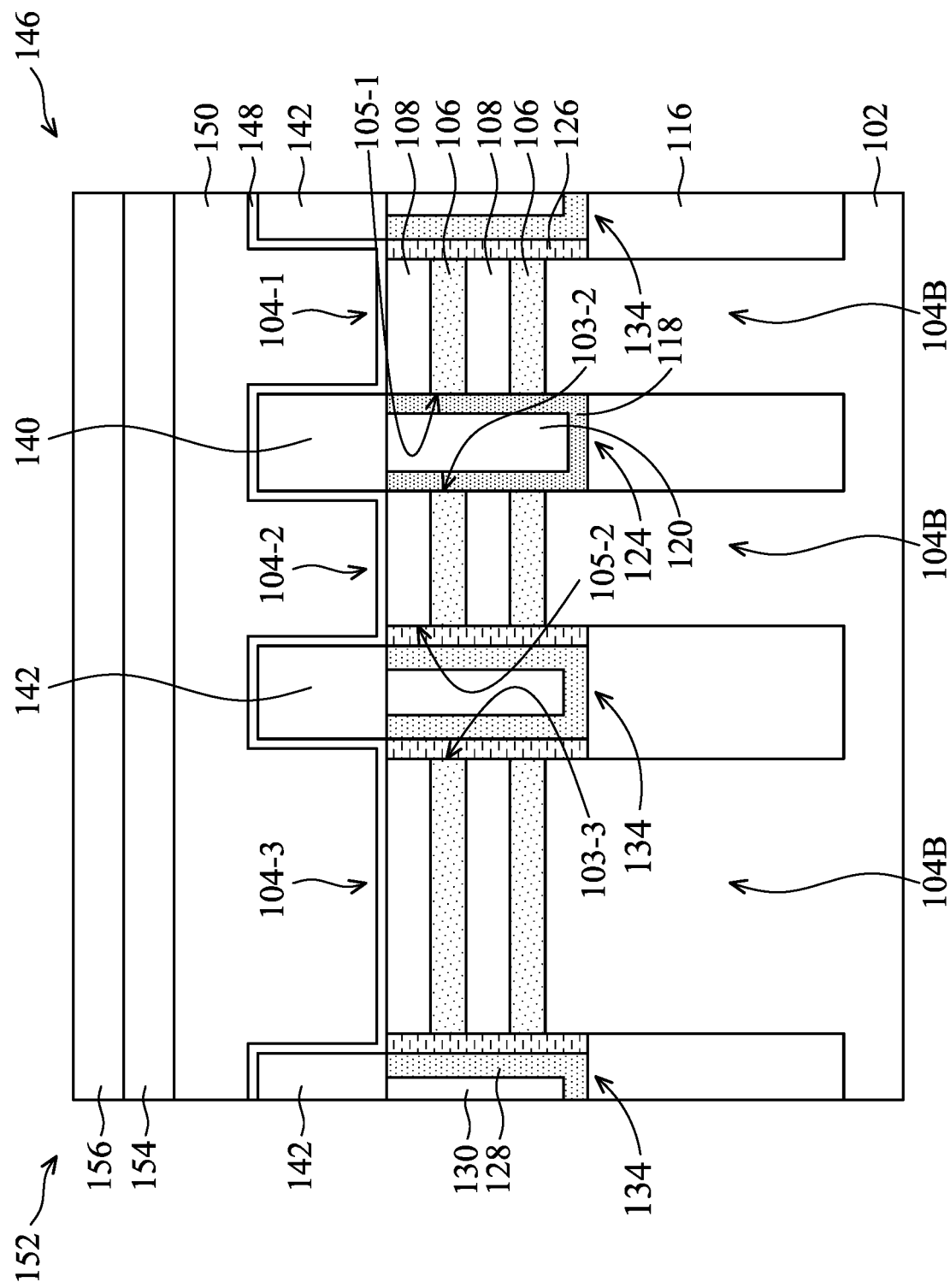
Figures 1, 2M:
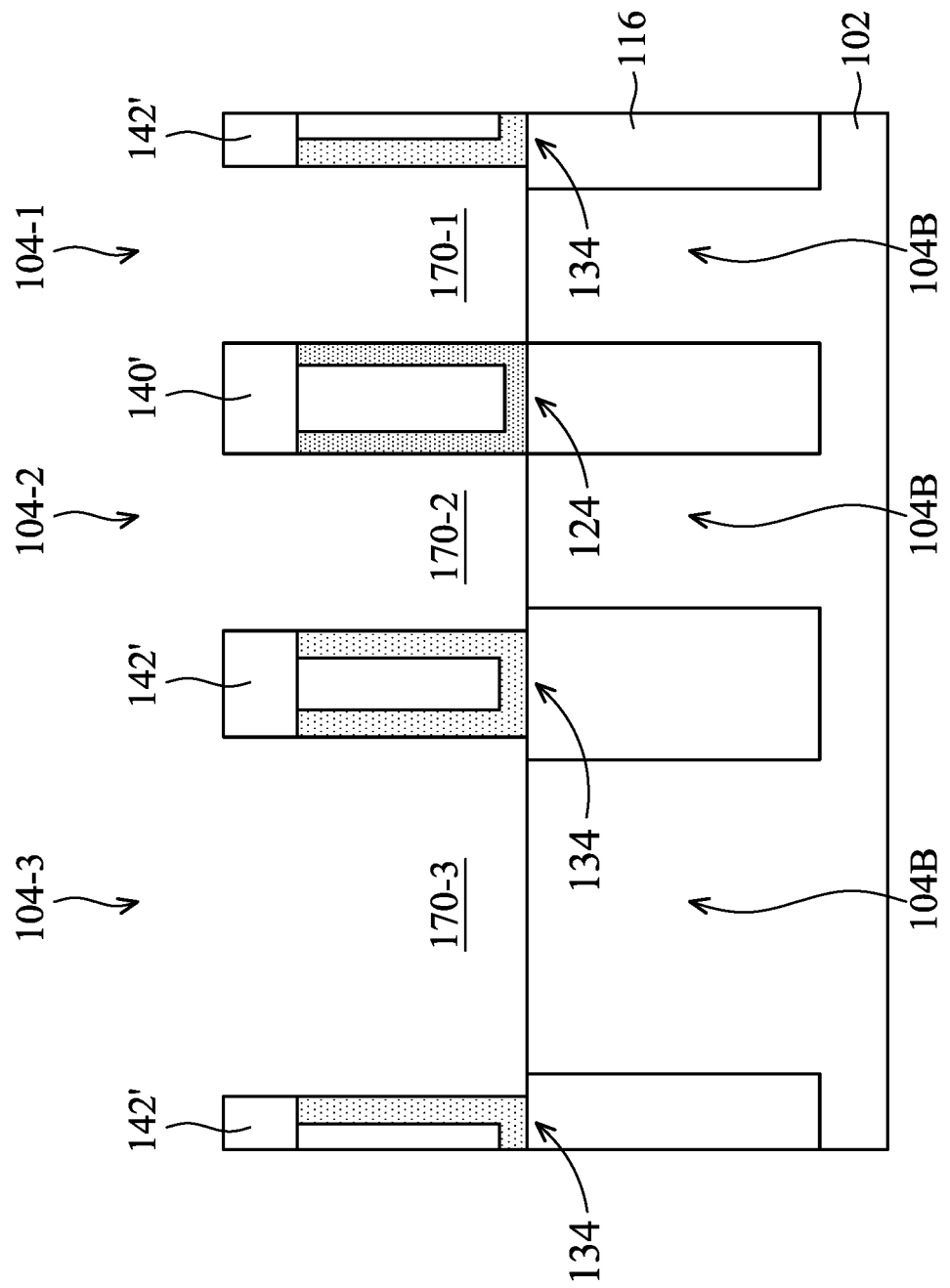
Figures 2, 2M:
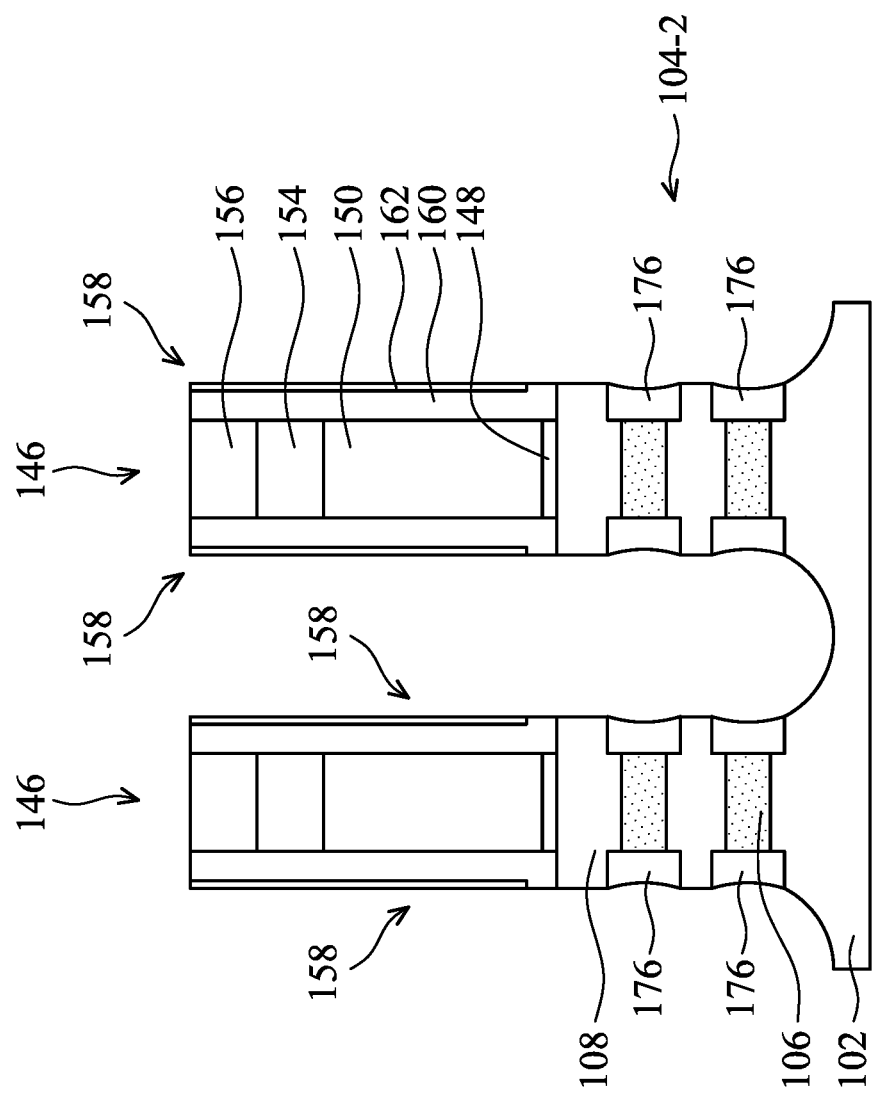

Next, inner spacers 176 are formed in the notches 174 between and around the second semiconductor material layers 108, as shown in FIGS. 2M, 2M-1, and 2M-2 in accordance with some embodiments. The inner spacers 176 may be configured to separate the source/drain structures and the gate structures formed in subsequent manufacturing processes. As described previously, since the second semiconductor material layers 108 are also partially etched when forming the notches 174, the inner spacers 176 formed in the notches 174 are thicker than the thicknesses of the first semiconductor material layers 106 in accordance with some embodiments. In addition, the inner spacers 176 have curve sidewalls in accordance with some embodiments. In some embodiments, the inner spacers 176 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof.

Figure 2N:
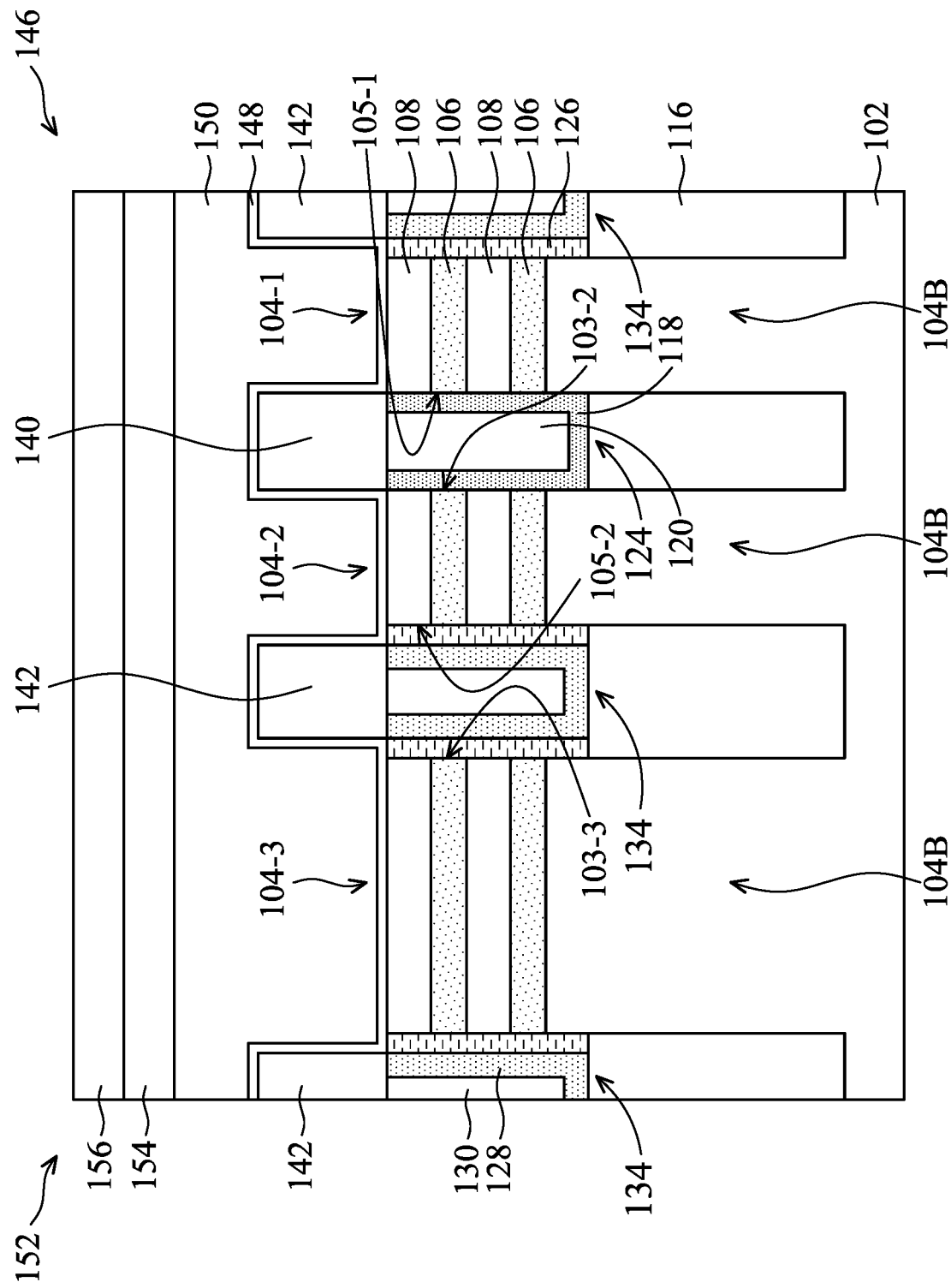
Figures 1, 2N:
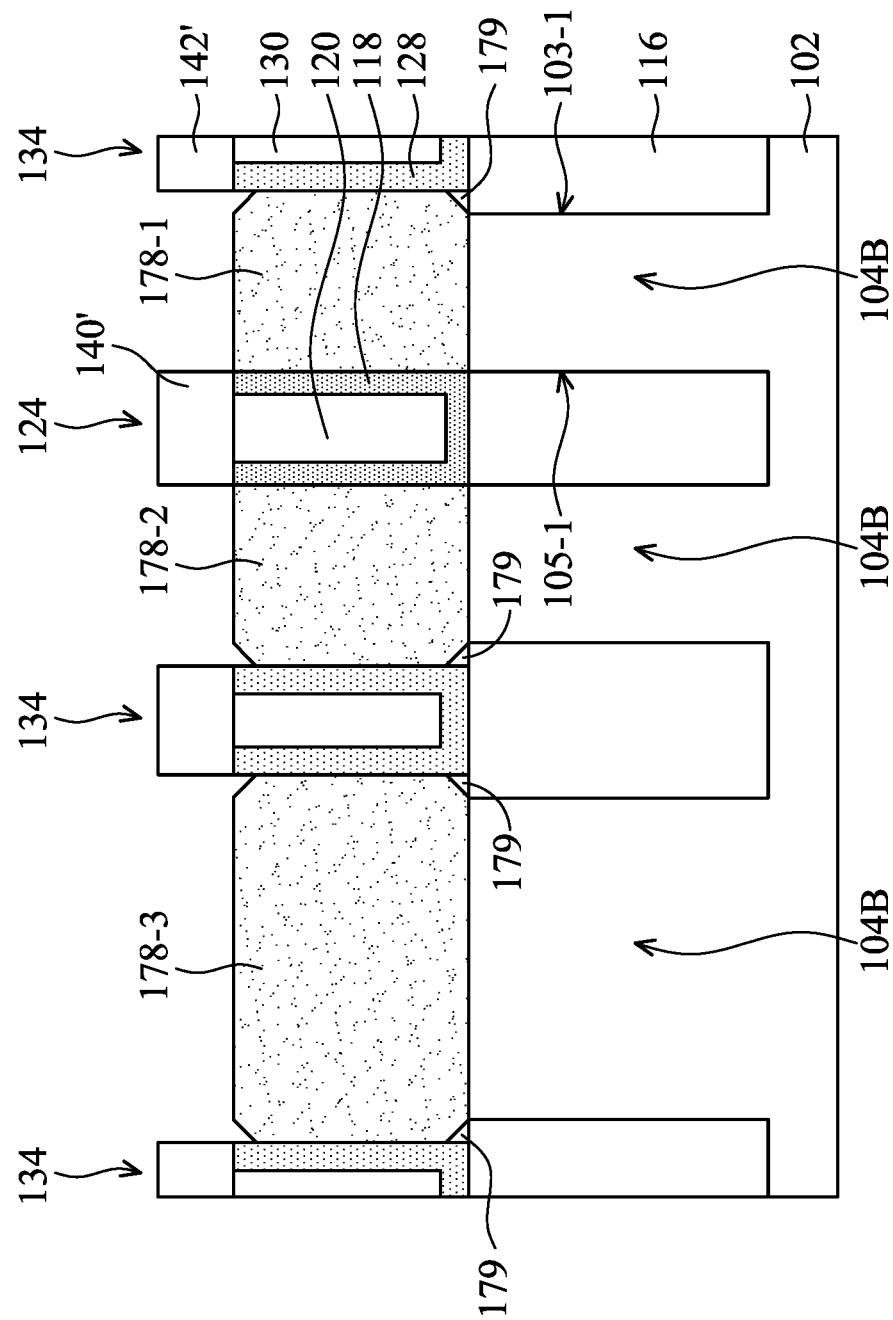
Figures 2, 2N:
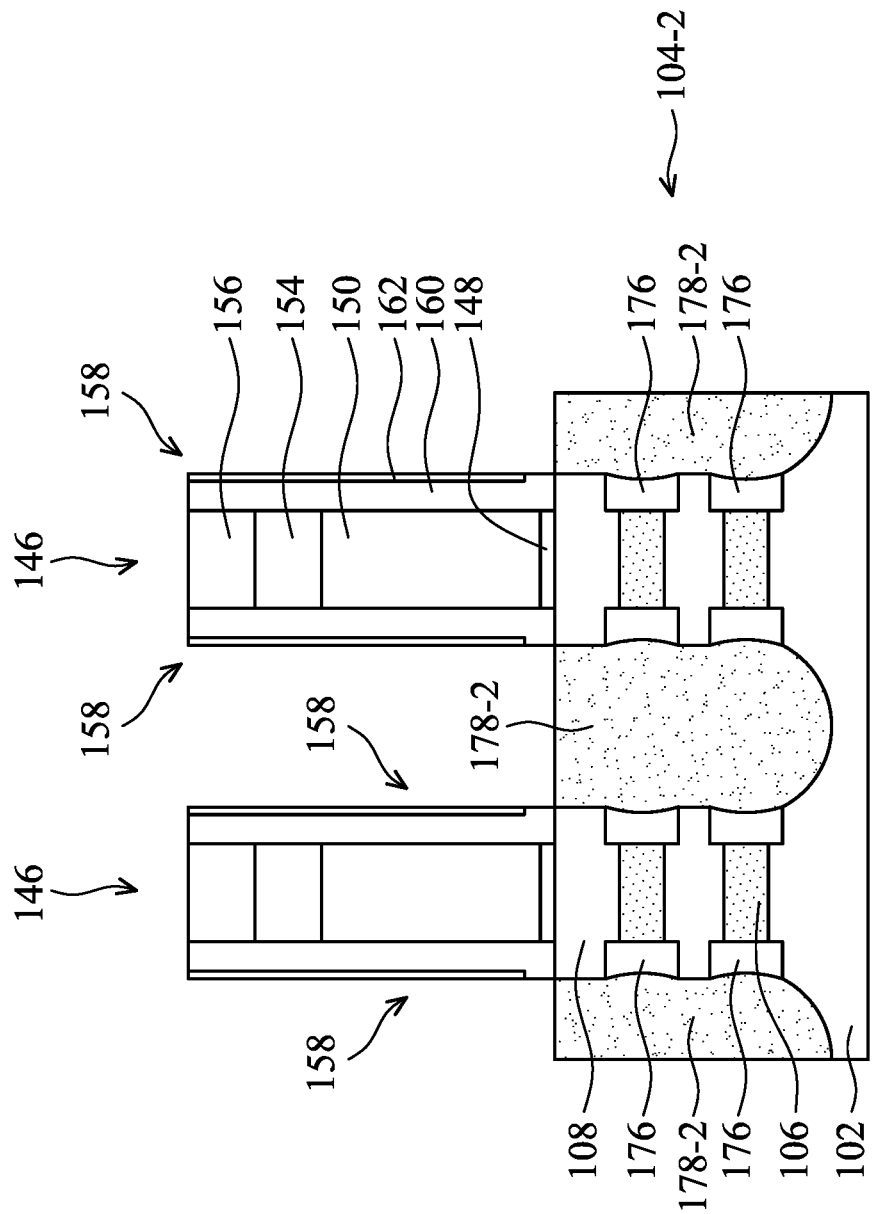
Figure 2O:
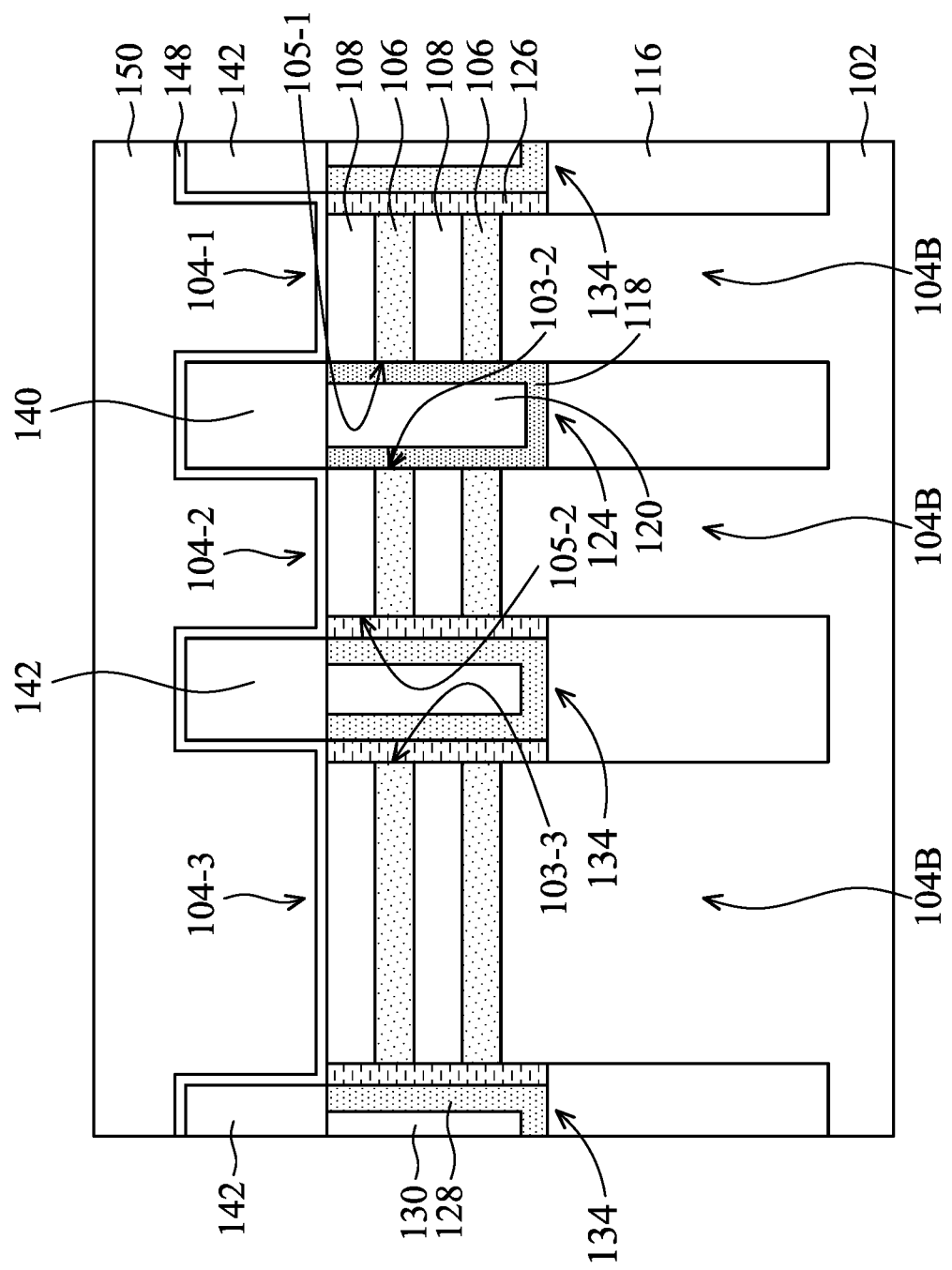
Figures 1, 2O:
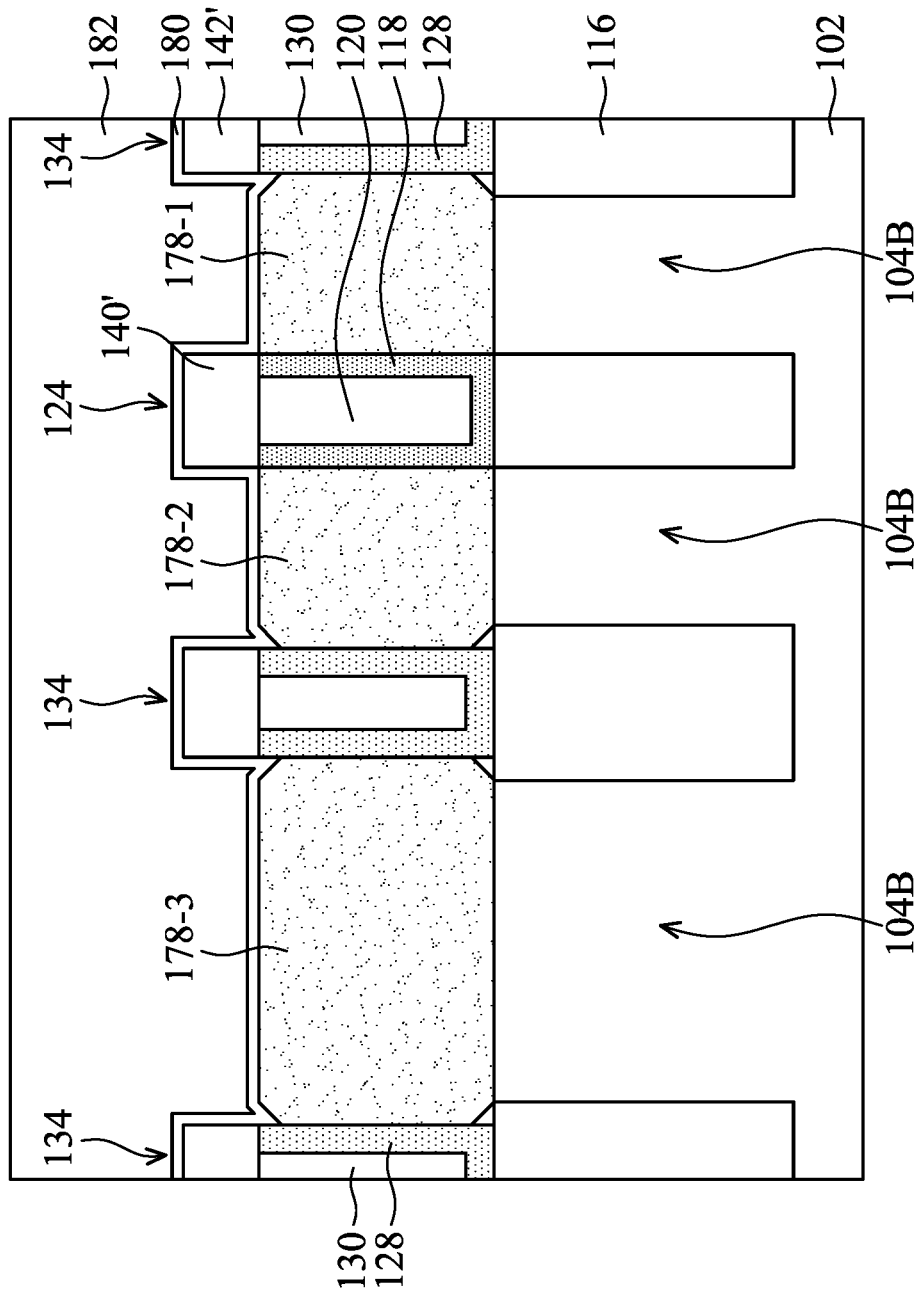
Figures 2, 20:
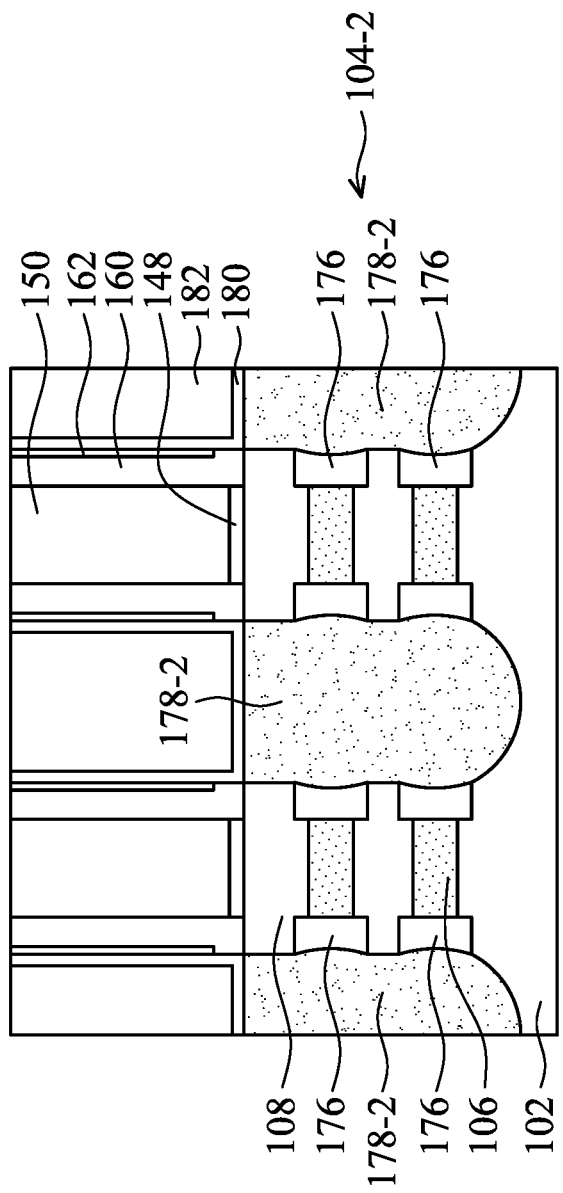

After the inner spacers 176 are formed, source/drain structures 178-1, 178-2, and 178-3 are formed in the source/drain recesses 170-1, 170-2, and 170-3 respectively, as shown in FIGS. 2N, 2N-2, and 2N-3 in accordance with some embodiments. In some embodiments, the source/drain structures 178-1, 178-2, and 178-3 are separated by first dielectric fin structure 124 and the second dielectric fin structures 134. In some embodiments, the source/drain structures 178-1, 178-2, and 178-3 have different shapes.

More specifically, the source/drain structure 178-1 is formed over the fin structure 104-1 and is sandwiched between the first dielectric fin structure 124 and one of the second dielectric fin structures 134 in accordance with some embodiments. In addition, since the second sidewall 105-1 of the fin structure 104-1 is substantially aligned with the sidewall of the first dielectric fin structure 124, the source/drain structure 178-1 grown over the fin structure 104-1 has a substantially vertical sidewall at the side of the first dielectric fin structure 124 in accordance with some embodiments. On the other hand, since the second dielectric fin structure 134 is spaced apart from the fin structure 104-1, the source/drain structure 178-1 at the side of the second dielectric fin structure 134 may grow laterally over the isolation structure 116 until contacting the sidewall of the second dielectric fin structure 134. Accordingly, the source/drain structure 178-1 at the side of the second dielectric fin structure 134 has an extending portion vertically over the isolation structure 116 in accordance with some embodiments. That is, the source/drain structure 178-1 has an asymmetry shape in its cross-sectional view in accordance with some embodiments.

In some embodiments, a void 179 is formed and enclosed by source/drain structure 178-1, the second dielectric fin structure 134, and the isolation structure 116. In some embodiments, the source/drain structure 178-1 is in direct contact with both the first dielectric fin structure 124 and the second dielectric fin structure 134.

In some embodiments, the source/drain structure 178-2 is formed over the fin structure 104-2 and is similar but symmetry to the source/drain structure 178-1 described above. In some embodiments, the source/drain structure 178-3 formed over the fin structure 104-3 is sandwiched between two second dielectric fin structures 134 and therefore has a substantially symmetry structure in the cross-sectional view. That is, the source/drain structure 178-3 has extending portions at both sides over the isolation structure 116 in accordance with some embodiments. In addition, the voids 179 are also formed under the extending portions of the source/drain structures 178-2 and 178-3 in accordance with some embodiments. In some embodiments, the source/drain structure 178-2 is in direct contact with both the first dielectric fin structure 124 and the second dielectric fin structure 134. In some embodiments, the source/drain structure 178-3 is in direct contact with the second dielectric fin structures 134.

In some embodiments, the source/drain structures 178-1, 178-2, and 178-3 are formed using an epitaxial growth process, such as MBE, MOCVD, VPE, other applicable epitaxial growth process, or a combination thereof. In some embodiments, the source/drain structures 178- 1, 178-2, and 178-3 are made of any applicable material, such as Ge, Si, GaAs, AlGaAs, SiGe, GaAsP, SiP, SiC, SiCP, or a combination thereof. In some embodiments, the source/drain structures 178-1, 178-2, and 178-3 are in-situ doped during the epitaxial growth process. For example, the source/drain structures 178-1, 178-2, and 178-3 may be the epitaxially grown SiGe doped with boron (B). For example, the source/drain structures 178-1, 178-2, and 178-3 may be the epitaxially grown Si doped with carbon to form silicon: carbon (Si: C) source/drain features, phosphorous to form silicon: phosphor (Si: P) source/drain features, or both carbon and phosphorous to form silicon carbon phosphor (SiCP) source/drain features. In some embodiments, the source/drain structures 178-1, 178-2, and 178-3 are doped in one or more implantation processes after the epitaxial growth process.

After the source/drain structures 178-1, 178-2, and 178-3 are formed, a contact etch stop layer (CESL) 180 is conformally formed to cover the source/drain structures 178-1, 178-2, and 178-3 and an interlayer dielectric (ILD) layer 182 is formed over the contact etch stop layers 180, as shown in FIGS. 2O, 2O-1, and 2O-2 in accordance with some embodiments. In some embodiments, the contact etch stop layer 180 has tip portions extending into the spaces between the second dielectric fin structures 134 and the source/drain structures 178-1, 178-2, and 178-3, as shown in FIG. 2O-1. In some embodiments, the contact etch stop layer 180 partially covers and is in direct contact with the sidewalls of the second dielectric shell layers 128 of the second dielectric fin structure 134.

In some embodiments, the contact etch stop layer 180 is made of a dielectric materials, such as silicon nitride, silicon oxide, silicon oxynitride, another suitable dielectric material, or a combination thereof. The dielectric material for the contact etch stop layers 180 may be conformally deposited over the semiconductor structure by performing CVD, ALD, other application methods, or a combination thereof.

The interlayer dielectric layer 182 may include multilayers made of multiple dielectric materials, such as silicon oxide, silicon nitride, silicon oxynitride, phosphosilicate glass (PSG), borophosphosilicate glass (BPSG), or other applicable low-k dielectric materials. The interlayer dielectric layer 182 may be formed by chemical vapor deposition (CVD), physical vapor deposition, (PVD), atomic layer deposition (ALD), or other applicable processes.

After the contact etch stop layer 180 and the interlayer dielectric layer 182 are deposited, a planarization process such as CMP or an etch-back process is performed until the dummy gate electrode layer 150 are exposed, as shown in FIGS. 2O and 2O-2 in accordance with some embodiments.

Figure 2P:
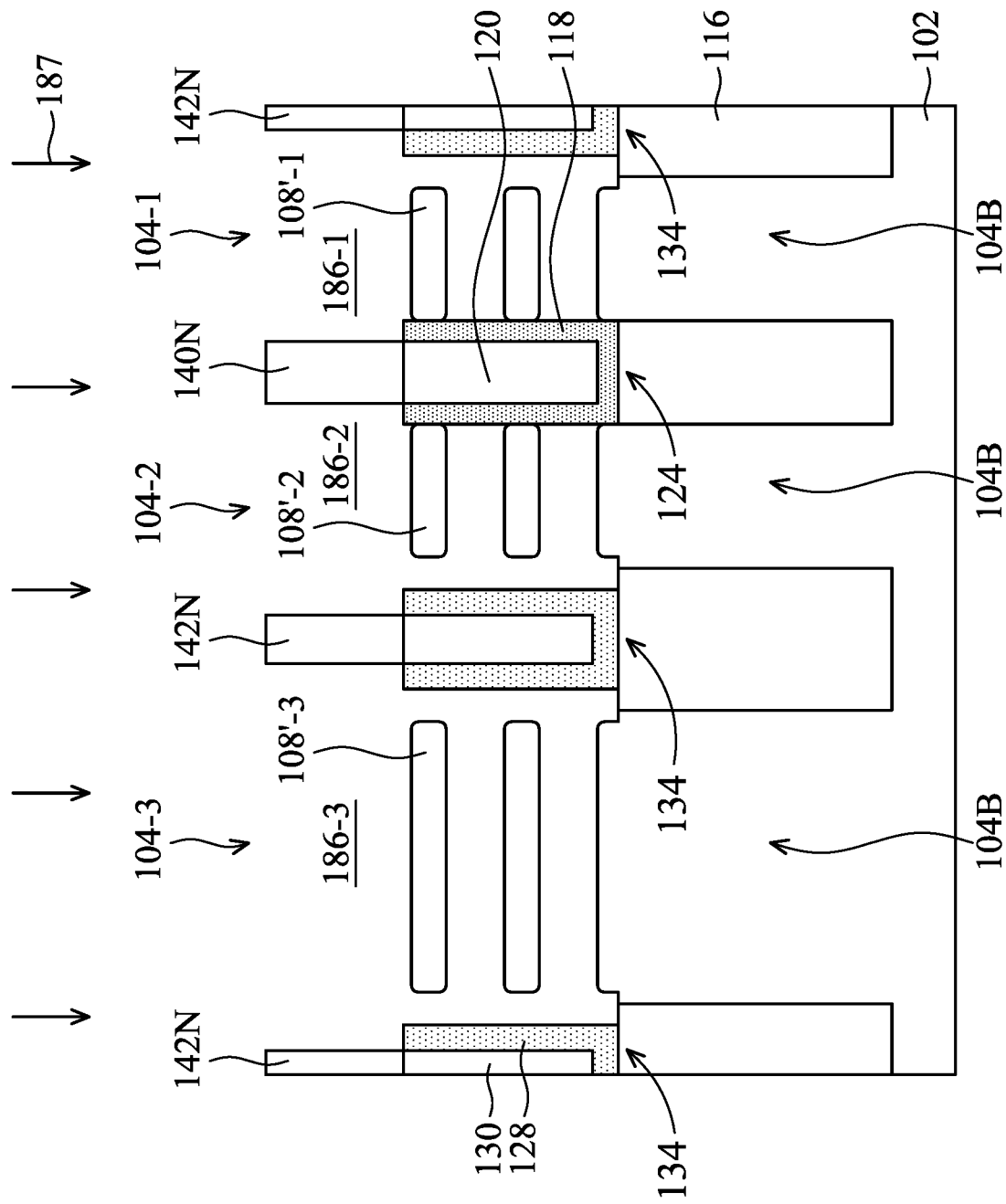

Next, the dummy gate structures 146, the cladding layers 126, and the first semiconductor material layers 106 are removed to form gate trenches 186-1, 186-2, and 186-3, as shown in FIG. 2P in accordance with some embodiments. More specifically, the dummy gate structures 146, the cladding layers 126, and the first semiconductor material layers 106 are removed to form channel structures (e.g. nanostructures) 108'-1, 108'-2, and 108'-3 with the second semiconductor material layers 108 of the fin structures 104-1, 104-2, and 104-3 respectively in accordance with some embodiments. In some embodiments, the channel structures 108'-1, 108'-2, and 108'-3 and the base fin structure 104B have rounded corners.

The removal process may include one or more etching processes. For example, when the dummy gate electrode layers 150 may be made of polysilicon, a wet etchant such as a tetramethylammonium hydroxide (TMAH) solution may be used to selectively remove the dummy gate electrode layers 150. Afterwards, the dummy gate dielectric layers 148 may be removed using a plasma dry etching, a dry chemical etching, and/or a wet etching. The first semiconductor material layers 106 and the cladding layers 126 may be removed by performing a selective wet etching process, such as APM (e.g., ammonia hydroxide-hydrogen peroxide-water mixture) etching process. For example, the wet etching process uses etchants such as ammonium hydroxide ($NH_4OH$), TMAH, ethylenediamine pyrocatechol (EDP), and/or potassium hydroxide (KOH) solutions.

Afterwards, the first dielectric cap layer 140 and the second dielectric cap layers 142 are partially removed to form narrowed first dielectric cap layer 140N and narrowed second dielectric cap layers 142N in the channel regions, as shown in FIG. 2P in accordance with some embodiments. The first dielectric cap layer 140 and the second dielectric cap layers 142 may be partially removed by performing a trimming process 187. The trimming process 187 may be an etching process, such as a dry etching process or a wet etching process. In some embodiments, the upper portions of the first dielectric cap layer 140 and the second dielectric cap layers 142 are also partially removed during the trimming process 187. In some embodiments, the sidewall of the narrowed first dielectric cap layer 140N and the narrowed second dielectric cap layers 142N are substantially aligned with the sidewalls of the first core portion 120 and the second core portions 130.

Figure 2Q:
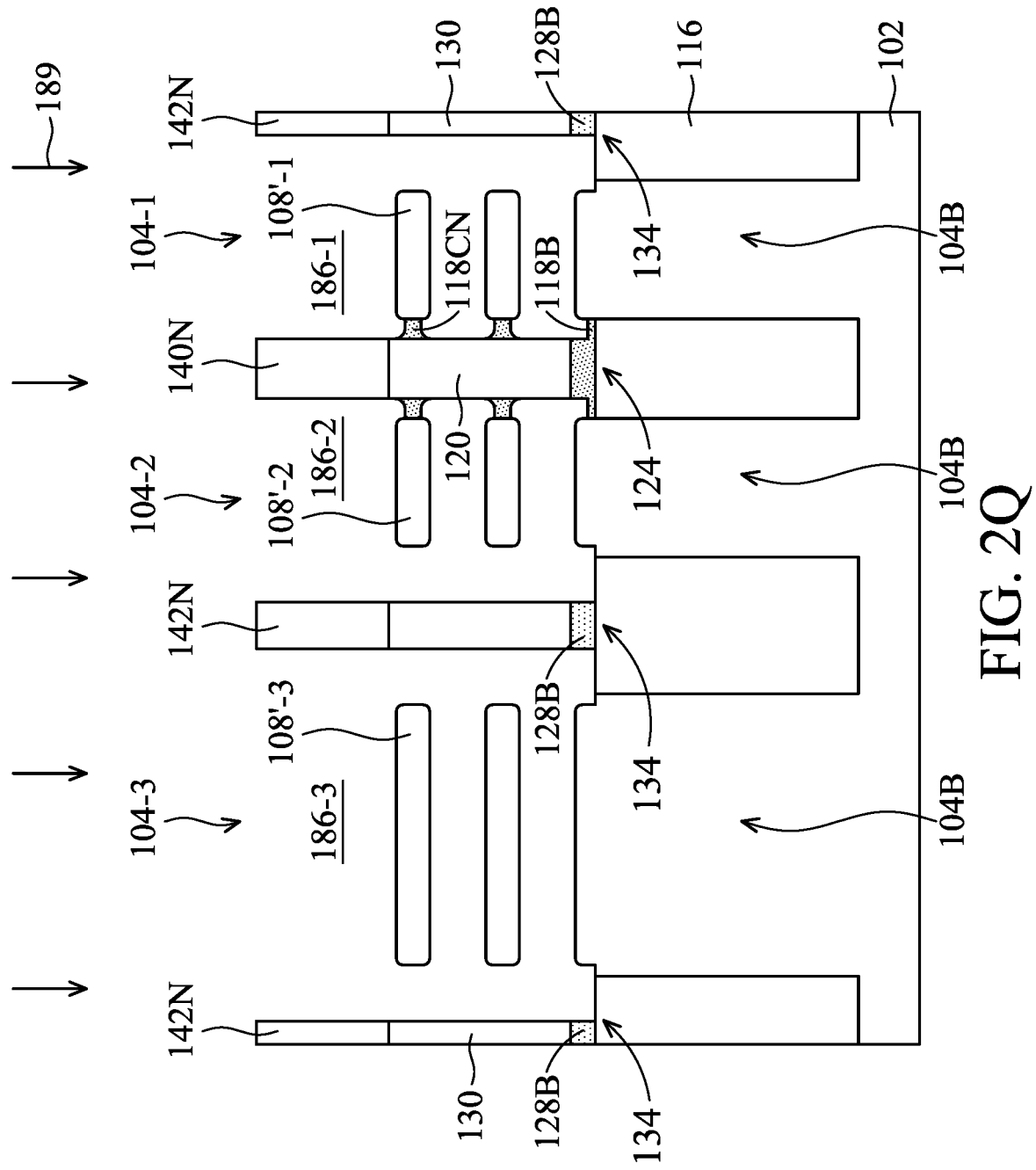

Next, the first dielectric shell layer 118 and the second dielectric shell layers 128 are also partially removed by performing a trimming process 189, as shown in FIG. 2Q in accordance with some embodiments. The trimming process 189 may be an etching process, such as a dry etching process or a wet etching process. More specifically, the second dielectric shell layer 128 exposed by the trenches 186-1, 186-2, and 186-3 are removed to exposed the second core portions 130 in accordance with some embodiments. Meanwhile, the second dielectric shell layers 128 located under the second core portions 130 form second base portions 128B under the second core portions 130 in accordance with some embodiments.

On the other hand, since some portions of the first dielectric shell layer 118 is in contact with the channel structures 108'-1 and 108'-2, the sidewalls of the first dielectric shell layer 118 are partially exposed by the trenches 186-1 and 186-2 and partially covered by the channel structures 108'-1 and 108'-2, as shown in FIG. 2P in accordance with some embodiments. Therefore, after the trimming process 189 is performed, connecting portions 118CN and a first base portion 118B are formed of the first dielectric shell layer 118, as shown in FIG. 2Q in accordance with some embodiments.

In some embodiments, the connecting portions 118CN have sidewalls curved inwardly. In some embodiments, each of the connecting portions 118CN is thicker at the sidewall in contact with the first core portion 120 of the first dielectric fin structure 124 and is thinner at the sidewall in contact with the channel structures 108'-1 or 108'-2. That is, the interface between one of the connecting portions 118CN and the first core portion 120 is larger than the interface between the one of the connecting portions 118CN and the connected channel structure 108'-1 or 108'-2. In some embodiments, the first base portion 118B is sandwiched between the first core portion 120 and the isolation structure 116. In addition, the bottom portion of the first base portion 118B is wider than the top portion of the first base portion 118B in accordance with some embodiments. In some embodiments, the top surface of the first base portion 118B has a width substantially equal to the width of the first core portion 120. In some embodiments, the bottom surface of the first base portion 118B has a width substantially equal to the distance between the base fin structure 104B of the fin structures 104-1 and 104-2.

In some embodiments, the width of each of the connecting portions 118CN is greater than about 4 nm. The connecting portions 118CN formed between the first core portion 120 and the channel structures 108'-1 and 108'-2 provide enough distance therebetween, so that the channel structures 108'-1 and 108'-2 will not be oxidized during thermal processes performed during the manufacturing of the semiconductor structure 100.

In some embodiments, the first core portion 120 has a width greater than about 7 nm. In some embodiments, the second core portion 130 has a width greater than about 7 nm. The first core portion 120 and the second core portion 130 should be wide enough so seams will not be formed therein.

Figure 2R:
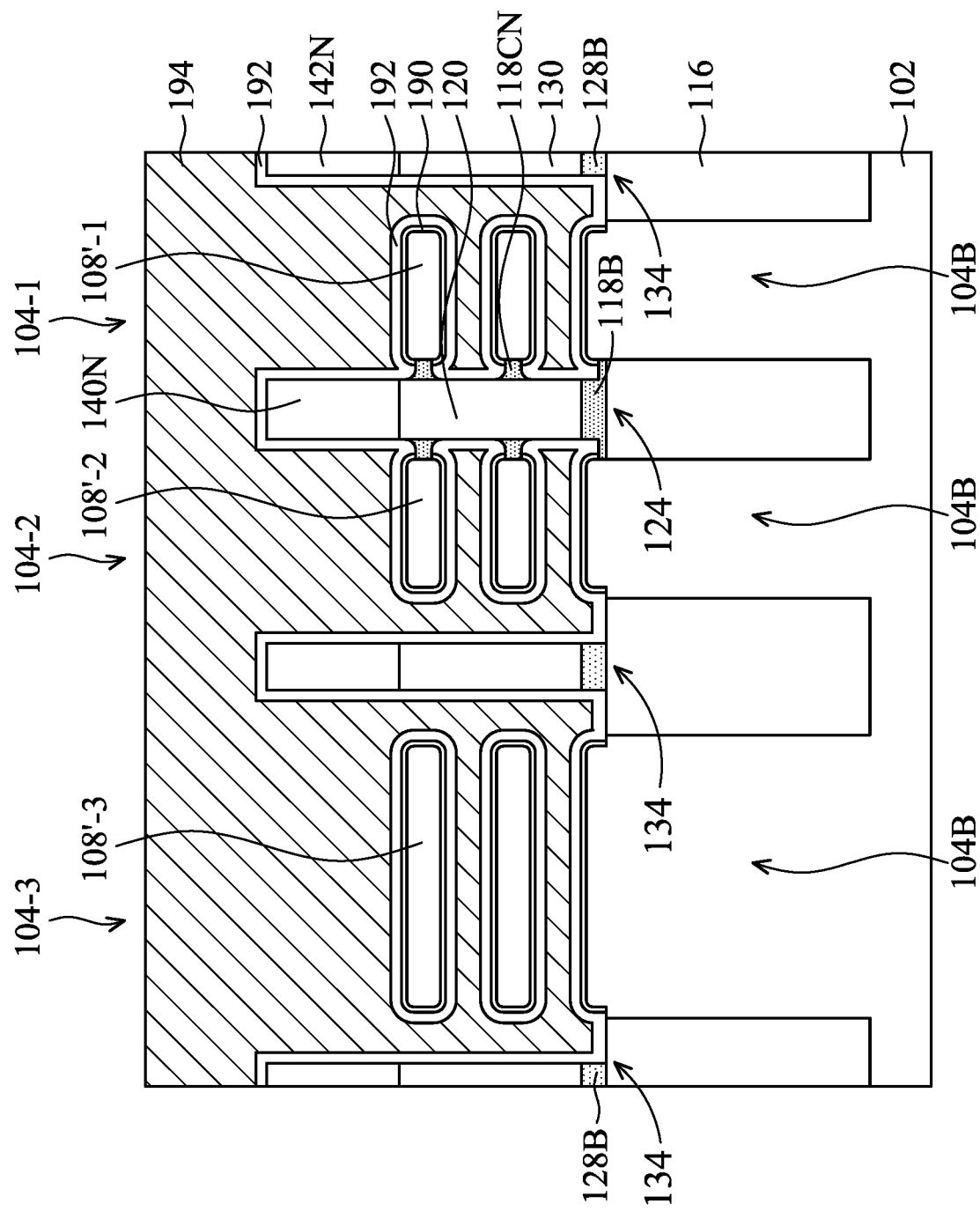

Next, gate structures 188 are formed in the trenches 186-1, 186-2, and 186-3, as shown in FIG. 2R in accordance with some embodiments. In some embodiments, each of the gate structures 188 includes an interfacial layer 190, a gate dielectric layer 192, and a gate electrode layer 194.

In some embodiments, the interfacial layers 190 are formed around the channel structures 108'-1, 108'-2, and 108'-3 and on the exposed portions of the base fin structures 104B. In addition, the interfacial layers 190 are in contact with the connecting portions 118CN and the first base portion 118B of the first dielectric fin structure 124 in accordance with some embodiments. In some embodiments, the interfacial layers 190 are oxide layers formed by performing a thermal process.

In some embodiments, the gate dielectric layer 192 is conformally formed over the trenches 186-1, 186-2, and 186-3. In some embodiments, the gate dielectric layer 192 is in contact with the narrowed first dielectric cap layer 140N, the first core portion 120, the connecting portions 118CN, and the first base portion 118B of the first dielectric fin structure 124. In some embodiments, the gate dielectric layer 192 is also in contact with the narrowed second dielectric cap layers 142N, the second core portions 130, and the second base portions 128B of the second dielectric fin structures 134 in accordance with some embodiments.

In some embodiments, the gate dielectric layer 192 is formed over the interfacial layer 190, so that the channel structures 108'-1, 108'-2, and 108'-3 are surrounded by the gate dielectric layer 192. In some embodiments, the gate dielectric layers 192 are made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other applicable high-k dielectric materials, or a combination thereof. In some embodiments, the gate dielectric layers 192 are formed using CVD, ALD, other applicable methods, or a combination thereof.

In some embodiments, the gate electrode layer 194 is formed over the gate dielectric layers 192. In some embodiments, the gate electrode layer 194 is made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layer 194 is formed using CVD, ALD, electroplating, another applicable method, or a combination thereof. Other conductive layers, such as work function metal layers, may also be formed in the gate structures 188, although they are not shown in the figures. After the interfacial layers 190, the gate dielectric layer 192, and the gate electrode layer 194 are formed, a planarization process such as CMP may be performed until the interlayer dielectric layer 182 is exposed.

Figure 2S:
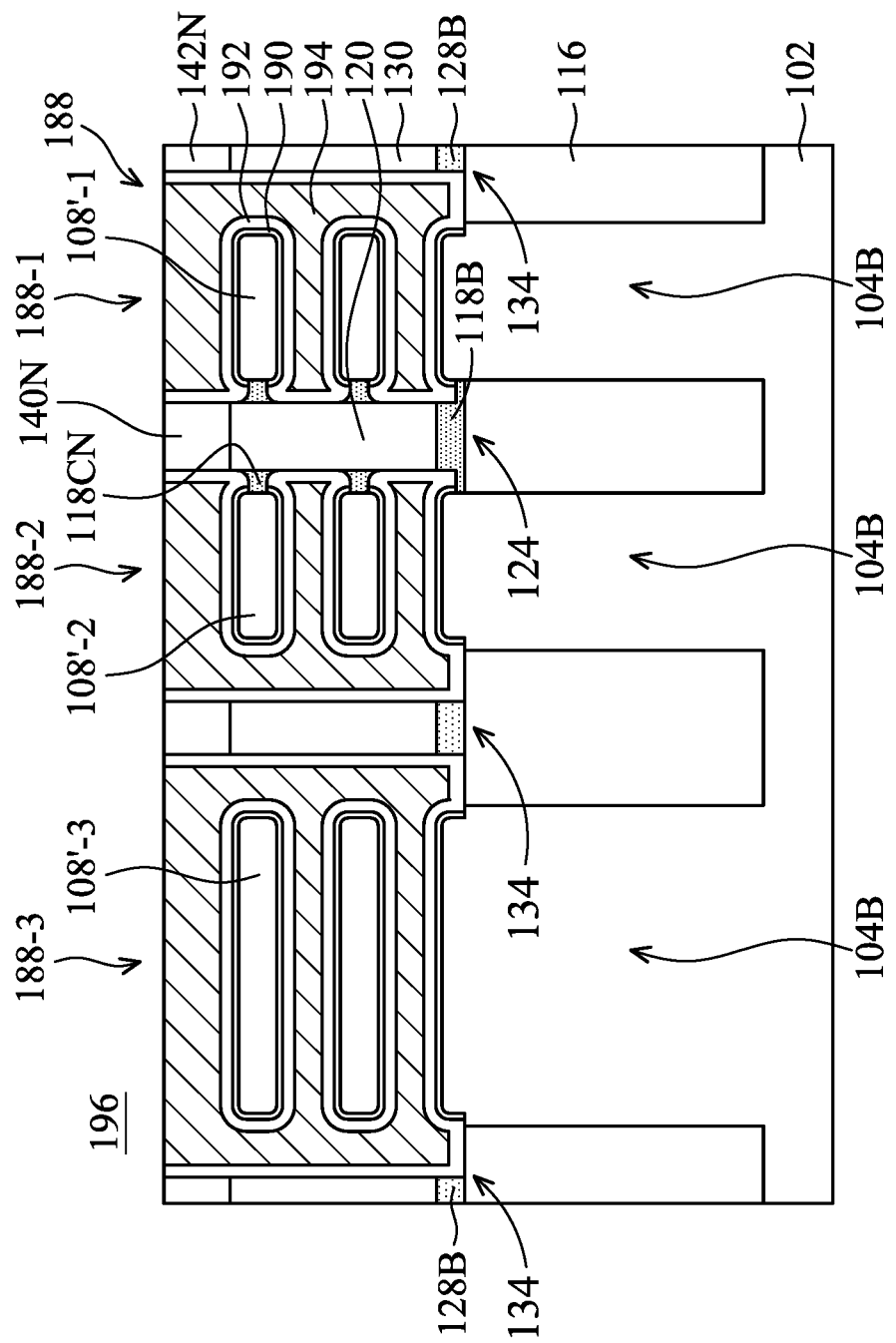

Next, an etch back process is performed to remove the upper portions of the gate structures 188, the upper portion of the narrowed first dielectric cap layer 140N of the first dielectric fin structure 124, and the upper portions of the narrowed second dielectric cap layers 142N of the second dielectric fin structures 134 at the channel region, as shown in FIG. 2S in accordance with some embodiments. More specifically, the upper portions of the gate structures 188, the narrowed first dielectric cap layer 140N, and the narrowed second dielectric cap layers 142N are removed to form recesses 196 between the gate spacers 158 in accordance with some embodiments. In some embodiments, the top surfaces of the gate structures 188 are substantially level with the top surfaces of the first dielectric fin structure 124 and the second dielectric fin structures 134 at the channel regions. Accordingly, the gate structure 188 is divided into portions 188-1, 188-2, and 188-3 by the first dielectric fin structure 124 and the second dielectric fin structures 134, as shown in FIG. 2S in accordance with some embodiments.

In some embodiments, the thicknesses of the narrowed first dielectric cap layer 140N and the narrowed second dielectric cap layers 142N are in a range from about 10 nm to about 20 nm. The thicknesses of the narrowed first dielectric cap layer 140N and the narrowed second dielectric cap layers 142N may determine the thickness of the portion of the gate structure 188 remaining over the topmost channel structures 108'-1, 108'-2, and 108'-3. The portions of the gate structure 188 over the topmost channel structures 108'-1, 108'-2, and 108'-3 should be thick enough, or the Vt of the resulting device may be affected. On the other hand, portions of the gate structure 188 over the topmost channel structures 108'-1, 108'-2, and 108'-3 should not be too thick, or the capacitance of the resulting device may be increased.

Figure 2T:
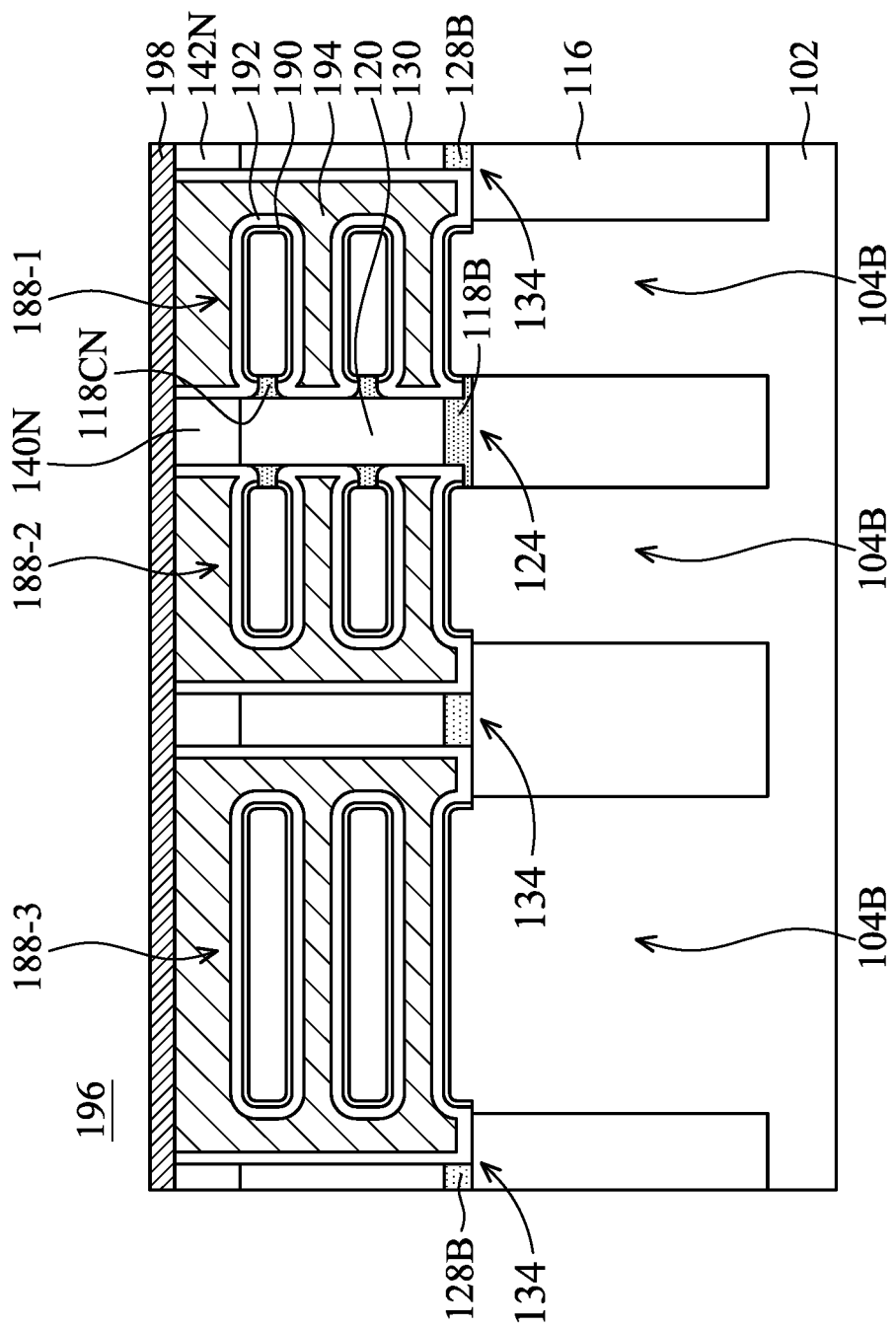

Afterwards, a metal layer 198 is formed over the gate structure 188, the first dielectric fin structure 124, and the second dielectric fin structures 134, as shown in FIG. 2T in accordance with some embodiments. The metal layer 198 may be configured to electrically connect various portions of the gate structure 188 divided by the first dielectric fin structure 124 and the second dielectric fin structures 134. In some embodiments, the metal layer 198 is made of Ru, W, TiN, TaN, Co, Ti, TiAl, or the like.

In some embodiments, the metal layer 198 has a thickness in a range from about 2 nm to about 10 nm. The metal layer 198 should be thick enough, or it may be broken in subsequent manufacturing processes and the connection between different portions of the gate structure 188 may be affected. On the other hand, the metal layer 198 should not be too thick, or the capacitance of the resulting device may be increased and the speed of the resulting device may be reduced.

Figure 2U:
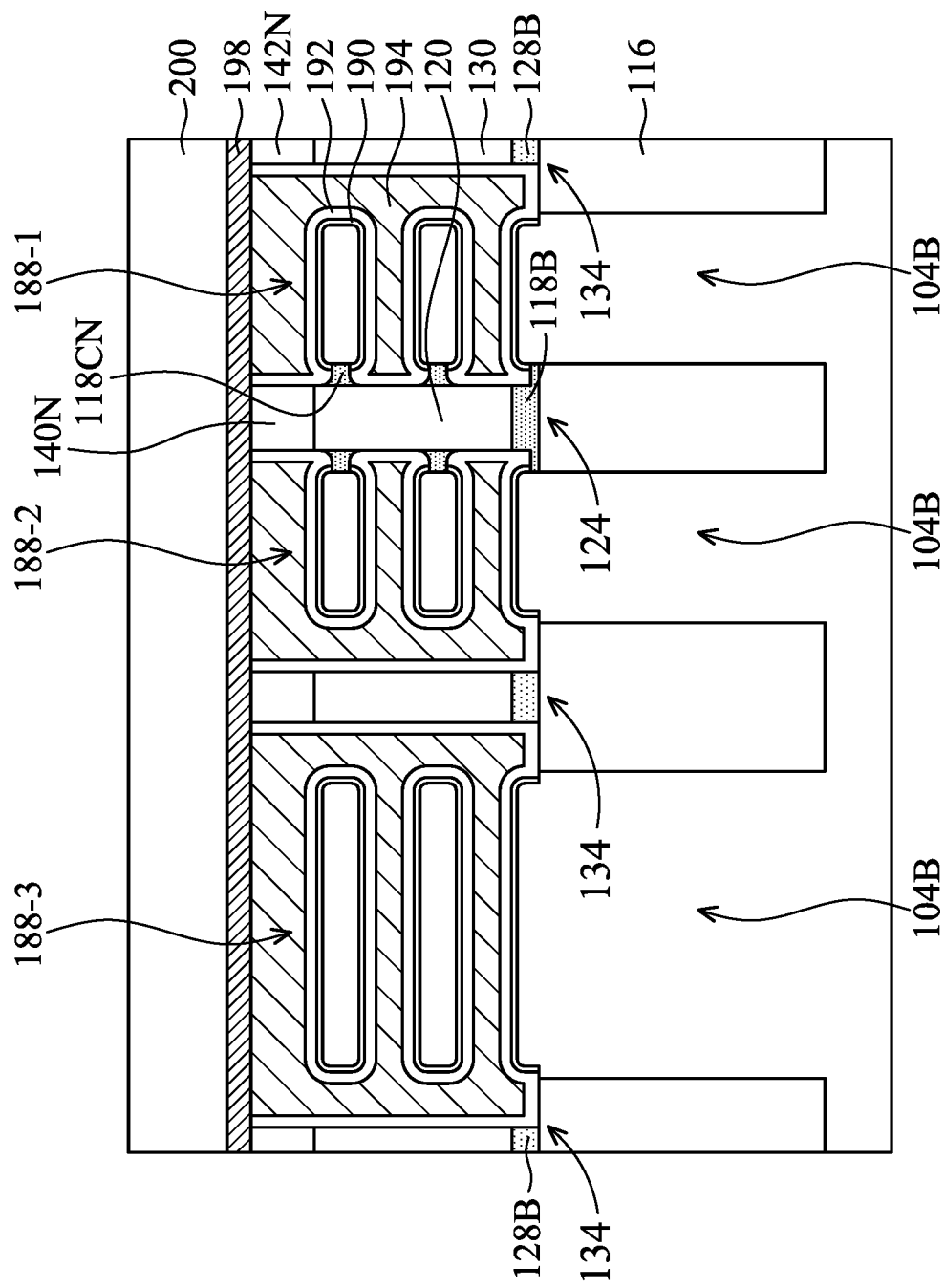

After the metal layer 198 is formed, a dielectric layer 200 is formed over the metal layer 198 in the recess 196, as shown in FIG. 2U in accordance with some embodiments. The dielectric layer 200 may be a single layer or multilayers made of multiple dielectric materials, such as $Al_2O_3$, $ZrO_2$, silicon oxide, silicon nitride, silicon oxynitride, phosphosilicate glass (PSG), borophosphosilicate glass (BPSG), or other applicable dielectric materials. The dielectric layer 200 may be formed by chemical vapor deposition (CVD), physical vapor deposition, (PVD), atomic layer deposition (ALD), or other applicable processes.

Figure 2V:
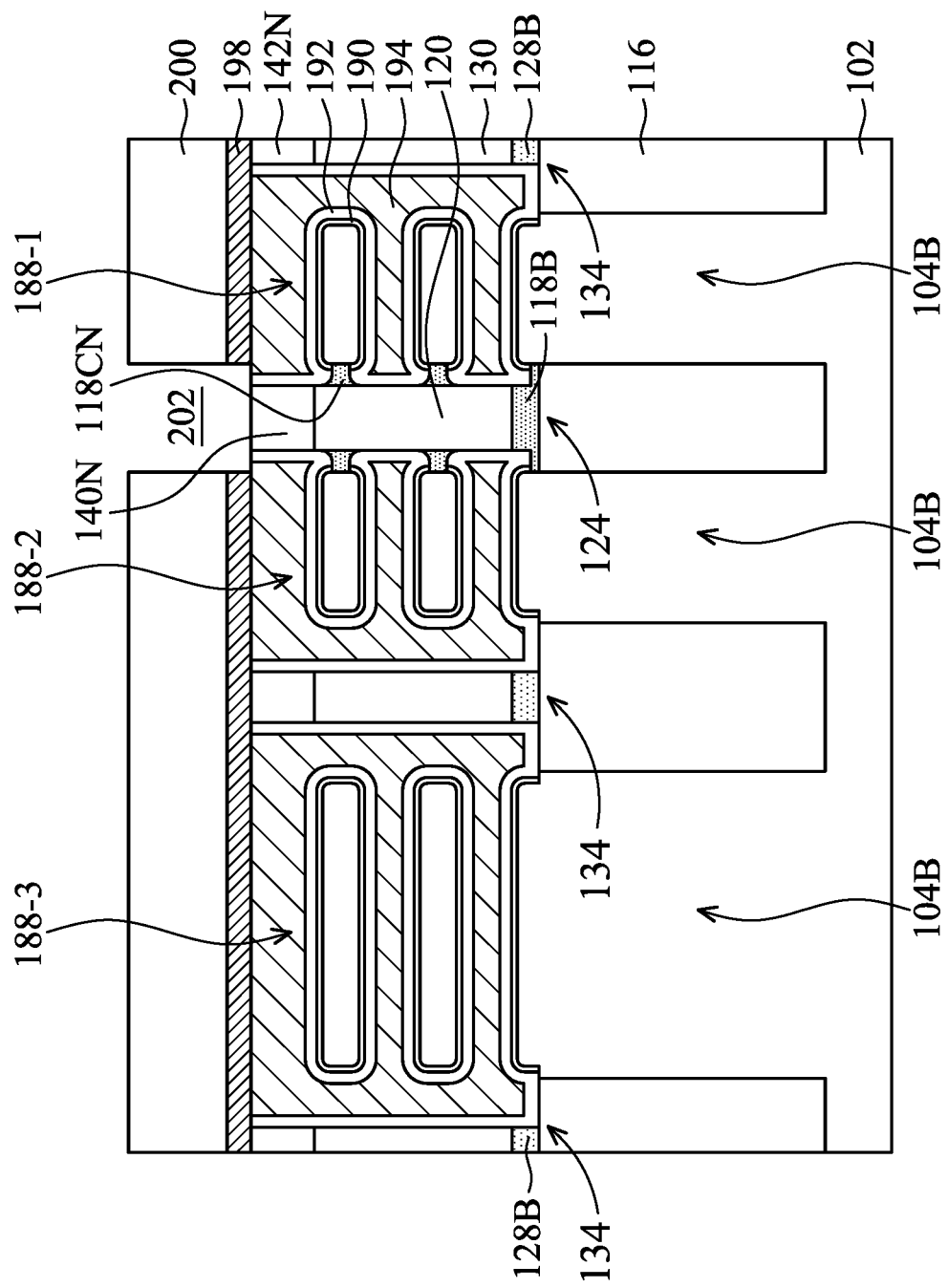
Figure 2W:
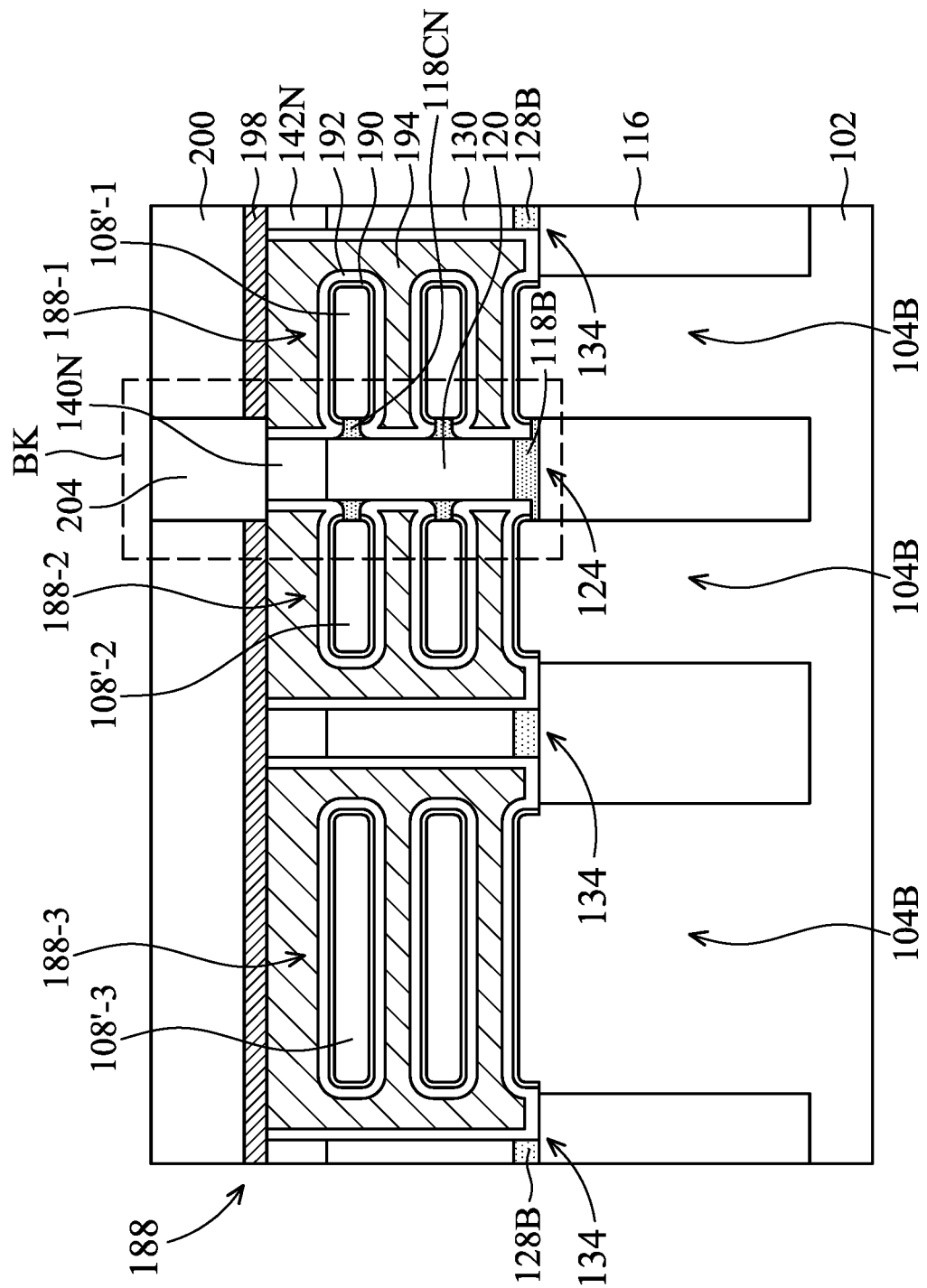
Figures 1, 2W:
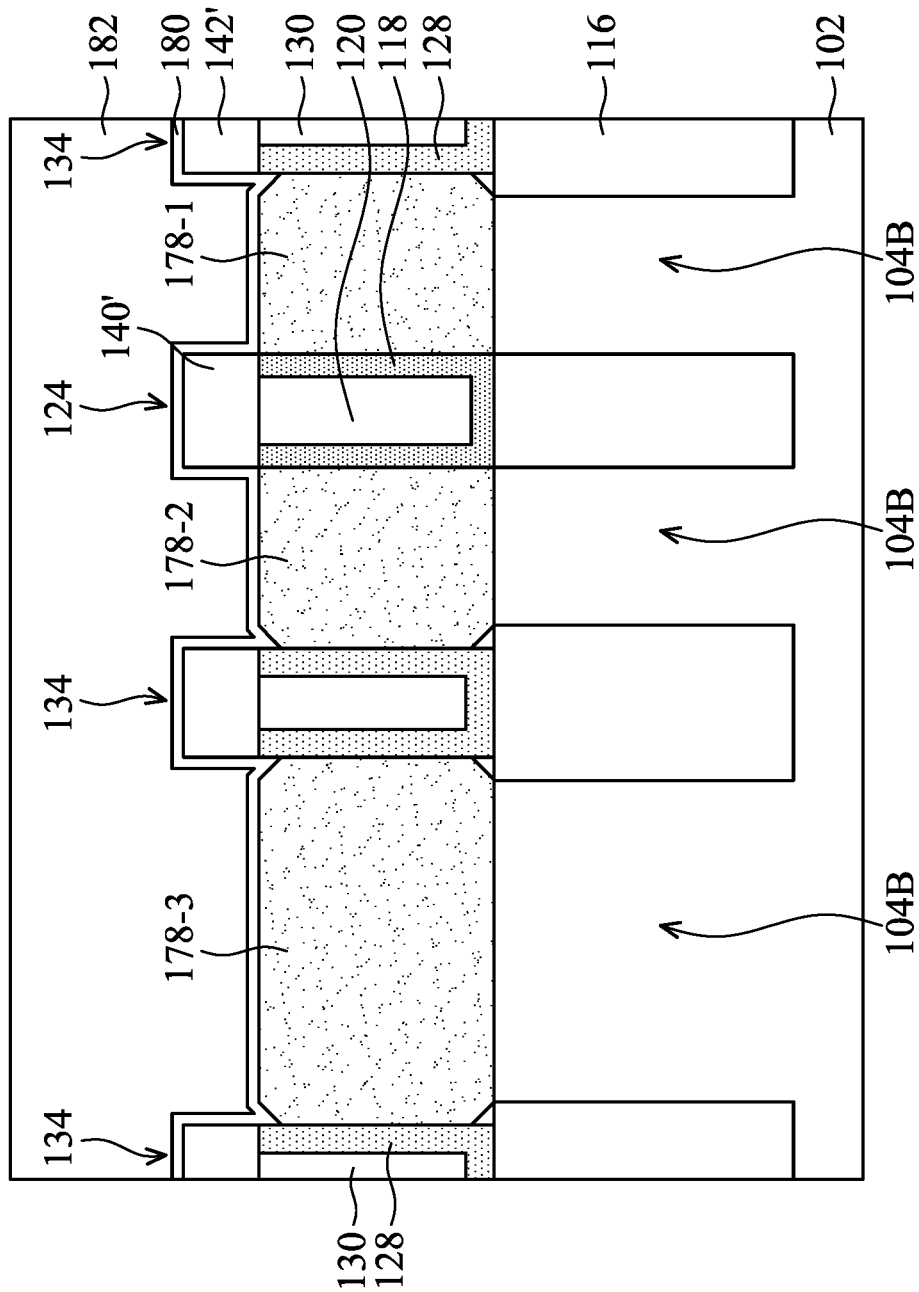
Figures 2, 2W:
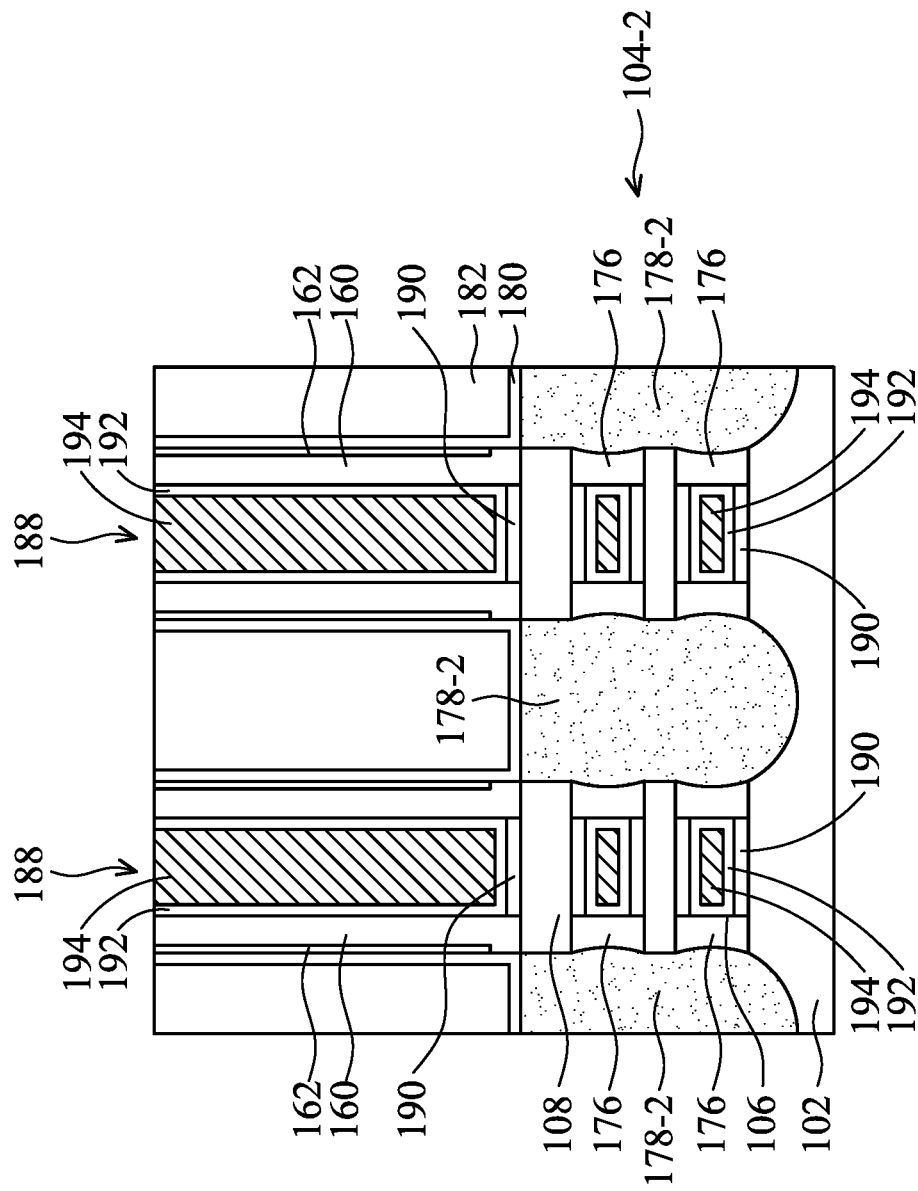
Figures 2, 2W, 3:
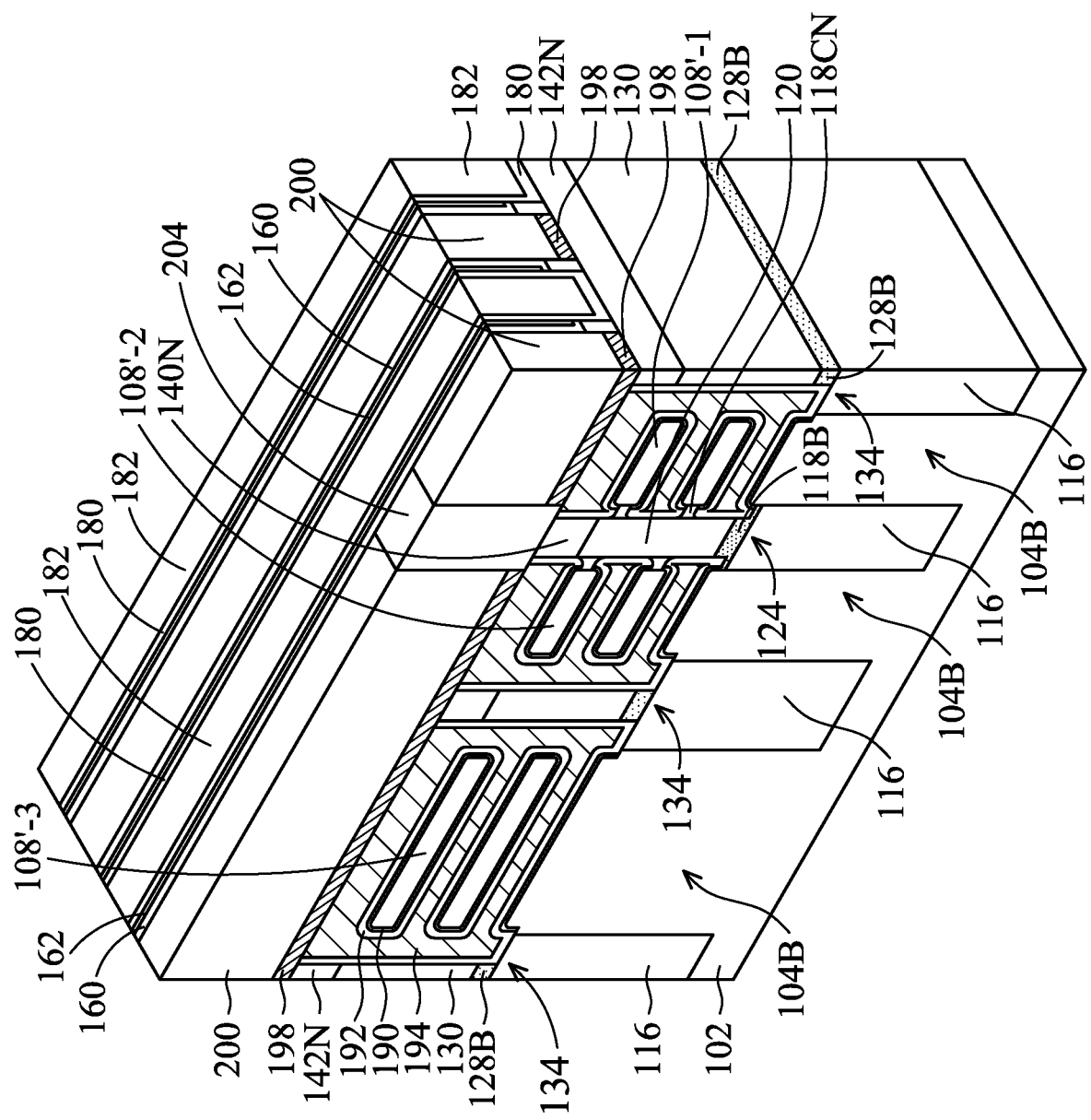
Figures 2, 2W, 3, 4:
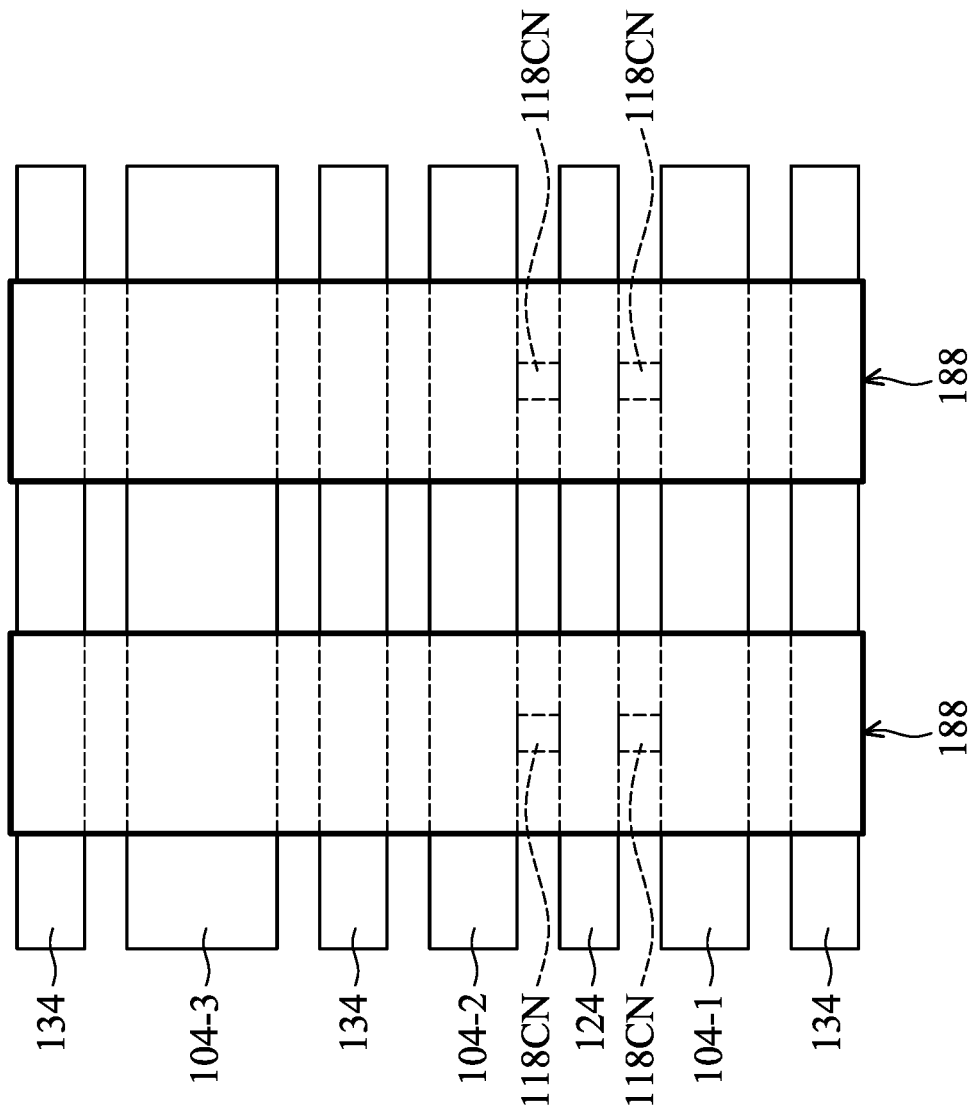
Figures 2, 2W, 3, 4, 5:
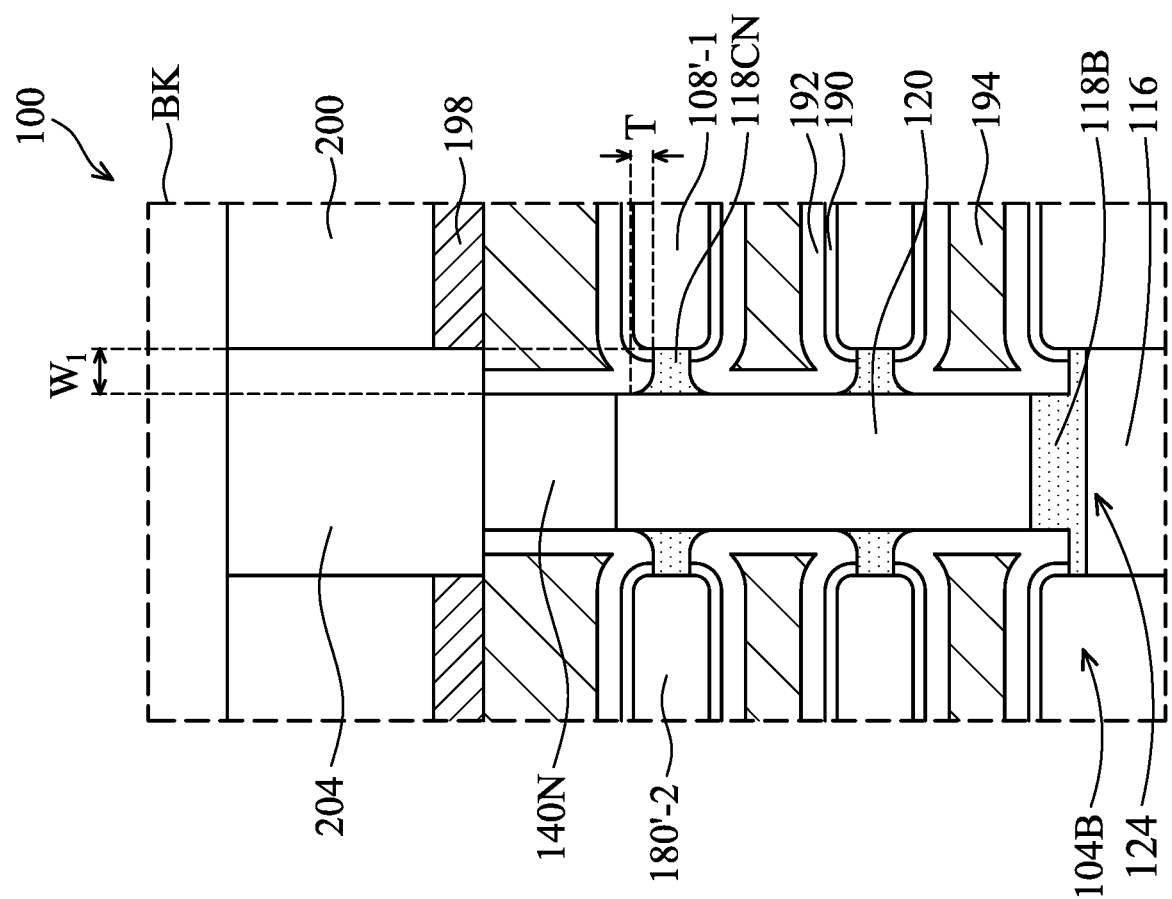

After the dielectric layer 200 is formed, an opening 202 is formed through the dielectric layer 200 and the metal layer 198, as shown in FIG. 2V in accordance with some embodiments. More specifically, a photoresist structure may be formed over the dielectric layer 200, and the photoresist structure may be patterned to form an opening exposing the dielectric layer 200. The dielectric layer 200 and the metal layer 198 may then be patterned through the opening of the photoresist structure to form the opening 202. In some embodiments, the opening 202 exposes the top surface of the first dielectric fin structure 124. In addition, the gate structure 188 is also partially exposed by the opening 202 in accordance with some embodiments.

Afterwards, an isolation feature 204 is formed in the opening 202, as shown in FIGS. 2W, 2 W-1, 2W-2, 2W-3, 2W-4, and 2W-5 in accordance with some embodiments. FIGS. 2W-1 and 2W-2 illustrate two other cross-sectional views of the intermediate stages of manufacturing the semiconductor structure 100 at the stage of forming the semiconductor structure shown in FIG. 2W in accordance with some embodiments. FIG. 2W-3 illustrates a diagrammatic perspective view of the semiconductor structure 100 in accordance with some embodiments. FIG. 2W-4 illustrates a top view of the semiconductor structure 100 in accordance with some embodiments. FIG. 2W-5 illustrates an enlarged cross-sectional view of the semiconductor structure 100 in the block BK shown in FIG. 2W in accordance with some embodiments.

The isolation feature 204 is configured to separate the metal layer 198 into electrically isolated portions. In some embodiments, the isolation feature 204 is in direct contact with the top surface of the narrowed first dielectric cap layer 140N of the first dielectric fin structure 124. In some embodiments, the isolation feature 204 is further in direct contact with the top surface of the gate structure 188.

In some embodiments, the isolation feature 204 is formed by forming a dielectric material in the opening 202 and over the dielectric layer 200, and the dielectric material is polished until the top surface of the interlayer dielectric layer 182 is exposed. In some embodiments, the isolation feature 204 and the dielectric layer 200 are made of the same material. In some other embodiments, the isolation feature 204 and the dielectric layer 200 are made of different dielectric materials. In some embodiments, the dielectric material for forming the isolation feature 204 includes $Al_2O_3$, $ZrO_2$, silicon oxide, silicon nitride, silicon oxynitride, phosphosilicate glass (PSG), borophosphosilicate glass (BPSG), or other applicable dielectric materials. The dielectric material may be formed by chemical vapor deposition (CVD), physical vapor deposition, (PVD), atomic layer deposition (ALD), or other applicable processes.

As shown in FIG. 2W, the gate structure 188 is divided into portions 188-1, 188-2, and 188-3 by the first dielectric fin structure 124 and the second dielectric fin structures 134 in accordance with some embodiments. The portion 188-1 of the gate structure 188 is formed around the channel structures 108'-1 and is sandwiched between the first dielectric fin structure 124 and one of the second dielectric fin structures 134 in accordance with some embodiments. In addition, a portion of the metal layer 198 covers the top surface of the portion 188-1 of the gate structure 188 and extends onto the top surface of one of the second dielectric fin structures 134, as shown in FIG. 2W in accordance with some embodiments. Similarly, the portion 188-2 of the gate structure 188 is formed around the channel structures 108'-2 and is sandwiched between the first dielectric fin structure 124 and one of the second dielectric fin structures 134 in accordance with some embodiments. In some embodiments, the isolation feature 204 partially covers and in direct contact with the portions 188-1 and 188-2 of the gate structure 188.

In addition, the connecting portions 118CN of the first dielectric fin structure 124 are sandwiched between the first core portion 120 and the channel structures 108'-1 and 108'-2, such that the channel structures 108'-1 and 108'-2 are not completely wrapped by the portions 188-1 and 188-2 of the gate structure 188 in accordance with some embodiments. However, since the connecting portions 118CN are relatively thin, the control of the gate structure 188 will not be seriously affected. Meanwhile, the distance between the first dielectric fin structure 124 can be relatively small since the gate structure 188 does not need to be formed in the spaces between the first dielectric fin structure 124 and the channel structures 108'-1 and 108'-2. Accordingly, the size of the resulting device can be reduced. In some embodiments, each of the connecting portions 118CN has a lateral width W1 in a range from about 3 nm to about 5 nm, as shown in FIG. 2W-5.

In some embodiments, the thicknesses of the connecting portions 118CN change from one side to another. In some embodiments, each of the connecting portions 118CN is thicker at the side attached to the first core portion 120 and is thinner at the side attached to the channel structures 108'-1 and 108'-2. In some embodiments, the difference T between the thicknesses at two sides of the connecting portion 118CN is in a range from about 0.01 to about 2 nm. The short channel effect control may be improved by having enough thickness difference T. In some embodiments, the thickness of the connecting portion 118CN at the side attached to the channel structure 108'-1 or 108'-2 is thinner than the thicknesses of the channel structures 108'-1 and 108'-2. In some embodiments, the portions 188-1 and 188-2 surround and cover the connecting portions 118CN. In addition, some portions of the interfacial layers 190 and the gate dielectric layers 192 extend into the space between the first core portion 120 and the channel structures 108'-1 and 108'-2, as shown in FIG. 2W-5 in accordance with some embodiments.

The portion 188-3 of the gate structure 188 is formed around the channel structures 108'-3 and is sandwiched between two of the second dielectric fin structures 134 in accordance with some embodiments. In addition, since the second dielectric fin structures 134 are separated from the channel structures 108'-3, the channel structures 108'-3 are fully wrapped by the portion 188-3 of the gate structure 188 in accordance with some embodiments. In some embodiments, the distance between the channel structures 108'-1 and 108'-2 is smaller than the distance between the channel structures 108'-2 and 108'-3.

In some embodiments, the distance between the second core portion 130 and the channel structures 108'-3 is no smaller than about 9 nm. The distance between the second core portion 130 and the channel structures 108'-3 should not be too small, so the portion 188-3 of the gate structure 188 can be fully formed in the space between the second core portion 130 and the channel structures 108'-3. That is, the channel structures 108'-3 can be completely wrapped by the portion 188-3 of the gate structure 188.

In some embodiments, the metal layer 198 continuously extends over the portions 188-2 and 188-3 of the gate structure 188. That is, the portion 188-2 and 188-3 of the gate structure 188 are electrically connected through the metal layer 198 in accordance with some embodiments. On the other hand, since the isolation feature 204 is formed through the metal layer 198 over the first dielectric fin structure 124, the portion 188-1 is electrically disconnected from the portions 188-2 and 188-3 of the gate structure 188.

As described above, the first dielectric fin structure 124 and the second dielectric fin structures 134 are interposed into the gate structure 188 and separate the gate structure 188 into different portions 188-1, 188-2, and 188-3 in accordance with some embodiments. In addition, the separated portions 188-2 and 188-3 of the gate structure 188 are electrically connected again by the metal layer 198 formed afterwards in accordance with some embodiments. Therefore, the spaces between the channel structures 108'-3 and the second dielectric fin structures 134 can be reduced without increasing the risk of short-circuiting that can result from a misalignment during the manufacturing processes.

In some embodiments, the top surfaces of the first dielectric fin structure 124 and the second dielectric fin structures 134 at the channel region are substantially level with the top surface of the gate structure 188. In some embodiments, the first dielectric fin structure 124 and the second dielectric fin structures 134 at the source/drain region are shorter than those at the channel region, as shown in FIG. 2W-1 in accordance with some embodiments.

Figure 3A:
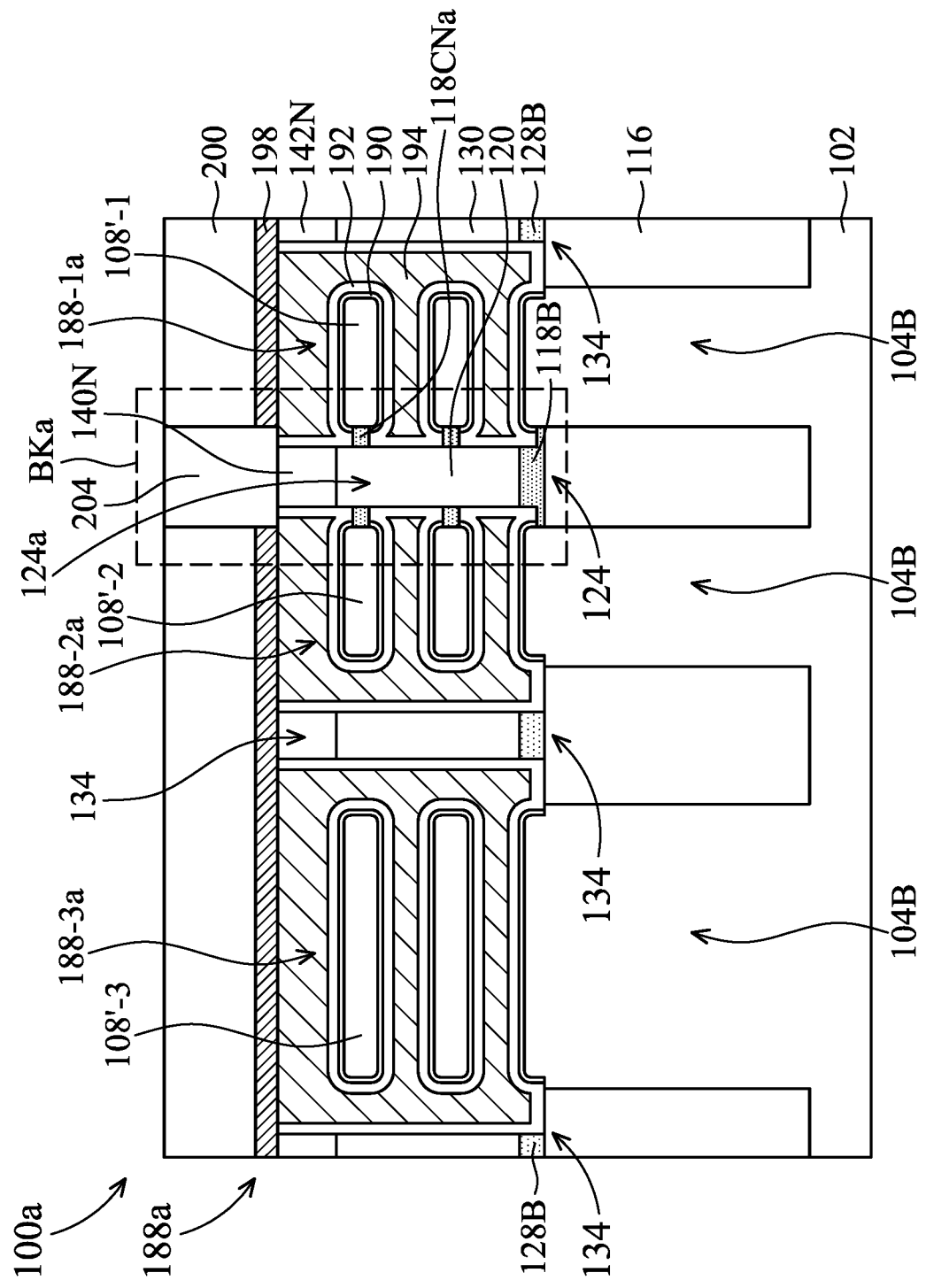
FIG. 3A illustrates a cross-sectional view of a semiconductor structure in accordance with some embodiments.
Figure 3B:
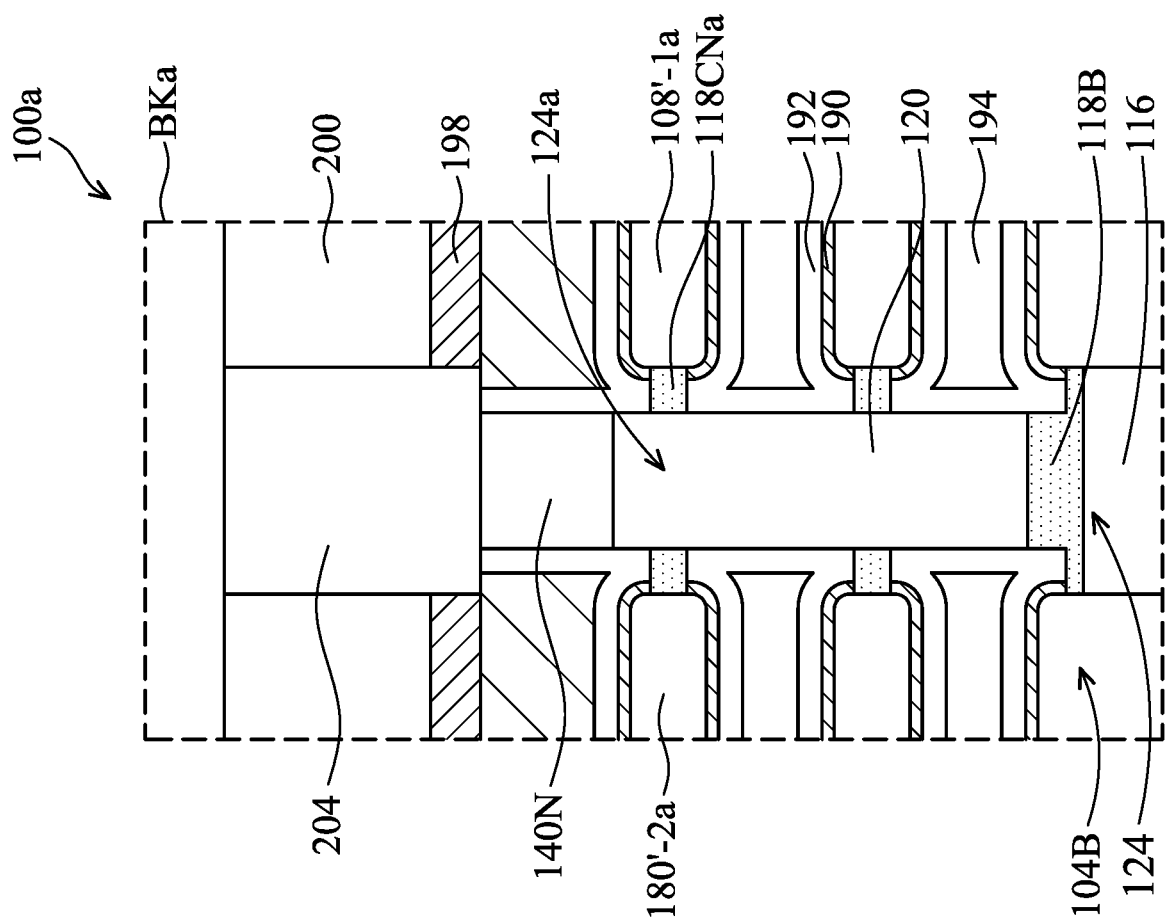
FIG. 3B illustrates an enlarged cross-sectional view of the semiconductor structure of a block BKa shown in FIG. 3A in accordance with some embodiments.

FIG. 3A illustrates a cross-sectional view of a semiconductor structure 100a in accordance with some embodiments. FIG. 3B illustrates an enlarged cross-sectional view of the semiconductor structure 100a in the block BKa shown in FIG. 3A in accordance with some embodiments. The semiconductor structure 100a may be similar to the semiconductor structure 100 described previously, except the shapes of the connecting portions of the first dielectric fin structure are different from those in the semiconductor structure 100 in accordance with some embodiments. Processes and materials for forming the semiconductor structure 100a may be similar to, or the same as, those for forming the semiconductor structure 100 described previously and are not repeated herein.

More specifically, the semiconductor structure 100a includes a gate structure 188a that is divided into portions 188-1a, 188-2a, and 188-3a by a first dielectric fin structure 124a and the second dielectric fin structures 134, as shown in FIG. 3A in accordance with some embodiments. The first dielectric fin structure 124a may be the same as the first dielectric fin structure 124, except the shapes of connecting portions 188CNa in the first dielectric fin structure 124a are different from those of the connecting portions 188CN in the semiconductor structure 100. In some embodiments, the first dielectric fin structure 124a includes the first core portion 120, the first base portion 118B, the narrowed first dielectric cap layer 140N, and the connecting portions 118CNa. As shown in FIG. 3B, the connecting portions 118CNa of the first dielectric fin structure 124a has a substantially flat top surface and a substantially flat bottom surface in accordance with some embodiments. In some embodiments, the thicknesses of the connecting portions 118CNa at the first core portion are substantially equal to the thicknesses of the connecting portions 118CNa at the channel structures 108'-1 and 108'-2. By having the thicknesses of the connecting portions 118CNa are substantially equal at two ends, the AC penalty of the resulting device may be improved.

The processes and materials for forming the gate structure 188a, including the portions 188-1a, 188-2a, and 188-3a, and the first dielectric fin structure 124a are similar to, or the same as, those for forming the gate structure 188, including the portions 188-1, 188-2, and 188-3, and the first dielectric fin structure 124 described previously and are not repeated herein.

Figure 4A:
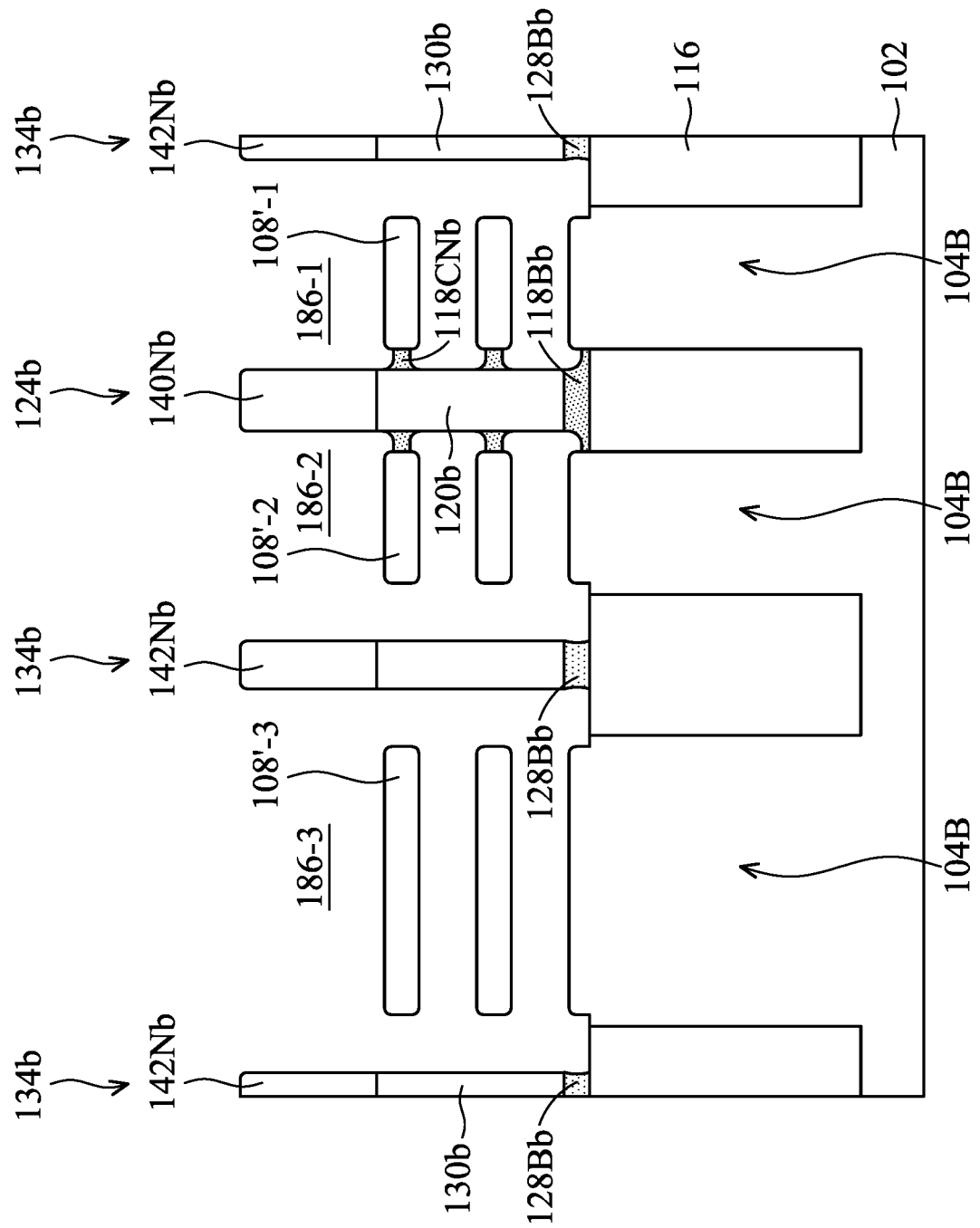
FIGS. 4A and 4B illustrate cross-sectional views of intermediate stages of manufacturing a semiconductor structure in accordance with some embodiments.
Figure 4B:
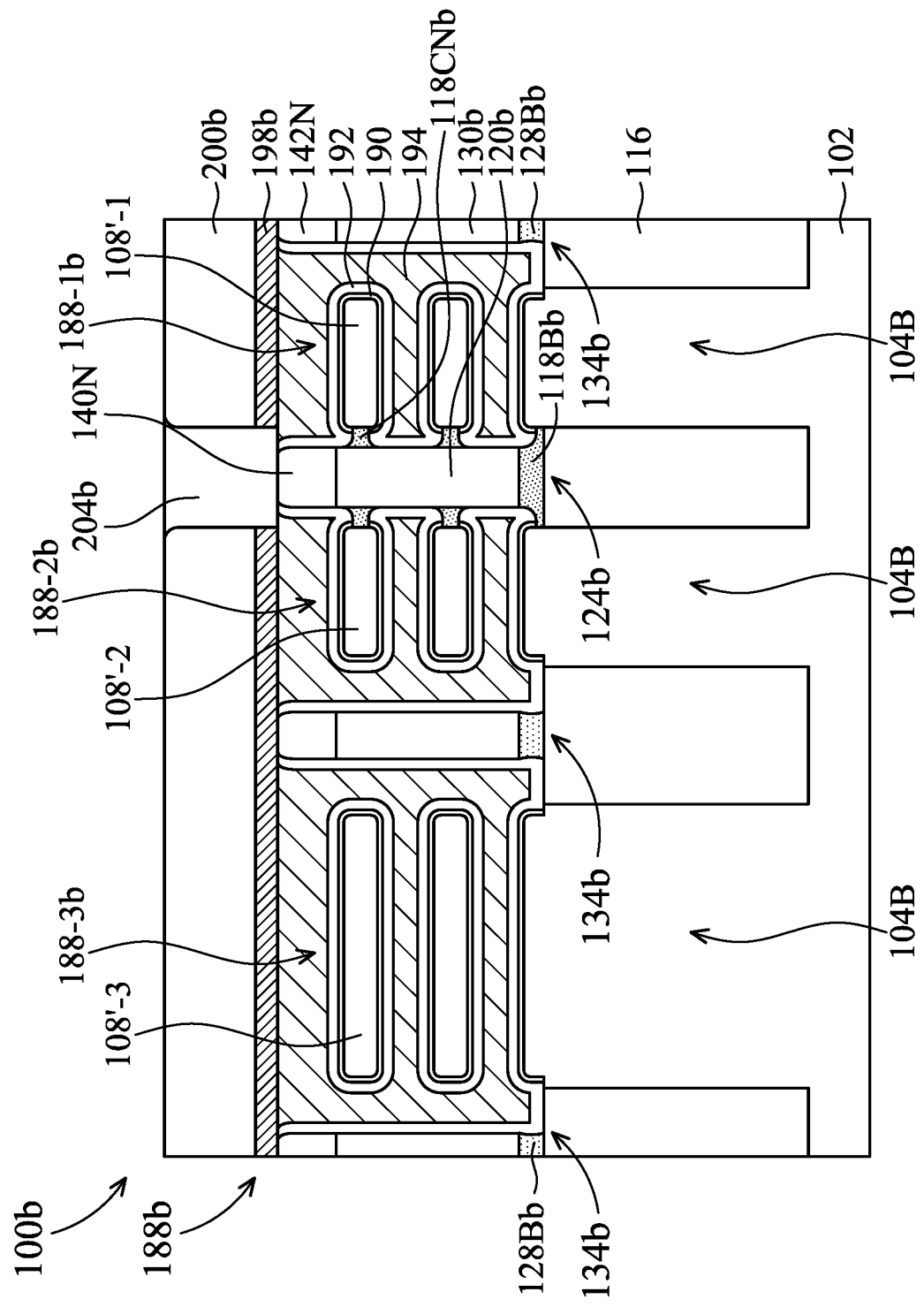

FIGS. 4A and 4B illustrate cross-sectional views of intermediate stages of manufacturing a semiconductor structure 100b in accordance with some embodiments. The semiconductor structure 100b may be similar to the semiconductor structure 100 described previously, except the first dielectric fin structure and the second dielectric fin structures have rounded corners in accordance with some embodiments. Processes and materials for forming the semiconductor structure 100b may be similar to, or the same as, those for forming the semiconductor structure 100 described previously and are not repeated herein.

More specifically, the processes shown in FIGS. 2A to 2P are performed, and a trimming process, similar to the trimming process 189, is performed to form a first dielectric fin structure 124b and second dielectric fin structures 134b with rounded corners, as shown in FIG. 4A in accordance with some embodiments. In some embodiments, the first dielectric fin structure 124b has a narrowed first dielectric cap layer 140Nb, a first core portion 120b, connecting portions 118CNb, and a first base portion 118Bb. In some embodiments, the narrowed first dielectric cap layer 140Nb has rounded top corners. In some embodiments, the first first base portion 118Bb has curved sidewall surfaces. Similarly, each of the second dielectric fin structures 134 includes a narrowed second dielectric cap layer 142Nb, a second core portion 130b, and a second base portion 128Bb in accordance with some embodiments. In some embodiments, the narrowed second dielectric cap layers 142Nb have rounded top corners. In some embodiments, the second base portions 128Bb have curved sidewalls.

Next, the processes shown in FIGS. 2R to 2W are performed to form the semiconductor structure 100b, as shown in FIG. 4B in accordance with some embodiments. More specifically, a gate structure 188b is formed around the channel structures 108'-1, 108'-2, and 108'-3 and covers the sidewalls of the first dielectric fin structure 124b and the second dielectric fin structures 134b in accordance with some embodiments. In addition, a metal layer 198b and a dielectric layer 200b are formed over the gate structure 188b, and an isolation feature 204b is formed in an opening (e.g. similar to the opening 202 shown in FIG. 2V) through the metal layer 198b and the dielectric layer 200b in accordance with some embodiments. In some embodiments, the dielectric layer 200b also have curved corners exposed by the opening, so that the dielectric layer 200b and the isolation feature 204b have curved interfaces. In some embodiments, the top surface of the isolation feature 204b is wider than the bottom surface of the isolation feature 204b.

The processes and materials for forming the gate structure 188b, including the portions 188-1b, 188-2b, and 188-3b, the first dielectric fin structure 124b, the second dielectric fin structures 134b, the metal layer 198b, the dielectric layer 200b, and the isolation feature 204b are similar to, or the same as, those for forming the gate structure 188, including the portions 188-1, 188-2, and 188-3, the first dielectric fin structure 124, the second dielectric fin structures 134, the metal layer 198, the dielectric layer 200, and the isolation feature 204 described previously and are not repeated herein.

Figure 5A:
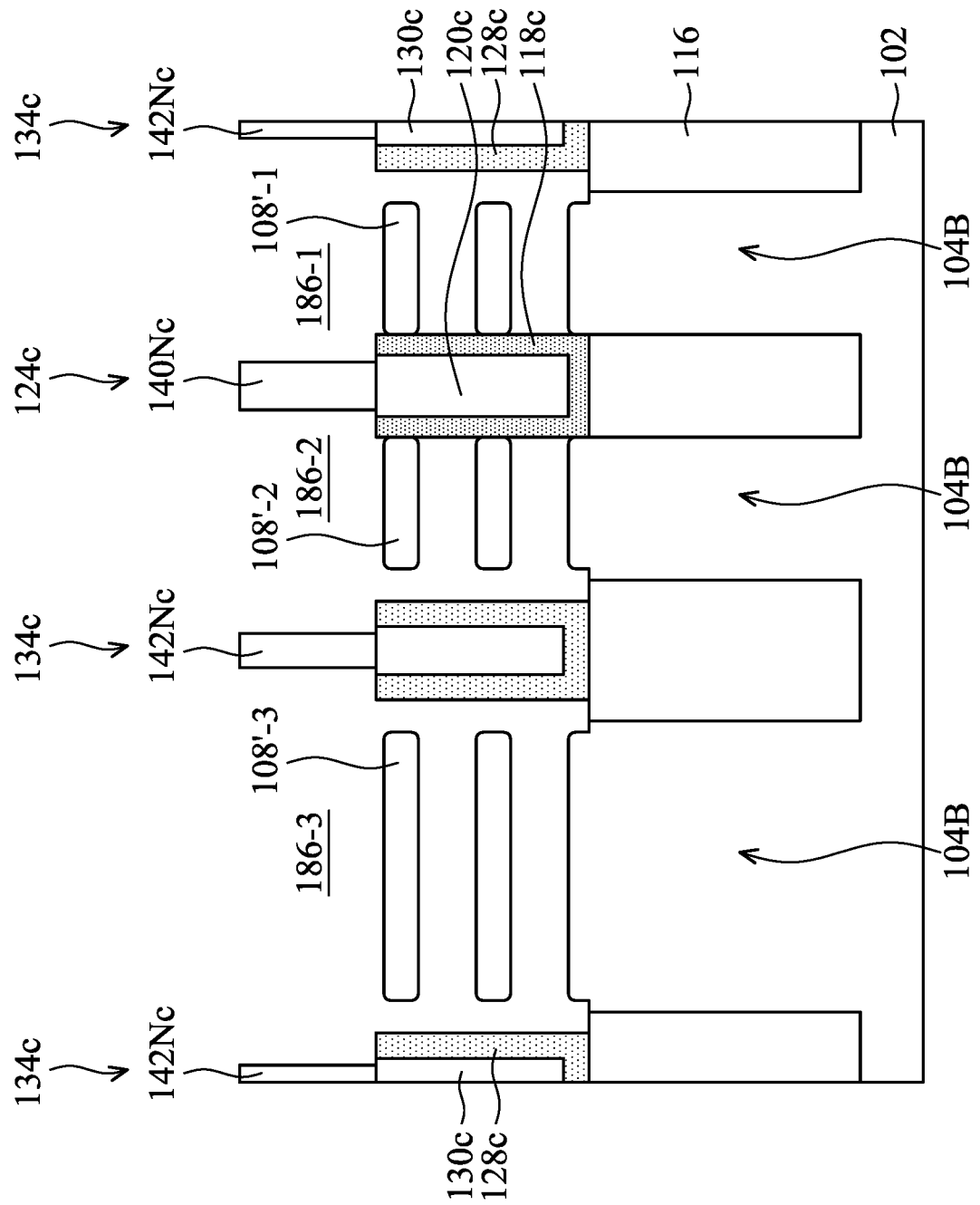
FIGS. 5A and 5B illustrate cross-sectional views of intermediate stages of manufacturing a semiconductor structure in accordance with some embodiments.
Figure 5B:
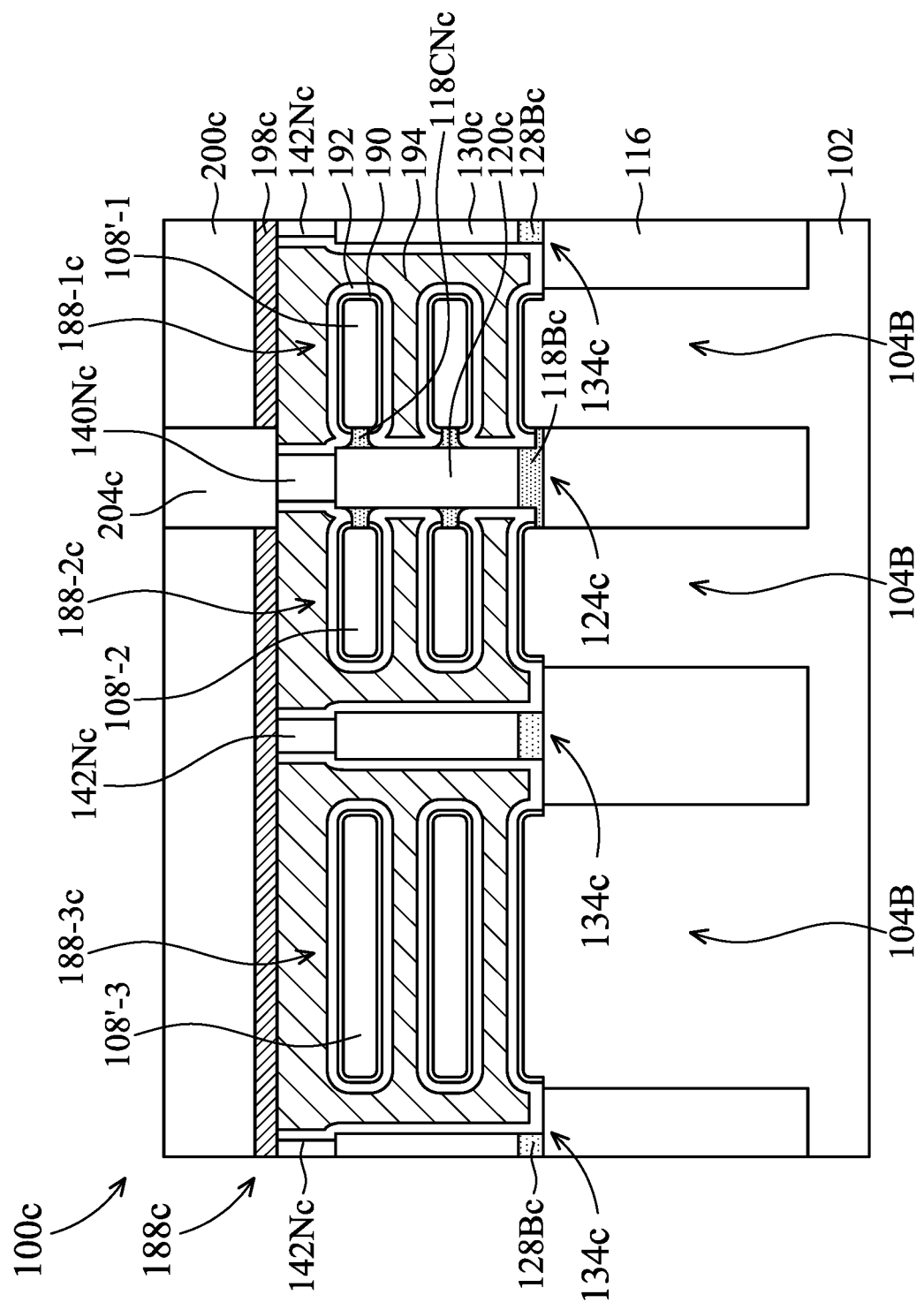

FIGS. 5A and 5B illustrate cross-sectional views of intermediate stages of manufacturing a semiconductor structure 100c in accordance with some embodiments. The semiconductor structure 100c may be similar to the semiconductor structure 100 described previously, except the first dielectric cap layer and the second dielectric cap layers are narrower than the first core portion and the second core portions in accordance with some embodiments. Processes and materials for forming the semiconductor structure 100c may be similar to, or the same as, those for forming the semiconductor structure 100 described previously and are not repeated herein.

More specifically, the processes shown in FIGS. 2A to 2O are performed to form a first dielectric fin structure 124c and second dielectric fin structures 134c, and a trimming process, similar to the trimming process 187, is performed to form a narrowed first dielectric cap layer 140Nc and narrowed second dielectric cap layers 142Nc, as shown in FIG. 5A in accordance with some embodiments. In some embodiments, the sidewalls of the narrowed first dielectric cap layer 140Nc are not aligned with the sidewalls of a first core portion 120c of the first dielectric fin structure 124c, and the sidewalls of the narrowed second dielectric cap layers 142Nc are not aligned with the sidewalls of second core portions 130c of the second dielectric fin structures 134c. In some embodiments, the narrowed first dielectric cap layer 140Nc is narrower than the first core portion 120c, and the narrowed second dielectric cap layers 142Nc are narrower than the second core portions 130c.

Afterwards, the processes shown in FIGS. 2Q to 2W are performed to form the semiconductor structure 100c, as shown in FIG. 5B in accordance with some embodiments. More specifically, a gate structure 188c is formed around the channel structures 108'-1, 108'-2, and 108'-3 and covers the sidewalls of the first dielectric fin structure 124c and the second dielectric fin structures 134c in accordance with some embodiments. Since the narrowed first dielectric cap layer 140Nc and the narrowed second dielectric cap layers 142Nc are narrower than the first core portion 120c and the second core portions 130c, the portions 188-1c, 188-2c, and 188-3c of the gate structure 188c have wider top portions and narrower bottom portions in accordance with some embodiments.

The processes and materials for forming the gate structure 188c, including the portions 188-1c, 188-2c, and 188-3c, the first dielectric fin structure 124c, and the second dielectric fin structures 134c are similar to, or the same as, those for forming the gate structure 188, including the portions 188-1, 188-2, and 188-3, the first dielectric fin structure 124, and the second dielectric fin structures 134 described previously and are not repeated herein.

Figure 6A:
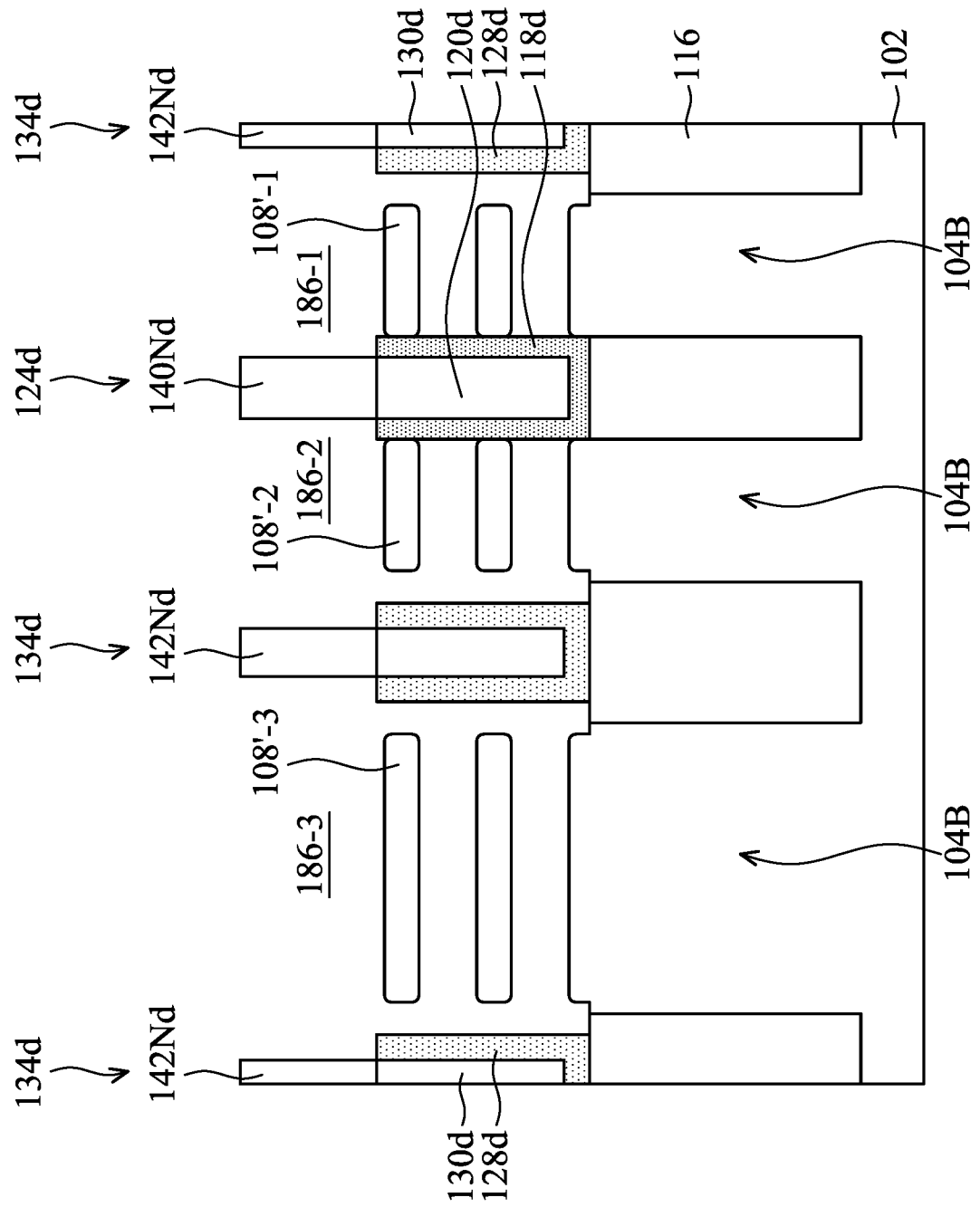
FIGS. 6A and 6B illustrate cross-sectional views of intermediate stages of manufacturing a semiconductor structure in accordance with some embodiments.
Figure 6B:
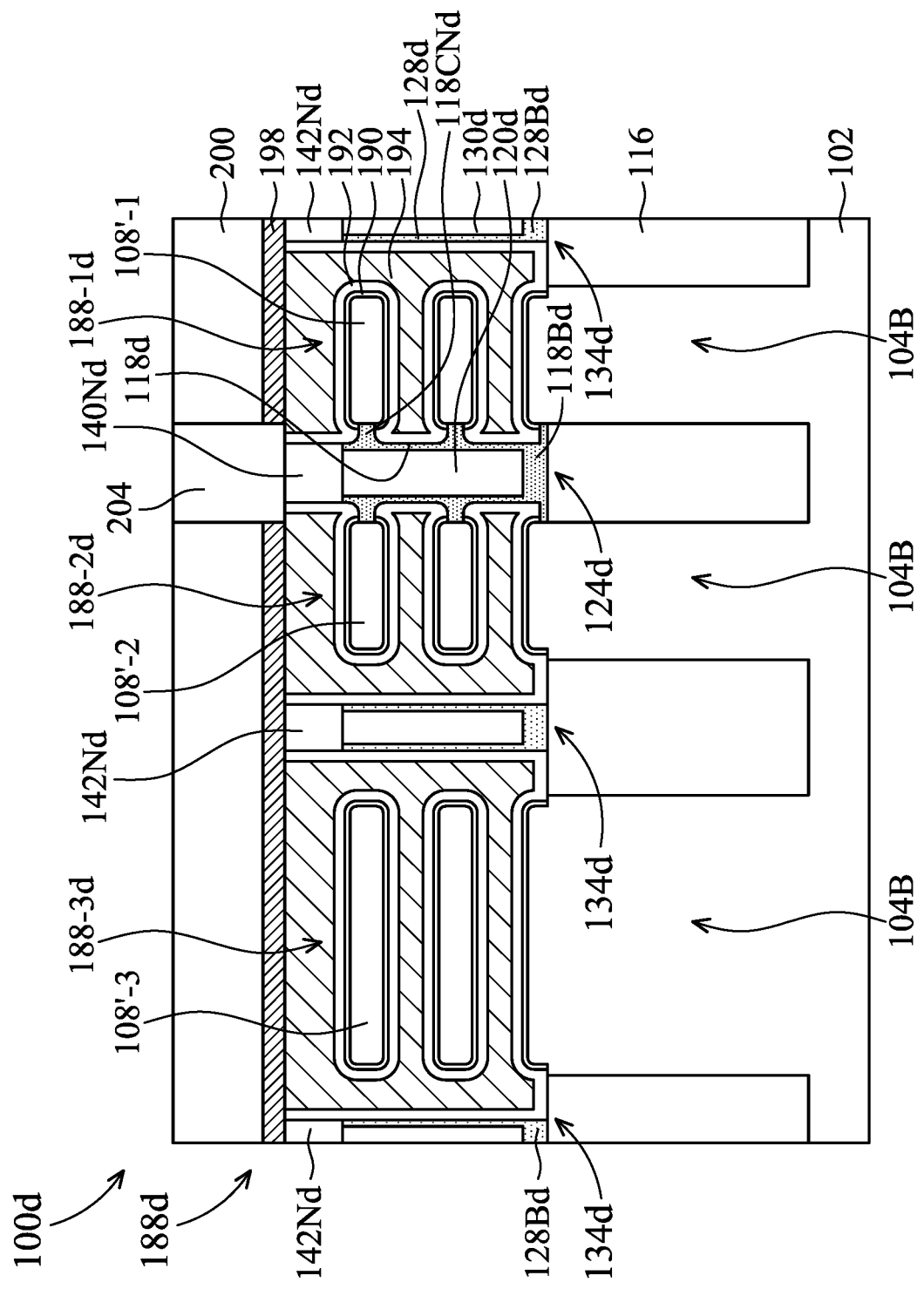

FIGS. 6A and 6B illustrate cross-sectional views of intermediate stages of manufacturing a semiconductor structure 100d in accordance with some embodiments. The semiconductor structure 100d may be similar to the semiconductor structure 100 described previously, except the first dielectric cap layer and the second dielectric cap layers are wider than the first core portion and the second core portions in accordance with some embodiments. Processes and materials for forming the semiconductor structure 100d may be similar to, or the same as, those for forming the semiconductor structure 100 described previously and are not repeated herein.

More specifically, the processes shown in FIGS. 2A to 2O are performed to form a first dielectric fin structure 124d and second dielectric fin structures 134d, and a trimming process, similar to the trimming process 187, is performed to form a narrowed first dielectric cap layer 140Nd and narrowed second dielectric cap layers 142Nd, as shown in FIG. 6A in accordance with some embodiments. In some embodiments, the sidewalls of the narrowed first dielectric cap layer 140Nd are not aligned with the sidewalls of a first core portion 120d of the first dielectric fin structure 124d, and the sidewalls of the narrowed second dielectric cap layers 142Nd are not aligned with the sidewalls of second core portions 130d of the second dielectric fin structures 134d. In some embodiments, the narrowed first dielectric cap layer 140Nd is wider than the first core portion 120d, and the narrowed second dielectric cap layers 142Nd are wider than the second core portions 130d.

Afterwards, the processes shown in FIGS. 2Q to 2W are performed to form the semiconductor structure 100d, as shown in FIG. 6B in accordance with some embodiments. More specifically, a gate structure 188d is formed around the channel structures 108'-1, 108'-2, and 108'-3 and covers the sidewalls of the first dielectric fin structure 124d and the second dielectric fin structures 134d in accordance with some embodiments. In some embodiments, a thin layer of the first dielectric shell layer 118d remains on the sidewalls of the first core portion 120d, such that the connecting portions 118CNd are connected by the remaining portion of the first dielectric shell layer 118d. In addition, the sidewalls of the second core portions 130d are also covered by the remaining portions of the second dielectric shell layer 128d in accordance with some embodiments. In some embodiments, the portions 188-1d, 188-2d, and 188-3d of the gate structure 188d are separated from the first core portion 120d and the second core portions 130d by the remaining portions of the first dielectric shell layer 118d and the second dielectric shell layer 128d.

The processes and materials for forming the gate structure 188d, including the portions 188-1d, 188-2d, and 188-3d, the first dielectric fin structure 124d, and the second dielectric fin structures 134d are similar to, or the same as, those for forming the gate structure 188, including the portions 188-1, 188-2, and 188-3, the first dielectric fin structure 124, and the second dielectric fin structures 134 described previously and are not repeated herein.

Figure 7A:
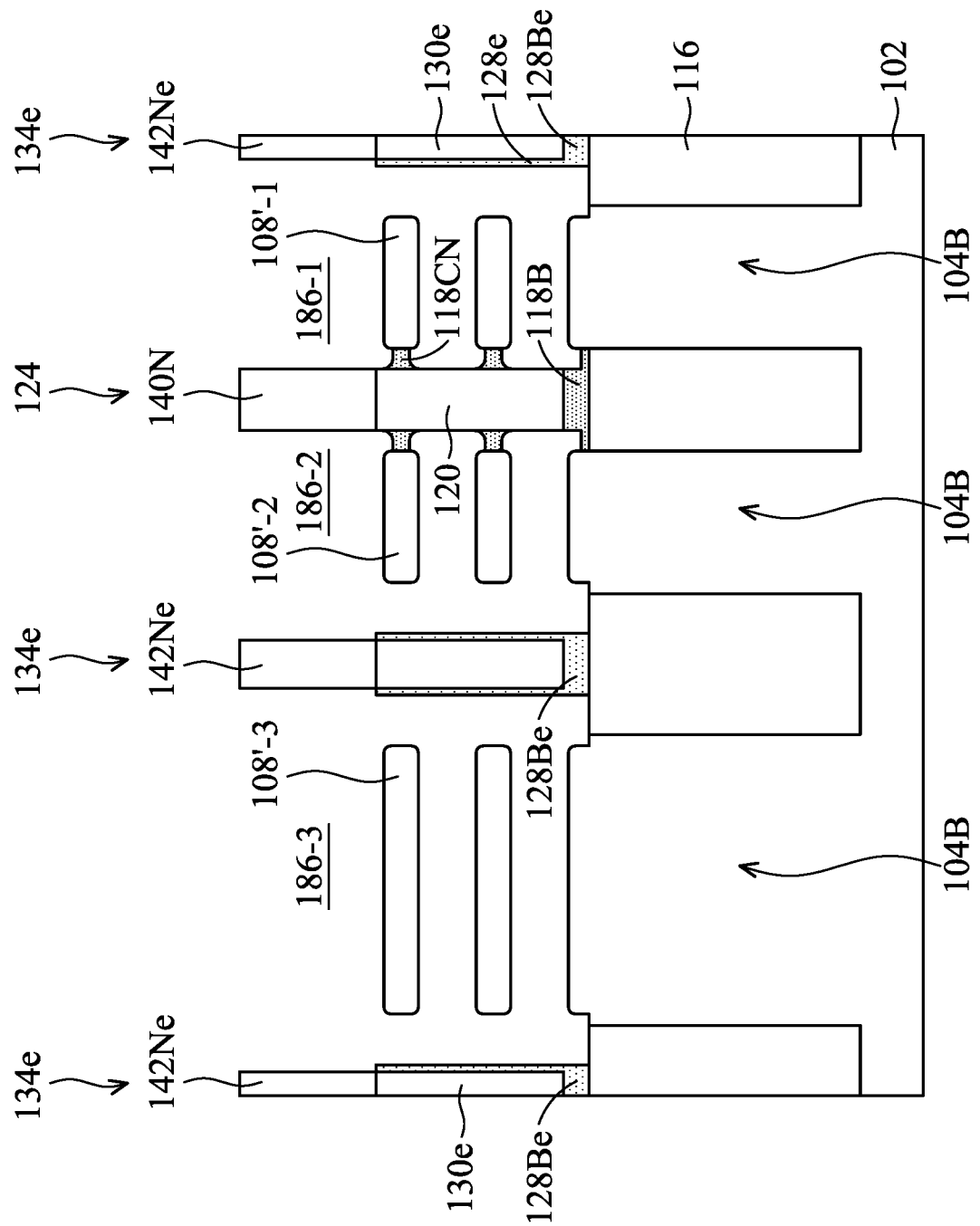
FIGS. 7A and 7B illustrate cross-sectional views of intermediate stages of manufacturing a semiconductor structure in accordance with some embodiments.
Figure 7B:
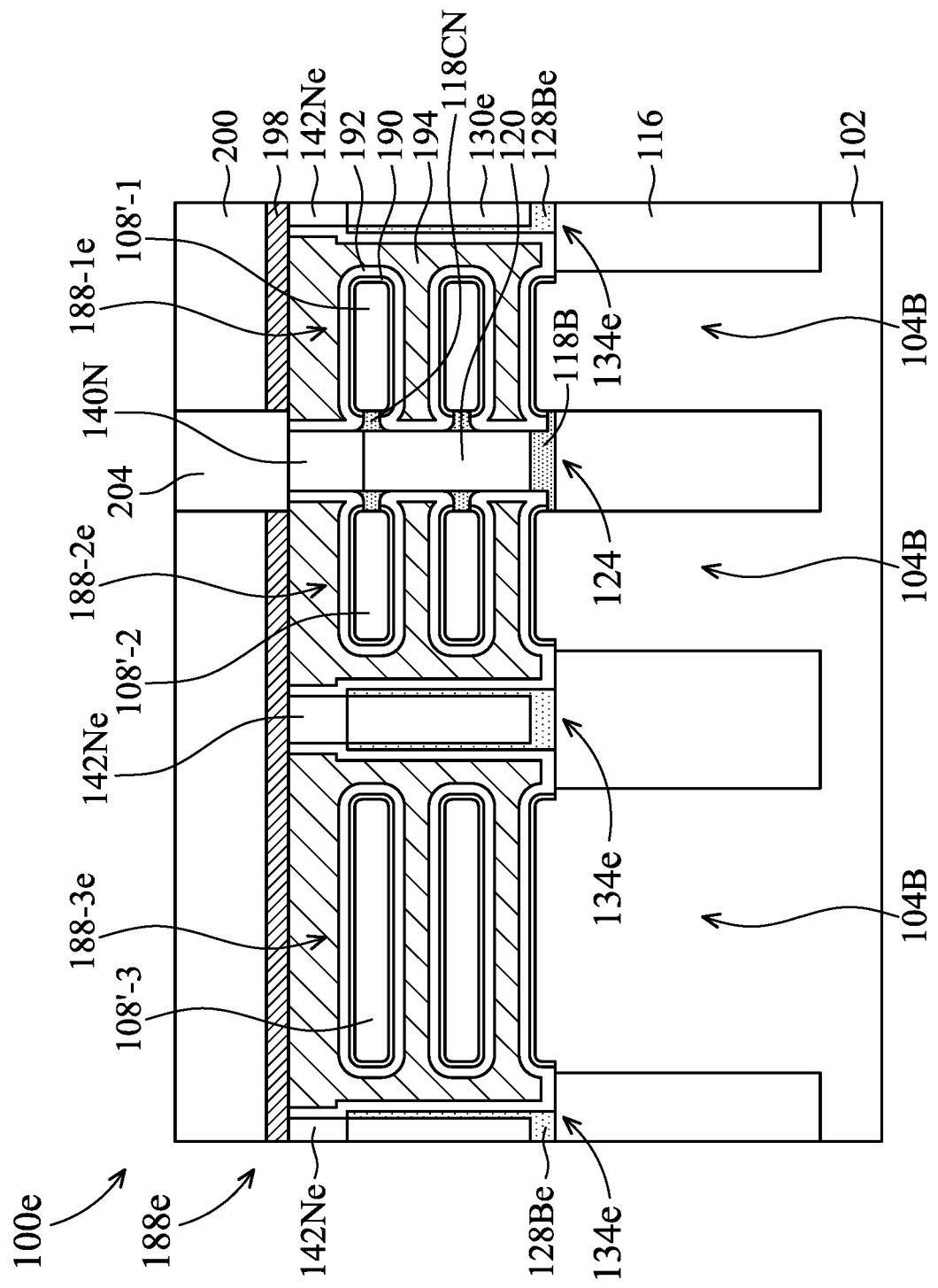

FIGS. 7A and 7B illustrate cross-sectional views of intermediate stages of manufacturing a semiconductor structure 100e in accordance with some embodiments. The semiconductor structure 100e may be similar to the semiconductor structure 100 described previously, except the second dielectric shell layers are not completely removed from the sidewalls of the second core portion of the second dielectric fin structures in accordance with some embodiments. Processes and materials for forming the semiconductor structure 100e may be similar to, or the same as, those for forming the semiconductor structure 100 described previously and are not repeated herein.

More specifically, the processes shown in FIGS. 2A to 2P are performed, and a trimming process, similar to the trimming process 189, is performed to form the first dielectric fin structure 124 and second dielectric fin structures 134e, as shown in FIG. 7A in accordance with some embodiments. In some embodiments, the sidewalls of the second core portions 130e are covered by the remaining portions of the second dielectric shell layers 128e in accordance with some embodiments.

Afterwards, the processes shown in FIGS. 2R to 2W are performed to form the semiconductor structure 100e, as shown in FIG. 7B in accordance with some embodiments. More specifically, a gate structure 188e is formed around the channel structures 108'-1, 108'-2, and 108'-3 and covers the sidewalls of the first dielectric fin structure 124 and the second dielectric fin structures 134e in accordance with some embodiments. Since the sidewalls of the second core portions 130e are covered by the remaining portions of the second dielectric shell layer 128e, the portions 188-1e, 188-2e, and 188-3e of the gate structure 188e are separated from the second core portion 130e by the remaining portions of the second dielectric shell layer 128e in accordance with some embodiments. Meanwhile, the portions 188-le and 188-2e of the gate structure 188e are in direct contact with the first dielectric fin structure 124 in accordance with some embodiments.

The processes and materials for forming the gate structure 188e, including the portions 188-1e, 188-2e, and 188-3e, and the second dielectric fin structures 134e are similar to, or the same as, those for forming the gate structure 188, including the portions 188-1, 188-2, and 188-3, and the second dielectric fin structures 134 described previously and are not repeated herein.

Figure 8A:
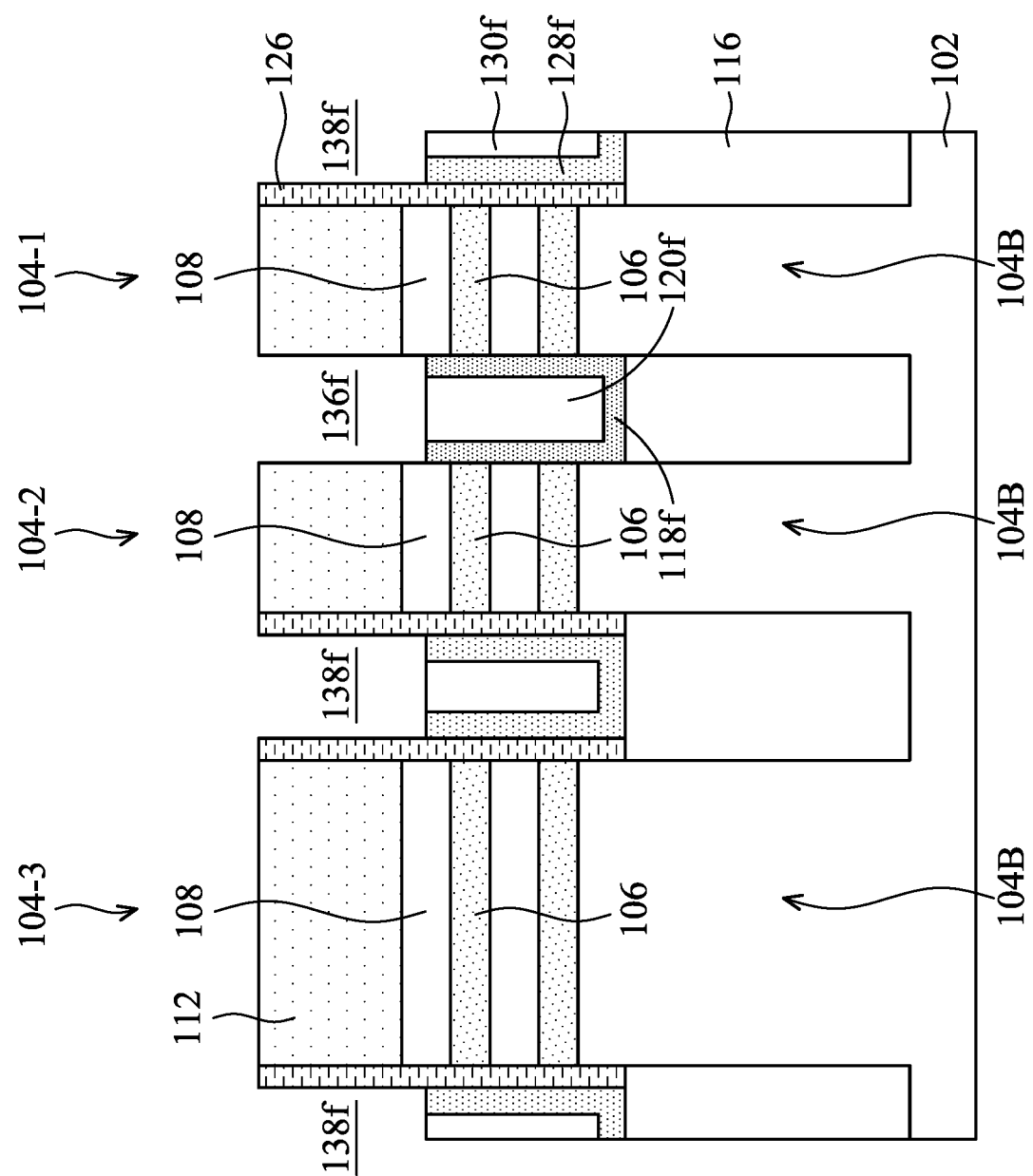
FIGS. 8A and 8B illustrate cross-sectional views of intermediate stages of manufacturing a semiconductor structure in accordance with some embodiments.
Figure 8B:
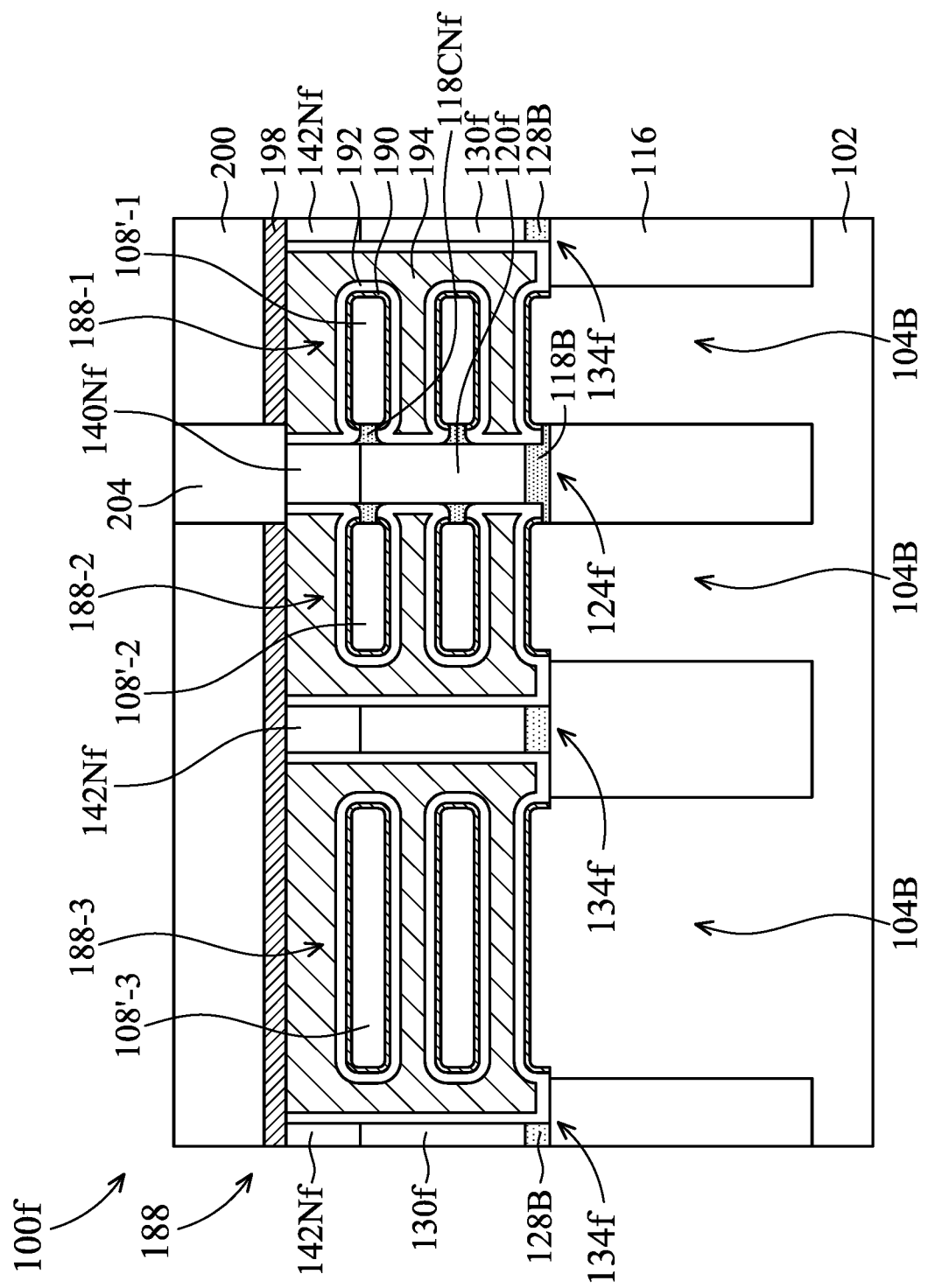

FIGS. 8A and 8B illustrate cross-sectional views of intermediate stages of manufacturing a semiconductor structure 100f in accordance with some embodiments. The semiconductor structure 100f may be similar to the semiconductor structure 100, except the first dielectric cap layer and the second dielectric cap layer are relatively thick in accordance with some embodiments. Materials and processes for manufacturing the semiconductor structure 100f may be similar to, or the same as, those for manufacturing the semiconductor structure 100 described above and are not repeated herein.

More specifically, the processes shown in FIGS. 2A to 2F are performed, and a first dielectric shell layer 118f, a first core portion 120f, second dielectric shell layers 128f, and second core portions 130f are recessed to form recesses 136f and 138f, as shown in FIG. 8A in accordance with some embodiments. In some embodiments, the top surfaces of the first dielectric shell layer 118f, the first core portion 120f, the second dielectric shell layers 128f, and the second core portions 130f are lower than the top surfaces of the topmost second semiconductor material layers 108 after the recesses 136f and 138f are formed in accordance with some embodiments.

Next, the processes shown in FIGS. 2H to 2W are performed to form the semiconductor structure 100f, as shown in FIG. 8B in accordance with some embodiments. As shown in FIG. 8B, the interfaces between a narrowed first dielectric cap layer 140Nf and the first core portion 120f of a first dielectric fin structure 124f is substantially level with the interface between narrowed second dielectric cap layers 142Nf and the second core portions 130f of second dielectric fin structures 134f and is lower than the topmost surface of the channel structures 108'-1, 108'-2, and 108'-3 in accordance with some embodiments.

The processes and materials for forming the first dielectric fin structure 124f and the second dielectric fin structures 134f are similar to, or the same as, those for forming the first dielectric fin structure 124 and the second dielectric fin structures 134 described previously and are not repeated herein.

Figure 9A:
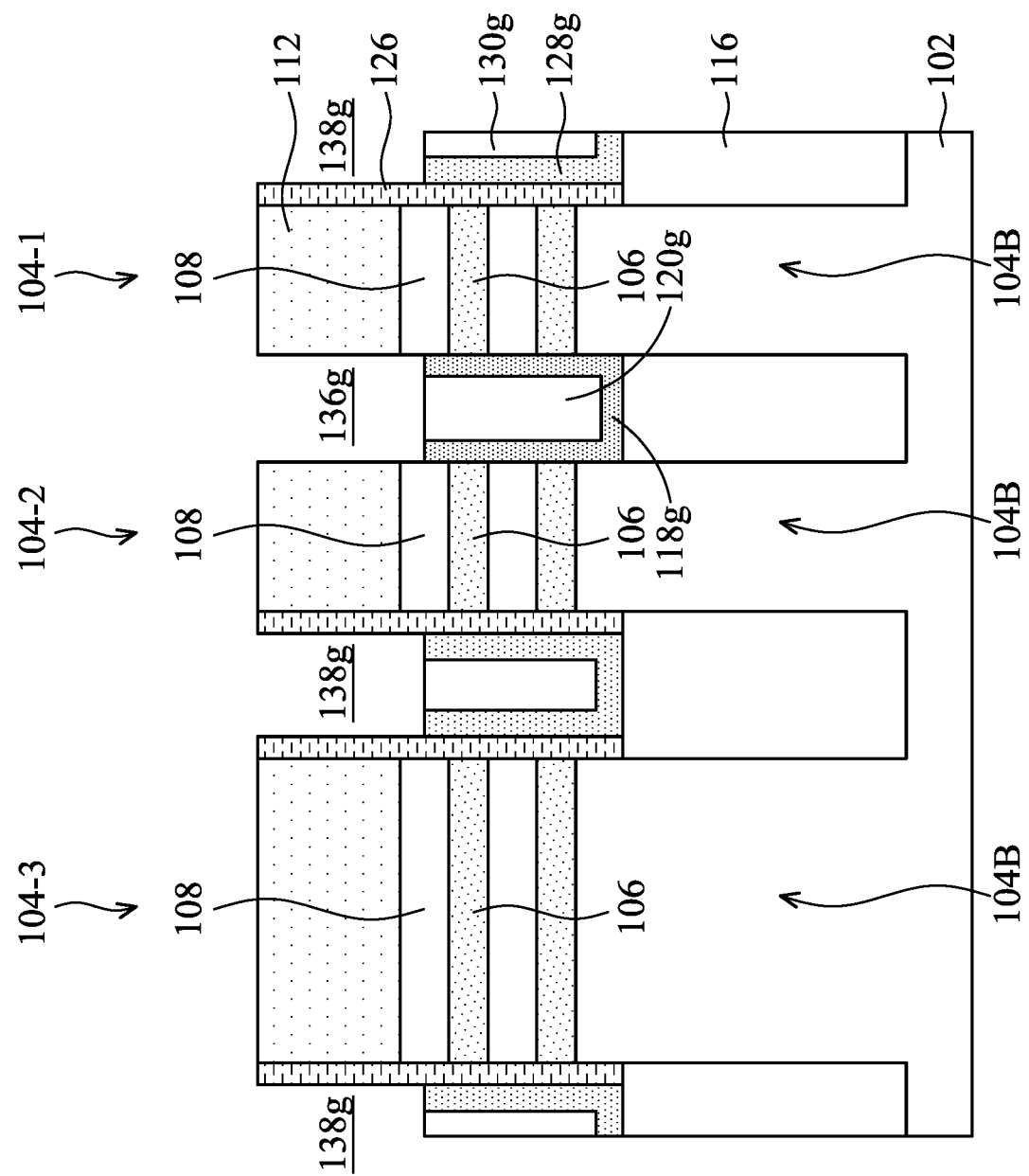
FIGS. 9A and 9B illustrate cross-sectional views of intermediate stages of manufacturing a semiconductor structure in accordance with some embodiments.
Figure 9B:
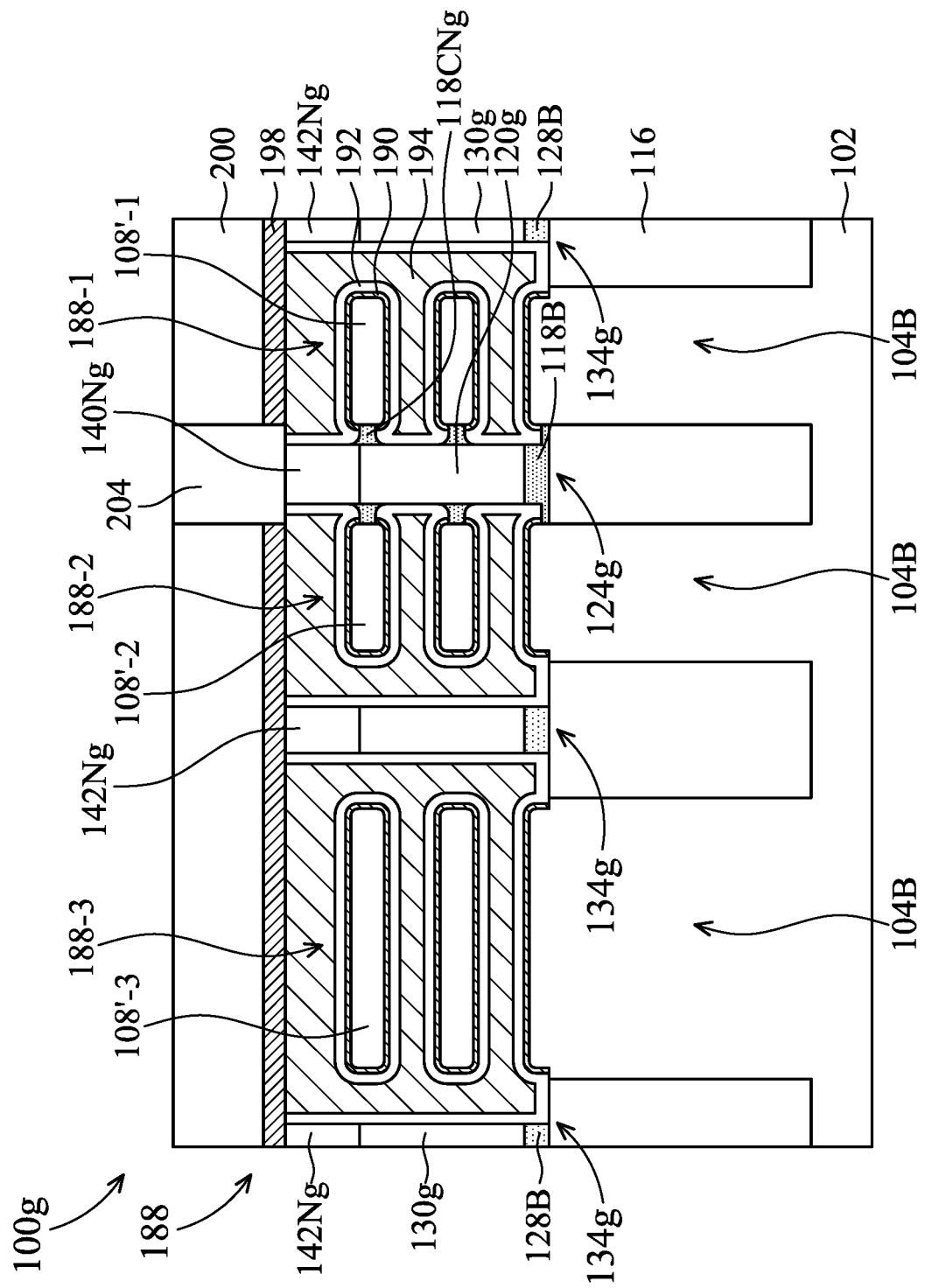

FIGS. 9A and 9B illustrate cross-sectional views of intermediate stages of manufacturing a semiconductor structure 100g in accordance with some embodiments. The semiconductor structure 100g may be similar to the semiconductor structure 100, except the first dielectric cap layer and the second dielectric cap layers are relatively thin in accordance with some embodiments. Materials and processes for manufacturing the semiconductor structure 100g may be similar to, or the same as, those for manufacturing the semiconductor structure 100 described above and are not repeated herein.

More specifically, the processes shown in FIGS. 2A to 2F are performed, and a first dielectric shell layer 118g, a first core portion 120g, second dielectric shell layers 128g, and second core portions 130g are recessed to form recesses 136g and 138g, as shown in FIG. 9A in accordance with some embodiments. In some embodiments, the top surfaces of the first dielectric shell layer 118g, the first core portion 120g, the second dielectric shell layers 128g, and the second core portions 130g are lower than the top surfaces of the topmost second semiconductor material layers 108 in accordance with some embodiments.

Next, the processes shown in FIGS. 2H to 2W are performed to form the semiconductor structure 100g, as shown in FIG. 9B in accordance with some embodiments. As shown in FIG. 9B, the interfaces between a narrowed first dielectric cap layer 140Ng and the first core portion 120g of a first dielectric fin structure 124g is substantially level with the interface between the narrowed second dielectric cap layers 142Ng and the second core portions 130g of second dielectric fin structures 134g and is higher than the topmost surface of the channel structures 108'-1, 108'-2, and 108'-3 in accordance with some embodiments.

The processes and materials for forming the first dielectric fin structure 124g and the second dielectric fin structures 134g are similar to, or the same as, those for forming the first dielectric fin structure 124 and the second dielectric fin structures 134 described previously and are not repeated herein.

Figure 10A:
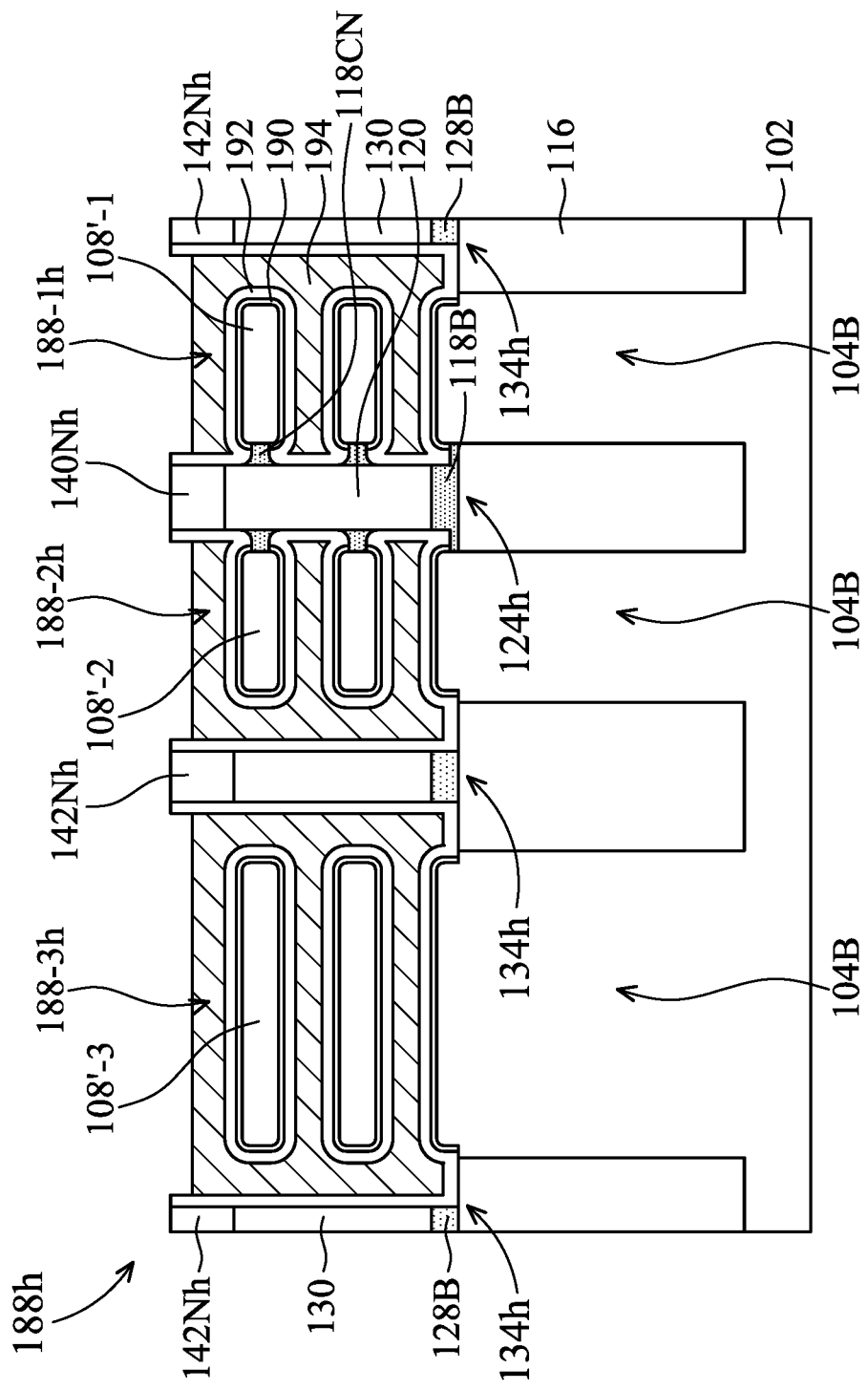
FIGS. 10A and 10B illustrate cross-sectional views of intermediate stages of manufacturing a semiconductor structure in accordance with some embodiments.
Figure 10B:
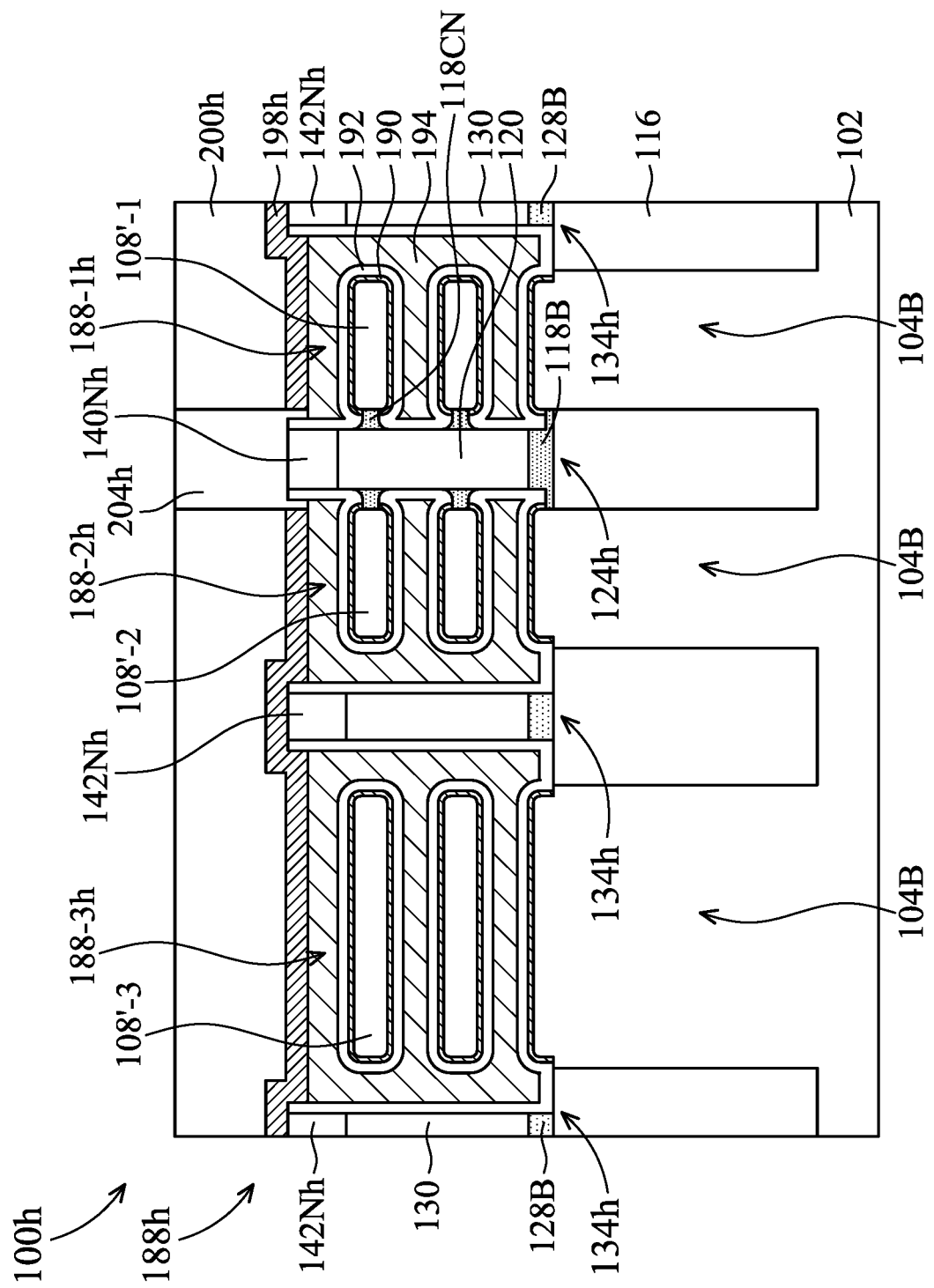

FIGS. 10A and 10B illustrate cross-sectional views of intermediate stages of manufacturing a semiconductor structure 100h in accordance with some embodiments. The semiconductor structure 100h may be similar to the semiconductor structures 100, except the top surfaces of the gate structure, the first dielectric fin structure, and the second dielectric fin structures are not level with each other in accordance with some embodiments. Materials and processes for manufacturing the semiconductor structure 100h may be similar to, or the same as, those for manufacturing the semiconductor structure 100 described above and are not repeated herein.

More specifically, the processes shown in FIGS. 2A to 2R are performed, and an etch back process is performed to remove the top portion of a gate structure 188h and the top portions of a first dielectric fin structure 124h and second dielectric fin structures 134h at the channel region, as shown in FIG. 10A in accordance with some embodiments. In some embodiments, the etching rate of the gate structure 188h is greater than the etching rate of the narrowed first dielectric cap layer 140Nh and the narrowed second dielectric cap layer 142Nh during the etching back process, and therefore the top surfaces of the portions 188-1h, 188-2h, and 188-3h of the gate structure 188h are lower than the top surfaces of the narrowed first dielectric cap layer 140Nh of the first dielectric fin structure 124h and the narrowed second dielectric cap layers 142Nh of the second dielectric fin structures 134h.

Afterwards, the processes shown in FIGS. 2T to 2W are performed to form the semiconductor structure 100h, as shown in FIG. 10B in accordance with some embodiments. Since the top surface of the gate structure 188h, the first dielectric fin structure 124h, and the second dielectric fin structures 134h are not level with each other, a metal layer 198h formed over them is not flat in accordance with some embodiments. In some embodiments, the metal layer 198h has protruding portions over the first dielectric fin structure 124f and the second dielectric fin structures 134f. In some embodiments, a dielectric layer 200h formed over the metal layer 198h also has an un-flat bottom surface. In some embodiments, an isolation feature 204h is formed through the dielectric layer 200h and the metal layer 198h and has extending portions sandwiched between the first dielectric fin structure 124h and the metal layer 198h. In some embodiments, the bottommost surface of the isolation feature 204h is lower than a top surface of the narrowed first dielectric cap layer 140Nh of the first dielectric fin structure 124h.

The processes and materials for forming the gate structure 188h, including the portions 188-1h, 188-2h, and 188-3h, the first dielectric fin structure 124h, the second dielectric fin structures 134h, the metal layer 198h, the dielectric layer 200h, and the isolation feature 204h are similar to, or the same as, those for forming the gate structure 188, including the portions 188-1, 188-2, and 188-3, the first dielectric fin structure 124, the second dielectric fin structures 134, the metal layer 198, the dielectric layer 200, and the isolation feature 204 described previously and are not repeated herein.

Figure 11:
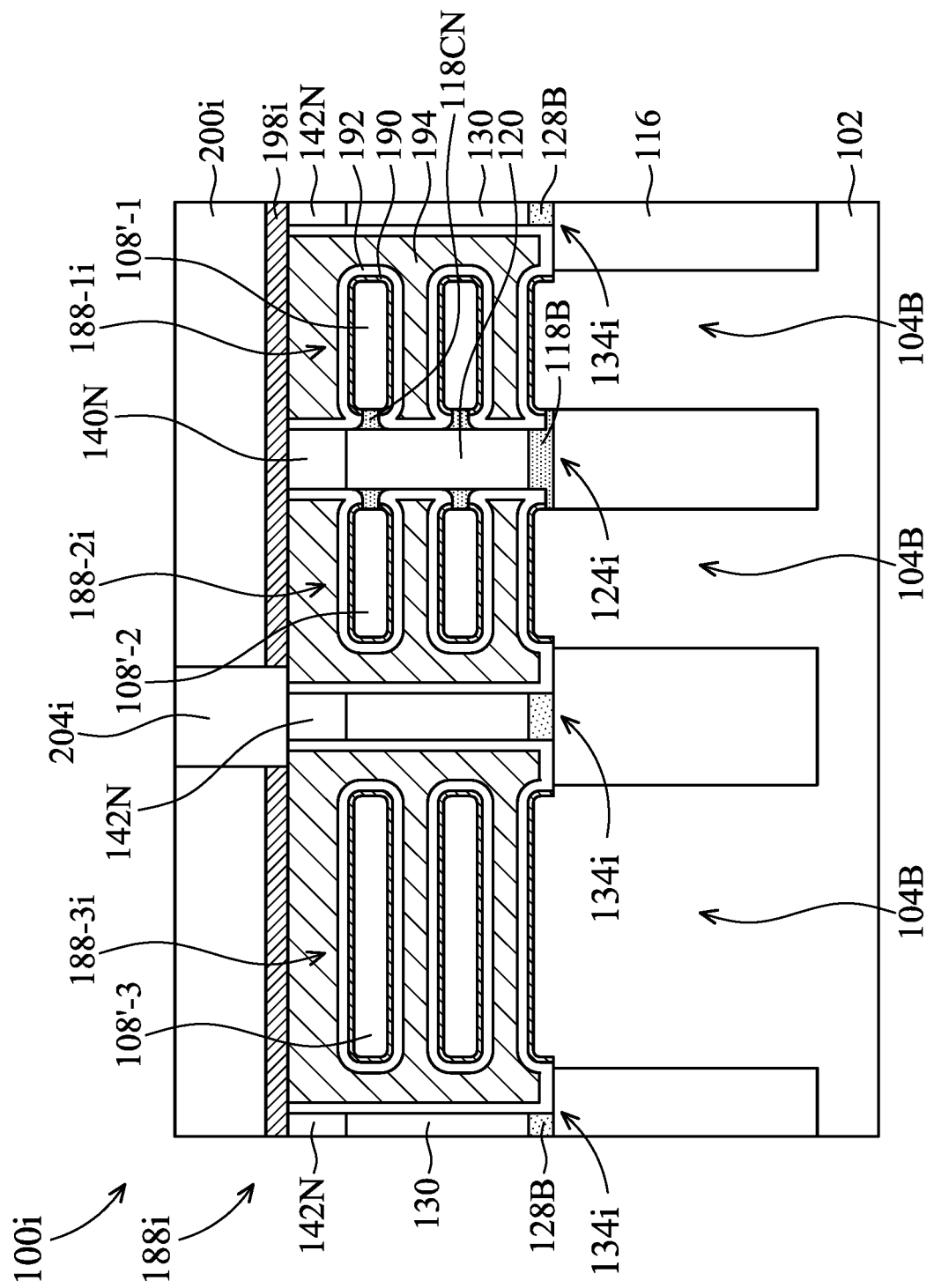
FIG. 11 illustrates a cross-sectional view of a semiconductor structure in accordance with some embodiments.

FIG. 11 illustrates a cross-sectional view of a semiconductor structure 100i in accordance with some embodiments. The semiconductor structure 100i may be similar to the semiconductor structure 100, except the isolation feature is formed over one of the second dielectric fin structures instead of over the first dielectric fin structure in accordance with some embodiments. Materials and processes for manufacturing the semiconductor structure 100i may be similar to, or the same as, those for manufacturing the semiconductor structure 100 described above and are not repeated herein.

More specifically, the processes shown in FIGS. 2A to 2U are performed to form a first dielectric fin structure 124i, second dielectric fin structures 134i, a gate structure 188i, a metal layer 198i, and a dielectric layer 200i, and an isolation feature 204i is formed over one of the second dielectric fin structures 134i through the metal layer 198i and the dielectric layer 200i, as shown in FIG. 11 in accordance with some embodiments. In some embodiments, the metal layer 198i continuously extends over the portions 188-1i of the gate structure 188i, the first dielectric fin structure 124i, and the portion 188-2i of the gate structure 188i, so that the portions 188-1i and 188-2i are electrically connected with each other by the metal layer 198i. Meanwhile, the portion 188-3i and 188-2i of the gate structure 188 are separated by one of the second dielectric fin structures 134 and the isolation feature 204i in accordance with some embodiments. In some embodiments, the isolation feature 204i is in contact with the portions 188-2i and 188-3i of the gate structure 188i.

The processes and materials for forming the gate structure 188i, including the portions 188-1i, 188-2i, and 188-3i, the first dielectric fin structure 124i, the second dielectric fin structures 134i, the isolation feature 204i, the metal layer 198i, and the dielectric layer 200i are similar to, or the same as, those for forming the gate structure 188, including the portions 188-1, 188-2, and 188-3, the first dielectric fin structure 124, the second dielectric fin structures 134, the isolation feature 204, the metal layer 198, and the dielectric layer 200 described previously and are not repeated herein.

Figure 12:
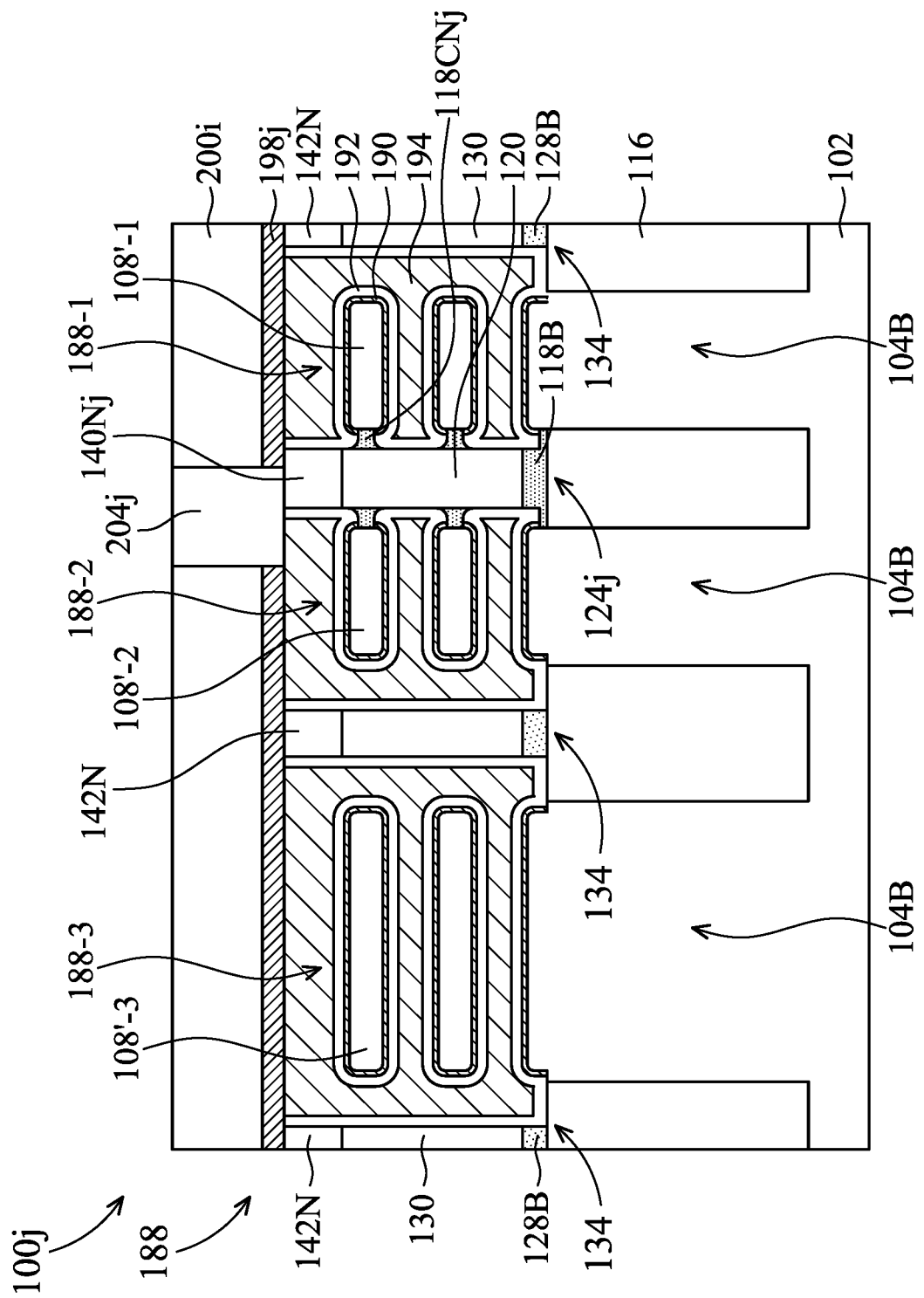
FIG. 12 illustrates a cross-sectional view of a semiconductor structure in accordance with some embodiments.

FIG. 12 illustrates a cross-sectional view of a semiconductor structure 100j in accordance with some embodiments. The semiconductor structure 100j may be similar to the semiconductor structure 100, except the isolation feature is not aligned with the first dielectric fin structure in accordance with some embodiments. Materials and processes for manufacturing the semiconductor structure 100j may be similar to, or the same as, those for manufacturing the semiconductor structure 100 described above and are not repeated herein.

More specifically, the processes shown in FIGS. 2A to 2U are performed to form a first dielectric fin structure 124j, the second dielectric fin structures 134, a metal layer 198j, and a dielectric layer 200j, and an isolation feature 204j is formed through the metal layer 198j and the dielectric layer 200j, as shown in FIG. 12 in accordance with some embodiments. In some embodiments, the isolation feature 204j covers the sidewall of the first dielectric fin structure 124j and vertically overlaps the channel structures 108'-2 and connecting portions 118CNj connected to the channel structures 108'-2. Meanwhile, the metal layer 198j partially covers another sidewall of the first dielectric fin structure 124j and vertically overlaps the connecting portions 118CNj connected to the channel structures 108'-1 in accordance with some embodiments. In some embodiments, the metal layer 198j is in contact with the top surface of the narrowed first dielectric cap layer 140Nj.

The processes and materials for forming the first dielectric fin structure 124j, the isolation feature 204j, the metal layer 198j, and the dielectric layer 200j are similar to, or the same as, those for forming the first dielectric fin structure 124, the second dielectric fin structures 134, the isolation feature 204, the metal layer 198, and the dielectric layer 200 described previously and are not repeated herein.

Figure 13:
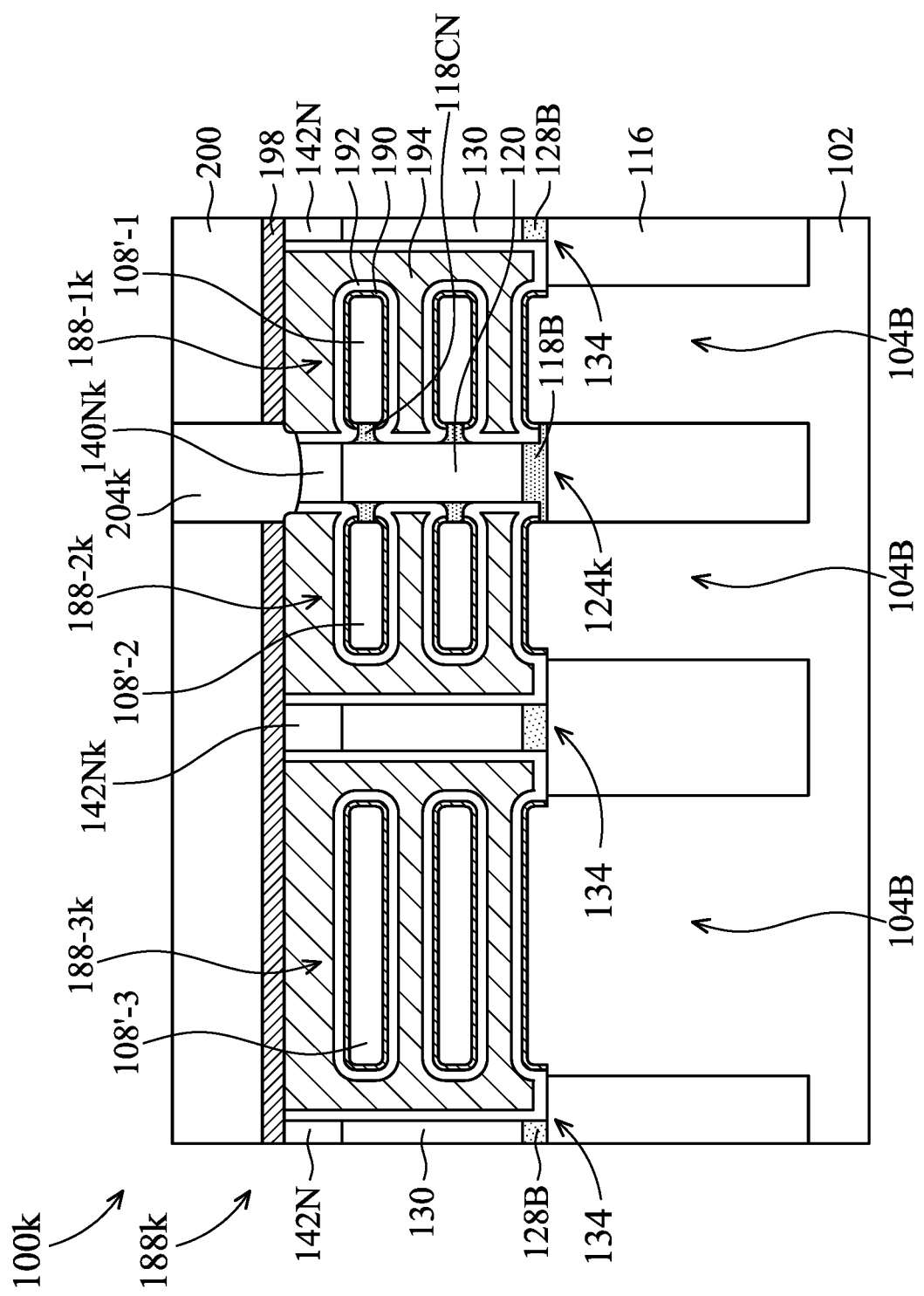
FIG. 13 illustrates a cross-sectional view of a semiconductor structure in accordance with some embodiments.

FIG. 13 illustrates a cross-sectional view of a semiconductor structure 100k in accordance with some embodiments. The semiconductor structure 100k may be similar to the semiconductor structure 100, except the first dielectric fin structure is etched before the isolation feature is formed in accordance with some embodiments. Materials and processes for manufacturing the semiconductor structure 100k may be similar to, or the same as, those for manufacturing the semiconductor structure 100 described above and are not repeated herein.

More specifically, the processes shown in FIGS. 2A to 2U are performed to form a first dielectric fin structure 124k and the second dielectric fin structures 134, and an opening is formed through the metal layer 198 and the dielectric layer 200, and an isolation feature 204k is formed in the opening, as shown in FIG. 13 in accordance with some embodiments. In addition, during the etching process for forming the opening, a narrowed first dielectric cap layer 140Nk is also etched, so that the top surface of the narrowed first dielectric cap layer 140Nk is lower than the top surfaces of the second dielectric cap layers 142N of the second dielectric fin structures 134 in accordance with some embodiments. Accordingly, the bottom surface of the isolation feature 204k is lower than the top surfaces of the second dielectric cap layers 142N of the second dielectric fin structures 134 in accordance with some embodiments. In some embodiments, the bottom surface of the isolation feature 204k is lower than the bottom surface of the metal layer 198.

In some embodiments, the portions 188-1k and 188-2k of the gate structure 188k are also etched during the etching process for forming the opening, so that the portions 188-1k and 188-2k have rounded top corners in contact with the isolation feature 204k. In some embodiments, the bottom portion of the isolation feature 204k is narrower than the top portion of the isolation feature 204k.

The processes and materials for forming the gate structure 188k, including the portions 188-1k, 188-2k, and 188-3k, the first dielectric fin structure 124k, and the isolation feature 204k are similar to, or the same as, those for forming the gate structure 188, including the portions 188-1, 188-2, and 188-3, the first dielectric fin structure 124, and the isolation feature 204 described previously and are not repeated herein.

Figure 14:
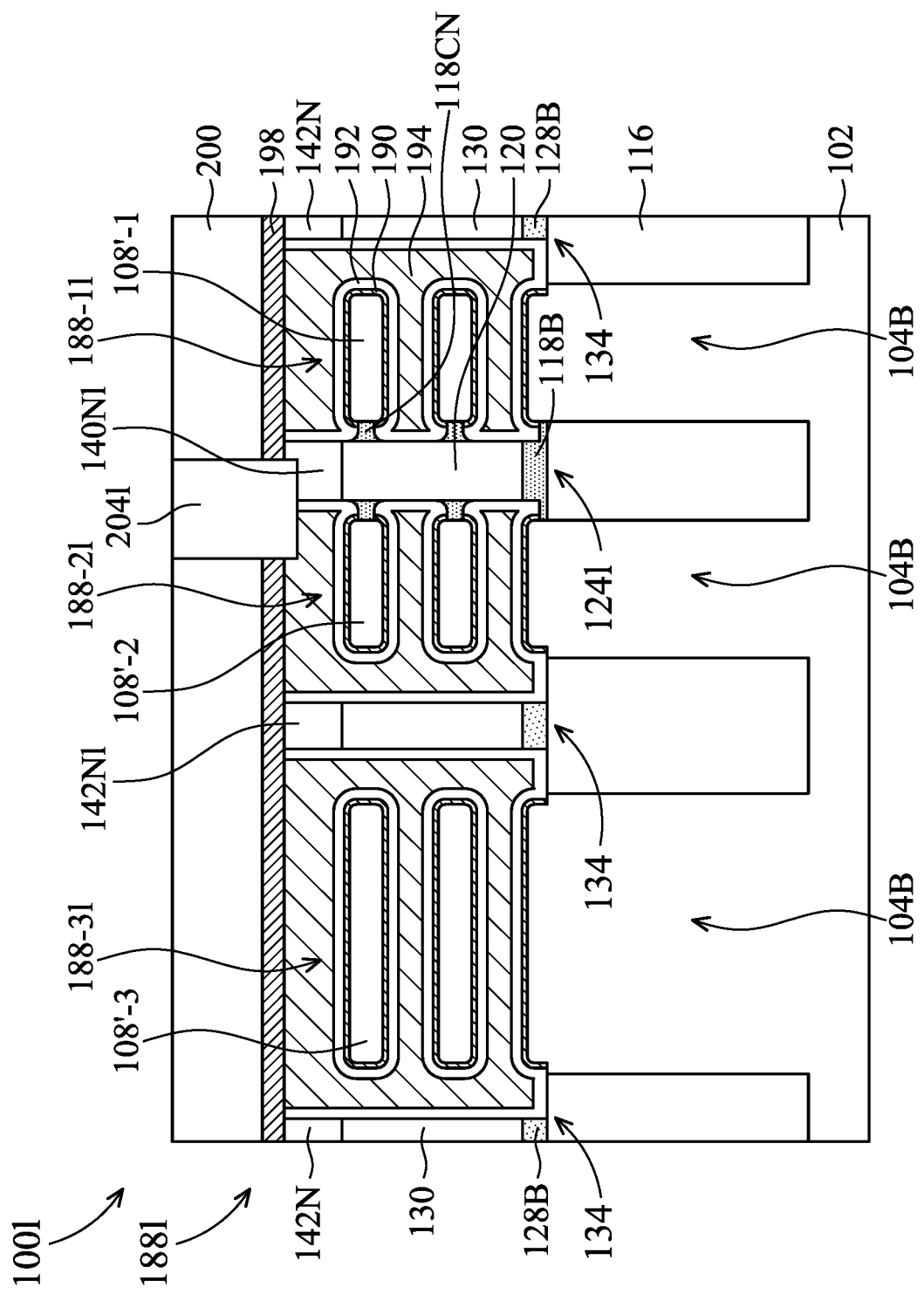
FIG. 14 illustrates a cross-sectional view of a semiconductor structure in accordance with some embodiments.

FIG. 14 illustrates a cross-sectional view of a semiconductor structure 100*l* in accordance with some embodiments. The semiconductor structure 100*l* may be similar to the semiconductor structure 100, except the isolation feature extends into the gate structure in accordance with some embodiments. Materials and processes for manufacturing the semiconductor structure 100*l* may be similar to, or the same as, those for manufacturing the semiconductor structure 100 described above and are not repeated herein.

More specifically, the processes shown in FIGS. 2A to 2U are performed to form a first dielectric fin structure 124*l*, the second dielectric fin structures 134, a gate structure 188*l*, the metal layer 198, and the dielectric layer 200, and an opening is formed through the metal layer 198 and the dielectric layer 200 and an isolation feature 204*l* is formed in the opening, as shown in FIG. 14 in accordance with some embodiments. In addition, during the etching process for forming the opening, a narrowed first dielectric cap layer 140N1 and a portion 188-21 of the gate structure 188*l* are also etched, so that the narrowed first dielectric cap layer 140N1 and the portion 188-21 have recessed portions under the isolation feature 204*l* in accordance with some embodiments. Accordingly, the bottom surface of the isolation feature 204*l* is lower than the top surfaces of the second dielectric cap layers 142N of the second dielectric fin structures 134 in accordance with some embodiments. In some embodiments, the bottom surface of the isolation feature 204*l* is lower than the bottom surface of the metal layer 198. In some embodiments, the bottom surface of the isolation feature 204*l* is lower than the topmost surface of the narrowed first dielectric cap layer 140N1 of the first dielectric fin structure 124*l*.

The processes and materials for forming the gate structure 188*l*, including the portions 188-11, 188-21, and 188-31, the first dielectric fin structure 124*l*, and the isolation feature 204*l* are similar to, or the same as, those for forming the gate structure 188, including the portions 188-1, 188-2, and 188-3, the first dielectric fin structure 124, and the isolation feature 204 described previously and are not repeated herein.

Figure 15:
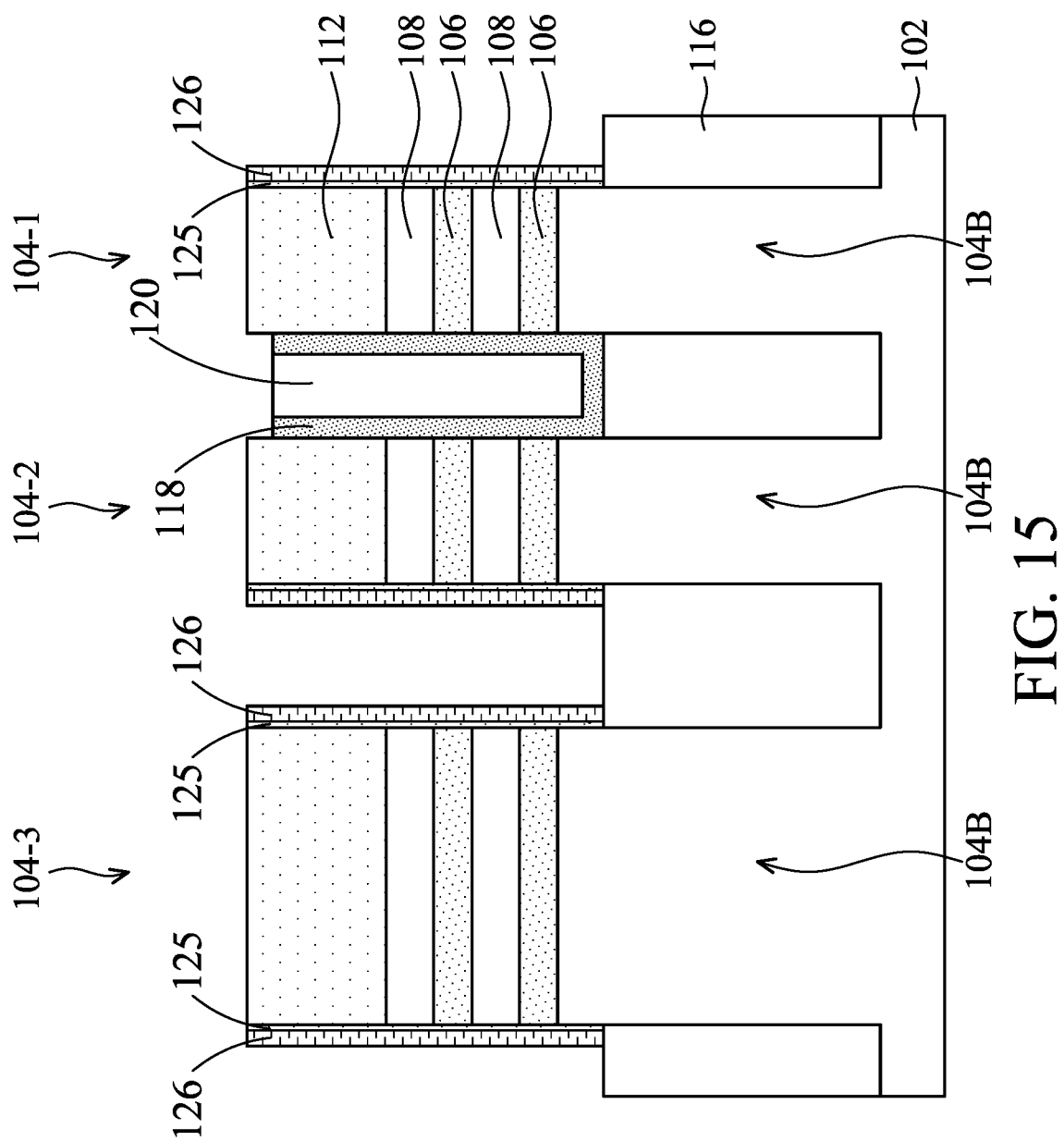
FIG. 15 illustrates another cross-sectional view of an intermediate stage of manufacturing the semiconductor structure in accordance with some other embodiments.

FIG. 15 illustrates a cross-sectional view of an intermediate stage of manufacturing the semiconductor structure 100 in accordance with some other embodiments. Materials and processes for manufacturing the semiconductor structure 100 described above may be performed, except additional liner layers 125 are formed before forming the cladding layer 126 in accordance with some embodiments.

More specifically, the processes shown in FIGS. 2A to 2C are performed, and the liner layers 125 and the cladding layers 126 are formed on the sidewalls of the fin structures 104-1, 104-2, and 104-3, as shown in FIG. 15 in accordance with some embodiments. Afterwards, the processes shown in FIGS. 2E to 2W may be performed to form the semiconductor structure 100. In some embodiments, the liner layers 125 are oxide layers. In some embodiments, the liner layers 125 are Si layers and are incorporated into the cladding layers 126 during the epitaxial growth process for forming the cladding layers 126. The liner layers 125 may also be applied to the manufacturing processes for forming the semiconductor structures 100*a* to 100*l* described above and are not repeated herein.

Generally, dielectric fin structures should be apart from the channel structures for a distance, so that a gate structure can be formed in the spaces between the dielectric fin structures and the channel structures, and the resulting semiconductor device can have a better control of the gate structure. However, the size of the semiconductor device may therefore be relatively large. In some embodiments, a dielectric fin structure with a fork sheet shape is formed. More specifically, a first dielectric fin structure (e.g. the first dielectric fin structure 124) with connecting portions (e.g. the connecting portions 118CN) are formed in accordance with some embodiments. The connecting portions may be sandwiched between a first core portion (e.g. the first core portion 120) and channel structures (e.g. the channel structures 108'-1 and 108'-2) and a gate structure (e.g. the gate structure 188) may be formed around the channel structures and the connecting portions. Since the connecting portions are relatively thin, the control of the gate structure may not be seriously undermined. Meanwhile, since the spaces between the first core portions and the channel structures are filled by the connecting portions and the gate structure does not need to be formed in the spaces, the distance between the first core portion and the channel structures can be relatively short. Therefore, the size of the resulting semiconductor device may be reduced.

In some embodiments, second dielectric fin structures (e.g. the second dielectric fin structures 134) are also formed interposed in the gate structure. That is, the semiconductor structure may include the first dielectric fin structure and the second dielectric fin structure in different regions according to the applications. In addition, the gate structure may be divided into various portions and a metal layer (e.g. the metal layer 198) is formed over the divided portions of the gate structure so they can be electrically connected again by the metal layer. In addition, an isolation feature (e.g. the isolation feature 204) is formed through the metal layer to separate the metal layer so that some portions of the gate structure remain electrically disconnected with each other by the first dielectric fin structure and/or the second dielectric fin structure. Since the formation of the isolation feature may have a greater tolerance to mis-alignment, the distance between the second dielectric fin structure and the channel structures can also be reduced. Therefore, the size of the resulting semiconductor device may be further reduced.

In addition, it should be noted that same elements in FIGS. 1A to 15 may be designated by the same numerals and may include materials that are the same or similar and may be formed by processes that are the same or similar; therefore such redundant details are omitted in the interests of brevity. In addition, although FIGS. 1A to 15 are described in relation to the method, it will be appreciated that the structures disclosed in FIGS. 1A to 15 are not limited to the method but may stand alone as structures independent of the method. Similarly, the methods shown in FIGS. 1A to 15 are not limited to the disclosed structures but may stand alone independent of the structures. Furthermore, the channel structures (e.g. the nanostructures) described above may include nanowires, nanosheets, or other applicable nanostructures in accordance with some embodiments.

Also, while the disclosed methods are illustrated and described below as a series of acts or events, it should be appreciated that the illustrated ordering of such acts or events may be altered in some other embodiments. For example, some acts may occur in a different order and/or concurrently with other acts or events apart from those illustrated and/or described above. In addition, not all illustrated acts may be required to implement one or more aspects or embodiments of the description above. Furthermore, one or more of the acts depicted above may be carried out as one or more separate acts and/or phases.

Furthermore, the terms "approximately," "substantially," "substantial" and "about" used above account for small variations and may be varied in different technologies and be within the deviation range understood by the skilled in the art. For example, when used in conjunction with an event or circumstance, the terms can refer to instances in which the event or circumstance occurs precisely as well as instances in which the event or circumstance occurs in a close approximation.

Embodiments for forming semiconductor structures may be provided. The semiconductor structure may include channel structures and a dielectric fin structure formed adjacent to the channel structures. A gate structure may be formed around the channel structures and the dielectric fin structure and may be separated into two portions by the dielectric fin structure. In addition, the dielectric fin structure may include connecting portions in contact with the channel structures. By forming the connecting portions, the gate structure may not need to be formed between the channel structures and the first dielectric fin structure and the size of the resulting semiconductor device may be reduced.

In some embodiments, a semiconductor structure is provided. The semiconductor structure includes a substrate and first channel structures and second channel structures formed over the substrate. The semiconductor structure also includes a dielectric fin structure formed between the first channel structures and the second channel structures. In addition, the dielectric fin structure includes a core portion and first connecting portions connected to the core portion. The semiconductor structure also includes a gate structure including a first portion. In addition, the first portion of the gate structure is formed around the first channel structures and covers the first connecting portions of the dielectric fin structure.

In some embodiments, a semiconductor structure is provided. The semiconductor structure includes a substrate and first nanostructures and second nanostructures formed over the substrate. The semiconductor structure also includes a first dielectric fin structure formed between the first nanostructures and the second nanostructures. In addition, the first dielectric fin structure includes a first core portion, first connecting portions sandwiched between the first nanostructures and the first core portion, and second connecting portions sandwiched between the second nanostructures and the first core portion. The semiconductor structure also includes a gate structure including a first portion and a second portion. Furthermore, the first portion of the gate structure is formed around the first nanostructures and the first connecting portions, and the second portion of the gate structure is formed around the second nanostructures and the second connecting portions.

In some embodiments, a method for manufacturing a semiconductor structure is provided. The method for manufacturing the semiconductor structure includes alternately stacking first semiconductor material layers and second semiconductor material layers to form a semiconductor stack over a substrate and patterning the semiconductor stack to form a first fin structure and a second fin structure. The method for manufacturing the semiconductor structure also includes forming a first dielectric fin structure in a first space between a second sidewall of the first fin structure and a first sidewall of the second fin structure and removing the first semiconductor material layers of the first fin structure to form first nanostructures exposed by a first gate trench. The method for manufacturing the semiconductor structure also includes trimming the first dielectric fin structure to form first connecting portions connecting to the first nanostructures and forming a first portion of a gate structure in the first gate trench. In addition, the first portion of the gate structure covers top surfaces and bottom surfaces of the first connecting portions of the first dielectric fin structure and surrounds the first nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a substrate;
    first channel structures and second channel structures formed over the substrate;
    a dielectric fin structure formed between the first channel structures and the second channel structures, wherein the dielectric fin structure comprises a core portion and first connecting portions connected to the core portion; and
    a gate structure comprising a first portion, wherein the first portion of the gate structure is formed around the first channel structures and covers the first connecting portions of the dielectric fin structure.

2. The semiconductor structure as claimed in claim 1, wherein the first channel structures are thicker than the first connecting portions of the dielectric fin structure.

3. The semiconductor structure as claimed in claim 1, wherein the first portion of the gate structure is in contact with the core portion and the first connecting portions of the dielectric fin structure.

4. The semiconductor structure as claimed in claim 1, wherein the dielectric fin structure further comprises second connecting portions connecting the core portion and the second channel structures, the gate structure further comprises a second portion formed around the second channel structures and covering the second connecting portions of the dielectric fin structure, and the first portion and the second portion of the gate structure are separated by the dielectric fin structure.

5. The semiconductor structure as claimed in claim 4, further comprising:
    a metal layer covering the first portion and the second portion of the gate structure;
    a dielectric layer formed over the metal layer; and
    an isolation feature formed through the metal layer and the dielectric layer.

6. The semiconductor structure as claimed in claim 5, wherein the isolation feature is in direct contact with the dielectric fin structure.

7. The semiconductor structure as claimed in claim 1, wherein one of the first connecting portions has a first thickness at a sidewall of the dielectric fin structure and a second thickness at a sidewall of the first channel structures, and the first thickness is different from the second thickness.

8. A semiconductor structure, comprising:
    a substrate;
    first nanostructures and second nanostructures formed over the substrate;
    a first dielectric fin structure formed between the first nanostructures and the second nanostructures, wherein the first dielectric fin structure comprises a first core portion, first connecting portions sandwiched between the first nanostructures and the first core portion, and second connecting portions sandwiched between the second nanostructures and the first core portion; and a gate structure comprising a first portion and a second portion, wherein the first portion of the gate structure is formed around the first nanostructures and the first connecting portions, and the second portion of the gate structure is formed around the second nanostructures and the second connecting portions.

9. The semiconductor structure as claimed in claim 8, further comprising:

third nanostructures formed over the substrate;

a second dielectric fin structure formed between the second nanostructures and the third nanostructures; and a third portion of the gate structure surrounding the third nanostructures, wherein the second dielectric fin structure is separated from the third nanostructures by the third portion of the gate structure.

10. The semiconductor structure as claimed in claim 9, further comprising:

a metal layer formed over the first portion, the second portion, and the third portion of the gate structures; and an isolation feature formed through the metal layer and in contact with the first dielectric fin structure, wherein the second portion and the third portion of the gate structure are electrically connected by the metal layer.

11. The semiconductor structure as claimed in claim 9, wherein a first distance between the first nanostructures and the second nanostructures is smaller than a second distance between the second nanostructures and the third nanostructures.

12. The semiconductor structure as claimed in claim 8, wherein the first connecting portions and the second connecting portions have curved top surfaces.

13. The semiconductor structure as claimed in claim 12, wherein the first dielectric fin structure further comprises:

a first base portion under the first core portion, wherein a bottom surface of the first base portion is wider than a top surface of the first base portion.

14. A semiconductor structure, comprising:

first channel structures and second channel structures spaced apart from each other;

a first dielectric fin structure formed between the first channel structures and the second channel structures, wherein the first dielectric fin structure comprises first connecting portions laterally extending towards and connecting to the first channel structures and second connecting portions laterally extending towards and connecting to the second channel structures; and a first gate structure wrapping around the first channel structures; and an isolation feature covering a top surface of the first dielectric fin structure and a top surface of the first gate structure.

15. The semiconductor structure as claimed in claim 14, further comprising:

a metal layer formed over the top surface of the first gate structure, wherein the metal layer covers a sidewall of the isolation feature.

16. The semiconductor structure as claimed in claim 15, further comprising:

a second dielectric fin structure spaced apart from the first channel structures, wherein the second dielectric fin structure and the first dielectric fin structure cover opposite sides of the first gate structure.

17. The semiconductor structure as claimed in claim 16, further comprising:

third channel structures spaced apart from the second dielectric fin structure; and a second gate structure surrounding the third channel structures, wherein the second gate structure and the first gate structure cover opposite sides of the second dielectric fin structure.

18. The semiconductor structure as claimed in claim 17, wherein the metal layer continuously extends from the top surface of the first gate structure to a top surface of the second dielectric fin structure.

19. The semiconductor structure as claimed in claim 18, wherein the metal layer further extends to a top surface of the second gate structure.

20. The semiconductor structure as claimed in claim 19, further comprising:

a dielectric layer formed over the metal layer and covering the sidewall of the isolation feature.

* * * * *